(12) United States Patent
Wischnewskiy

(10) Patent No.: US 6,765,335 B2
(45) Date of Patent: Jul. 20, 2004

(54) PIEZOELECTRIC ADJUSTING ELEMENT

(75) Inventor: Wladimir Wischnewskiy, Waldbronn (DE)

(73) Assignee: Physik-Instrumente (PI) GmbH & Co. KG, Karlsruhe (DE)

(*) Notice: Subject to any disclaimer, the term of this patent is extended or adjusted under 35 U.S.C. 154(b) by 26 days.

(21) Appl. No.: 10/166,607

(22) Filed: Jun. 12, 2002

(65) Prior Publication Data

US 2003/0052573 A1 Mar. 20, 2003

(30) Foreign Application Priority Data

Jun. 12, 2001 (DE) .......................................... 101 28 483
Nov. 7, 2001 (DE) .......................................... 101 54 526

(51) Int. Cl.[7] .............................................. H01L 41/08
(52) U.S. Cl. .................................. 310/323.02; 310/366
(58) Field of Search ........................... 310/323.02, 328, 310/366, 367

(56) References Cited

U.S. PATENT DOCUMENTS

| | | | | |
|---|---|---|---|---|
| 4,019,073 A | * | 4/1977 | Vishnevsky et al. | ......... 310/322 |
| 5,121,025 A | * | 6/1992 | Toda | ........................... 310/358 |
| 6,064,140 A | * | 5/2000 | Zumeris | ................. 310/323.02 |
| 6,081,063 A | * | 6/2000 | Kasuga et al. | ......... 310/323.02 |
| 6,218,769 B1 | * | 4/2001 | Iino et al. | .................... 310/328 |
| 6,586,860 B1 | * | 7/2003 | Iino et al. | .............. 310/316.02 |

* cited by examiner

Primary Examiner—Mark Budd
(74) Attorney, Agent, or Firm—Oblon, Spivak, McClelland, Maier & Neustadt, P.C.

(57) ABSTRACT

The invention relates to a piezoelectric adjusting element, in particular a piezoelectric motor in the form of a monolithic plate-shaped or cylindrical piezoelectric oscillator comprised of a first and of a second kind of main surfaces and of groups of electrodes that are allocated to them, comprised of a housing, a driven element, at least one friction layer arranged on the housing or on the driven element, a driving element that is connected to an electric excitation source and that is in friction contact with the friction layer, and the piezoelectric oscillator is excited by way of the groups of electrodes standing longitudinal acoustic waves in the direction of an oscillator resonant length and in the direction of an oscillator resonant height of this piezoelectric oscillator, and the oscillator resonant length is equal to an integral multiple of the wave length of the standing longitudinal wave that vibrates in its direction, and the oscillator resonant height is equal to one half of the wave length of the standing longitudinal wave that vibrates in its direction, and the oscillator resonant length as well as the oscillator resonant height are chosen in such a way that the frequencies of the standing longitudinal acoustic waves expanding through the piezoelectric oscillator are equal both in the direction of the oscillator resonant length as well as in the direction of the oscillator resonant height.

70 Claims, 60 Drawing Sheets

PIEZOELECTRIC ADJUSTING ELEMENT

BACKGROUND OF THE INVENTION

1. Field of the Invention

The invention relates to a piezoelectric adjusting element in accordance with the preamble of patent claim 1.

2. Description of the Related Art

Linear piezoelectric motors whose functionality is based on the utilization of travelling waves are part of the state of the art and are, for example, the subject-matter of the printed patent specifications EP 0 475 752 B2 and U.S. Pat. No. 5,596,241.

Motors of this type suffer from the disadvantage that it is impossible to minimize them to any desired dimensions, because the minimum length of their wave guides must be a multiple value of 6λ to 10λ of the wave that expands in them. Moreover, from a technological perspective, they are difficult to manufacture, very complicated in terms of their setup and, therefore, correspondingly expensive.

Also known are piezoelectric motors whose functionality relies on standing acoustic waves. Prior art of this kind is reflected, among others, in U.S. Pat. No. 5,453,653. The motor of this style of execution can be realized small enough and allows, in terms of technology, for the production of major piece numbers. A monolithic piezoelectric oscillator is used as the drive element for this motor; and the oscillator has a long side, a short side as well as a friction element that is arranged on the small surface of the short side. On the first large side, the piezoelectric oscillator is equipped with a first group of electrodes and with a second group of electrodes. A joint electrode is arranged on the second large side. Two areas of a metallized piezo-ceramic surface, which are of equal size and arranged in a rectangular and diagonal manner, cover each first and second group of electrodes. An oscillator supplies electric a.c. voltage to the joint electrode and to the first or to the second group of electrodes. Due to the asymmetrical style of execution of each of the two groups of electrodes in relation to the longitudinal axis of the piezo-plate, an asymmetrical deformation results. This causes the friction element to perform a movement along closed paths either in the one direction or in the other direction, depending on which group of electrodes is supplied with the electric voltage.

The moving friction element sets a pressed-on driven element in motion which, in turn, performs movements in the one direction or in the other direction. The motor is excited with a frequency that is close to the frequency of resonance of the second vibration mode of the bending vibrations of the piezo-plate in its longitudinal direction.

In piezoelectric motors of this construction type, longitudinal vibrations of the oscillator pass the energy, that is stored inside the oscillator, on to the driven element. The parameters of these vibrations determine the size of the supply voltage of the motor, the geometry of the motor and the overall construction of the motor.

The supply voltage of the piezoelectric motor addressed here must be chosen very high by way of the small electro-mechanical coupling coefficient of the bending modes of the oscillator vibrations. Furthermore, in a piezoelectric motor of this construction type, the driven element has a strong dampening effect on the bending oscillator, which further increases the necessary supply voltage. Accordingly, piezoelectric oscillators in motors of known styles of execution in accordance with the state of the art require supply voltages of up to 500 V, resulting is a corresponding need for high voltage protection.

The relationship between the dimensions of the long side of the oscillator plate and the short side is approximately 3.7 in piezoelectric motors that are versions of the state of the art. With its short side, the oscillator plate is arranged parallel in relation to the surface of a driven element, and it bends along its long side during the operation of the motor. This kind of motor construction limits the maximum possible force that is generated by the motor by way of the flexural strength of the oscillator plate.

Since the friction element is located on the short side of the oscillator plate, its dimensions are limited. The width of the friction element may not be larger than one third of the short side of the piezo-element. This way, consequently, the width of the friction contact is limited to approximately 0.3 . . . 0.4 mm in construction types of motors according to the state of the art. The fact that this width of the friction contact is minimal additionally considerably limits the force that is to be generated by the motor. Correspondingly, motors of the construction types that are known in the art, which are comprised of an oscillator, only achieve a maximum force of approximately 10 N. Moreover, the small width of the friction contact also increases wear and tear, thereby resulting in the temporary instability of the operation of the motor. The small width of the friction contact especially reduces the movement stability of the driven element at low rates of motion. Furthermore, the narrow friction contact leads to parameter changes of the motor when the motor is stored over longer periods of time.

A motor construction in accordance with U.S. Pat. No. 5,453,653 envisions only one friction element on the surface of a piezoelectric oscillator. This causes the piezoelectric oscillator to become mechanically unstable, thereby reducing its positioning accuracy and rendering the construction of the oscillator mounting more complicated.

In addition to the above, one friction element limits the maximum possible force that is generated by the motor with a piezoelectric oscillator. If several oscillators are used, which are combined into a package, the positioning accuracy of the driven element deteriorates, and the electronic motor control is, moreover, very complicated in terms of its realization.

SUMMARY OF THE INVENTION

Therefore, it is the subject-matter of the present invention to design a piezoelectric motor on the basis of a monolithic piezoelectric oscillator and that will allow achieving greater force with a smaller excitation voltage, a better operating stability with a longer serviceable life, a more even movement of the driven element at lower rates of motion, a higher parameter stability when the motor is stored for longer periods of time, a mechanically robust oscillator construction, and that allows for a controlling means for tracking the oscillator frequency of resonance and for regulating position and parameters of the driven element.

This object is achieved with a piezoelectric adjusting element, in particular a piezoelectric motor as claimed in patent claim 1.

The piezoelectric motor according to the invention is comprised of a housing, a driven element, a friction layer, which is located on the housing or on the driven element, and of a drive element, which is electrically connected to an electric exciter source containing at least one friction element that is in friction contact with the friction layer, in the form of at least one monolithic plate-shaped or cylindrical piezoelectric oscillator with first and second main surfaces, first and second side surfaces as well as first electrodes and second groups of electrodes that are arranged on its main surfaces.

In the present context, it is essential that the piezoelectric oscillator referred to above has a resonant length and a resonant height, and the first group of electrodes and the second group of electrodes constitute two generators of acoustic waves. Accordingly, the first generator excites a standing longitudinal acoustic wave that vibrates in the direction of the oscillator resonant length. Analogously, the second generator excites a standing longitudinal acoustic wave that vibrates in the direction of the oscillator resonant height. The oscillator resonant length is equal to an integral multiple of the wave length of the standing acoustic longitudinal wave vibrating in its direction, which is generated by the first generator; and the oscillator resonant height is equal to one half of the wave length of the standing acoustic longitudinal wave vibrating in its direction, which, on its part, is generated by the second generator. The size of the oscillator resonant length and/or of the oscillator resonant height is, in particular, subject to the condition that the frequencies of the standing acoustic longitudinal waves, that vibrate in the oscillator in the direction of the oscillator resonant length and the oscillator resonant height, are equal.

The realization of the oscillator resonant length and of oscillator resonant height described here allows for the attachment of friction elements to the side surfaces of the oscillator and for the arrangement of the oscillator plate with its long side along the surface of driven element. In realizations of oscillator constructions of this type, the longitudinal vibrations along the length of the oscillator plate represent the main vibrations that pass the energy stored inside the oscillator on to the driven element. This vibration mode has a higher electro-mechanical coupling coefficient than the mode of the bending vibrations, thereby allowing for a reduction of the excitation voltage of the oscillator.

Due to the fact that the second vibration type of the vibrations that are utilized for the proposed motor consists of the longitudinal vibration mode in the direction of the height of the oscillator plate, it is possible to approximately double the oscillator height. This increases the longitudinal rigidity of the oscillator plate, and the maximum force that can be generated by this oscillator increases. Also, it is possible to attach friction elements with larger widths of friction contact to an oscillator of this kind. This realization also affects an increase of the possible force that is generated by the oscillator. The oscillator construction according to the invention allows for attaching several friction elements, either on one of the side surfaces of the oscillator or on two side surfaces simultaneously. This makes the oscillator considerably more robust, thereby greatly improving the stability of the motor operation at low rates of motion of the driven element.

The large width of the friction contact reduces the wear and tear of the friction element and lowers the extent of the parameter changes of the motor during storage.

A first embodied example of the proposed piezoelectric motor provides that the standing acoustic longitudinal wave, which vibrates along the resonant height of the piezoelectric oscillator, has a constant preceding sign along the resonant length. This motor variant allows for arranging one or two friction elements on one of the side surfaces of the oscillator.

In another embodied example of the proposed piezoelectric motor, the standing acoustic longitudinal wave, which expands along the resonant height of the piezoelectric oscillator, has a variable preceding sign along the resonant length. This motor variant allows for arranging one, two or three friction elements on one of the side surfaces.

In the proposed piezoelectric motor, the electrodes of the first group, i.e. the electrodes constituting the first generator of acoustic waves, are arranged primarily in the margin areas of the main surfaces of the oscillator; in particular, they are arranged symmetrically with regard to the plane of symmetry that extends through the center of the resonant height of the oscillator. And the electrodes of the second group, i.e. the electrodes constituting the second generator of acoustic waves, are arranged in the center area of the main surfaces of the oscillator; in particular, they are arranged symmetrically with regard to the plane of symmetry referred to previously.

An electrode configuration of this kind allows for the independent excitation of a standing acoustic longitudinal wave in the oscillator that vibrates in the direction of the resonant length and of another standing acoustic longitudinal wave that vibrates in the direction of the resonant height.

Another advantageous embodied example of the piezoelectric motor provides that the first group of electrodes and the second group of electrodes constituting, respectively, the first and the second generator of the standing acoustic longitudinal waves, are combined with reach other thereby forming a composite generator, which produces, simultaneously, one standing acoustic longitudinal wave that vibrates in the direction of the resonant length of the piezoelectric oscillator and one standing acoustic longitudinal wave that vibrates in the direction of the resonant height of the piezoelectric oscillator.

An electrode construction of this kind allows for the simultaneous excitation in the oscillator of, in particular, a standing acoustic longitudinal wave that vibrates along the resonant length of a piezoelectric oscillator and of a standing acoustic longitudinal wave that vibrates along the resonant height of the piezoelectric oscillator.

One advantageous motor construction is comprised of two or more plate-shaped piezoelectric oscillators that are connected to each other, thereby producing a uniform electromechanical resonator. In an embodied example of this kind of a piezoelectric motor, the excitation voltage of the piezoelectric oscillator is considerably reduced.

In one realization variant, the acoustically coupled oscillators that constitute the piezoelectric motor are connected to each other using a rigid organic bonding agent. This connection is particularly advantageous, in particular with regard to its simplified manufacturing technology. In the alternative, it is possible to combine the acoustically connected oscillators of the piezoelectric motor by way of sintering. This type of connection considerably improves the stability.

If a standing acoustic longitudinal wave with a constant preceding sign is excited in the piezoelectric motor in the direction of the resonant height of the piezoelectric oscillator, it is possible to arrange friction elements on one or on two side surfaces of the piezoelectric oscillator, in particular, in the areas with maximum vibration, which have the same preceding signs, of the standing acoustic longitudinal wave that vibrates in the direction of the resonant length of the piezoelectric resonator.

Arranging friction elements in this manner makes it possible to realize a movement of the friction elements of the piezoelectric motor that is aligned in the same direction.

In a piezoelectric motor in which a standing acoustic longitudinal wave with a variable preceding sign is generated that vibrates in the direction of the resonant height of the piezoelectric oscillator, the friction elements can be arranged on one or on two side surfaces of the piezoelectric oscillator, in particular, in the areas with maximum vibration, which do not have the same signs, of the standing acoustic longitudinal wave that vibrates in the direction of the resonant length.

Depending on the embodied example, the fiction elements for the variants of the piezoelectric motor according to the invention can be manufactured in the form of strips, small rods, pyramid-shaped elements or conical, cylindrical, or semi-spherical elements made of oxide-ceramic, metal-ceramic or of a corresponding composites with other materials.

Realizing the friction elements in this way allows for optimal adjusting to the driven element. Friction elements in the form of strips or small rods can have transverse grooves that make it possible to reduce the mechanical stresses developing between the friction element and the oscillator and that, moreover, prevent any deformation of the functional surface of the friction element. Depending on the respective embodied examples of the proposed motor, the friction elements can have a one-layered or multiple-layered structure.

This allows for an optimal adjustment of the friction elements to the respective piezoelectric oscillator. Depending on a respective concrete motor variant, layers of the one-layered or multiple-layered structure of the friction elements can be arranged parallel in relation to the side surfaces of the piezoelectric oscillator.

Arranging the layers of the friction elements in this manner allows for providing the friction elements with the maximum possible surface of friction contact that is able to transfer considerably greater forces than the embodied examples of a piezoelectric oscillator, motor or adjusting element that are known in the state of the art.

In another embodied example of the piezoelectric motor according to the invention, the one-layered or multiple-layered layer structure of the friction element can be arranged, in its entirety or in part, in a perpendicular direction in relation to the side surfaces of the piezoelectric oscillator. Arranging the layers of the friction elements in this way allows for the maximum possible suppression of parasitic, and therefore undesired, vibrations that are generated in the friction elements during the operation of the motor.

Another variant of an embodied example of the piezoelectric motor provides that the layers of the one-layered or multiple-layered structure of cylindrically, conically or semi-spherically realized friction elements are realized accordingly and that they are arranged concentrically. A layer arrangement of this type allows for a realization of the friction elements that places minimal stress upon the piezoelectric oscillator.

In the context of the embodied examples of the piezoelectric motor, the layers within the one-layered or multiple-layered structure of the friction elements have different moduli of elasticity. Varying the layers of the friction elements allows for optimally adjusting the friction elements of the piezoelectric motor to the piezoelectric oscillator.

As one realization, the wear resistant layer of the multiple-layered friction element of the piezoelectric motor has a modulus of elasticity that is determined on the basis of its capacity of resistance to wear and the mechanical stability of its functional surface, while a connecting layer of the friction element is characterized by a modulus of elasticity that is adjusted to the modulus of elasticity of the piezoelectric ceramic of the oscillator. This makes it possible to achieve an optimal acoustic adjustment of the friction element in relation to the piezoelectric oscillator.

In embodied examples of the piezoelectric motor with concentrically arranged layers of the friction elements, the wear resistant layer of the multiple-layered structure of the friction elements, suitably, has a modulus of elasticity that is determined on the basis of the required capacity of resistance to wear and the mechanical stability of its functional surface, while the properties of the dampening layer are determined on the basis of the dynamic stability of the wear resistant layer. As a result, a maximum possible dynamic stability of the friction elements is achieved.

In embodied examples of the piezoelectric motor with a two-layered or multiple-layered structure of the friction elements, it is possible to manufacture the layers of monolithic materials and to connect them to one another by way of sintering. This way, the maximum possible stability of the connection of the layers of the friction elements is reached.

In embodied examples of piezoelectric motors with a two-layered or multiple-layered structure of the friction elements, it is possible to envision a porous material as the connecting layers of the friction elements, which results in an improvement of the stability of the connection of the friction element with the surface of the piezoelectric oscillator.

The porosity of the materials within the layered structure of the friction elements can be realized as variable in this embodied example. In their entirety or in part, all layers can be comprised of a porous material that has variable porosity. Particularly suitable are realizations of piezoelectric motors with a multiple-layered structure of the friction elements in which the connecting layer has a maximum porosity and the wear resistant layer is not porous. An embodied example of this kind makes it possible to avoid jumps that are caused due to mechanical stresses within the friction element.

In another embodied example of the piezoelectric motor according to the invention, in particular embodied examples in which the layers of the friction elements are arranged in a perpendicular or concentric manner in relation to the side surfaces of the oscillator, the dampening layer is comprised of a porous material. This allows for maximum dampening of the friction element.

In the different variants of embodied examples of the proposed motor with a plane functional surface of the friction elements, this functional surface can be arranged at an angle in relation to the side surface on which the friction elements are arranged, resulting in an increase of the coupling force between the friction elements and friction layer.

In combination, the functional surface of the friction elements can have a triangular-concave or triangular-convex form or a round concave or round-convex form, and the functional surfaces of the friction elements are arranged along the resonant length of the piezoelectric oscillator. These variants of realizations of functional surfaces of friction elements enlarge the available surface of the friction contact.

In one embodied example, the friction elements of the piezoelectric motor according to the invention can be connected using an organic material, e.g. an epoxy-resin-based bonding agent, which is connected to the surface of the piezoelectric oscillator, resulting is a simplification of the manufacturing technology of the piezoelectric motor.

In the alternative, in another embodied example of the piezoelectric motor, it is possible to connect the friction elements to the surface of the piezoelectric oscillator using a material that creates a material-lock bond with the material of the oscillator. Suitable connecting materials are, for example, lead-containing easily fusible glass or other similar materials. This variant, which provides for establishing a connection between the surface of the piezoelectric ceramic and the friction elements, allows for maximum connecting solidity.

In the described variant of the piezoelectric motor according to the invention, it is possible to fill all or only some pores of the friction elements with a material that connects the friction element to the surface of the piezoelectric oscillator, thereby also creating a greater solidity of the connection.

In realizations of the piezoelectric motor according to the invention that feature transverse grooves, it is possible to fill the transverse grooves with a sound absorbing material, thereby reducing the mechanical quality of the friction elements. This dampens parasitic vibrations that develop in parts of the friction elements.

Moreover, the friction elements themselves can also be realized as glass strips that are melted onto the surface of the piezoelectric oscillator. This simplifies the manufacturing technology of the friction elements.

If the friction elements are manufactured as glass strips, they can be filled with a powder of a wear resistant material. Suitable for use in this context are, for example, powdered aluminum oxide, zirconium oxide, tungsten carbide, titanium carbide or another similar material. This improves the capacity of resistance to wear of the friction elements.

Envisioned as a suitable realization of the piezoelectric motor according to the invention is a realization that includes elements that limit the piezoelectric oscillator, thereby preventing any shifting of the piezoelectric oscillator in the direction of the resonant length. In an advantageous variant of a realization of a piezoelectric motor, the elements, which prevent the shifting of the oscillator, can serve as mechanical resonators whose frequency of resonance corresponds to the oscillation frequency of the piezoelectric oscillator during the operation of the motor. This reduces the mechanical losses.

In one embodied example of the piezoelectric motor according to the invention, the piezoelectric oscillator is equipped with at least one fastening element that is rigidly connected to the oscillator. Thus, the fastening elements allow for the possibility that the piezoelectric oscillator is rigidly fastened.

In a first embodied example, the fastening elements are arranged on at least one of the side surfaces of the piezoelectric oscillator, preferably in the locations of the minimum vibration of the standing acoustic longitudinal wave that vibrates along the resonant length of the oscillator. Arranging the fastening elements in this way makes it possible to affect a front fastening of the piezoelectric oscillator.

In another embodied example of the piezoelectric motor according to the invention, the fastening elements are arranged on at least one of the main surfaces of the piezoelectric oscillator, preferably at the locations of the minimum vibration of the standing acoustic longitudinal wave that vibrates in the direction of the resonant length of the oscillator. Arranging the fastening elements in this way makes it possible to affect a lateral fastening of the piezoelectric oscillator.

In another variant of an embodied example of the piezoelectric motor according to the invention, the fastening elements have the shape of a rectangular prism, a triangular prism, a semi-cylindrical prism or of another similar prism-type form; all the while, it is also possible to realize the fastening elements as conical elements, pyramid-shaped elements, semi-spherical elements or as rectangular elements with profile grooves or projecting parts, as cylindrical step elements or as round elements with profile bore holes. The corresponding realization of the construction of the fastening elements makes it possible to achieve a reliable attachment of the piezoelectric oscillators.

In further embodied examples of the piezoelectric motor according to the invention, the fastening elements are realized using a material whose modulus of elasticity is equal to or somewhat larger than the modulus of elasticity of the piezoelectric ceramic, in particular using oxide-ceramic. Realizing the construction in this manner ensures a high level of solidity of the fastening elements.

In one embodied example the fastening elements are comprised of a material whose modulus of elasticity is small in contrast to the modulus of elasticity of the piezo-ceramic of the piezoelectric oscillator. Realizing the construction of the fastening elements in this way makes it possible to achieve a reduction of the mechanical stresses that develop between the fastening element and the oscillator.

It is also possible to manufacture the fastening elements of the same type of piezo-ceramic as the oscillator. This way, an optimal acoustic coupling of the fastening element with the oscillator is achieved. Moreover, each fastening element, or a part thereof, can be manufactured of a porous material. This reduces the acoustic vibrations that develop inside the fastening element.

In special motors, it is also possible to realize the fastening elements as resonance bending plates or as resonance bending bars. Constructing the fastening elements in this manner allows for reducing the mechanical losses.

As components of the piezoelectric motor, the fastening elements can be connected to the surface of the piezoelectric oscillator, using an organic bonding agent. This simplifies the manufacturing technology of the motor.

Depending on the embodied example of the piezoelectric motor according to the invention, the fastening elements can be arranged on at least one of the side surfaces of the piezoelectric oscillator, in particular at the locations of the minimum vibration of the standing acoustic longitudinal wave that vibrates in the direction of the resonant length of the oscillator. This way, arranging the fastening elements in the form of a front fastening arrangement is made possible.

In another embodied example of the piezoelectric motor according to the invention, fastening elements are arranged on at least one of the main surfaces of the piezoelectric oscillator, in particular at the locations of the minimum vibration of the standing acoustic longitudinal wave that vibrates in the direction of the resonant length of the oscillator. This way, arranging the fastening elements in the form of a lateral fastening arrangement is made possible.

In one variant of an embodied example of the piezoelectric motor according to the invention, it is possible to set up the fastening elements inside solid support mountings. This allows for an especially stable fixation in place of the piezoelectric oscillator. In particular, the solid support mountings can be manufactured in the form of flat springs. This way, the mechanical losses caused due to the support mountings are reduced.

The driven element of the piezoelectric motor is, in general, arranged with the ability to shift. This makes longitudinal movements of the driven element possible. The driven element, which is arranged with the ability to shift, is realized, depending on its concrete modeling, as a rectangular platform, a frame or as a bar with rectangular, multiple-corner or round cross-section or as a tube. The results are varied options for modeling a piezoelectric linear motor.

In addition, it is possible to arrange the driven element with the ability to rotate. A motor construction of this kind allows for a rotational movement of the driven element. In the motor variants with the driven element arranged with the ability to rotate, the driven element can have the form of a cylinder, a plate, a hollow cylinder or of a ring.

The construction forms of the driven element that were referred to previously allow for the assembly of different variants of a piezoelectric revolving cylinder motor. In the context of the piezoelectric motor according to the invention, rectangular, round, elliptical or similar dampening bore holes are envisioned for the realization of the friction elements, preventing any expansion of acoustic waves, whose frequency is equal to the frequency of the piezoelectric oscillator during the operation of the motor or whose frequency is equal to harmonic oscillations, in the friction element. This makes it possible to improve the friction contact of the motor.

In accordance with the invention, the fiction layer of the driven element can be manufactured of oxide-ceramic or of a comparable other hard and wear resistant material, and, suitably, the thickness is at least five times smaller than the resonant height of the piezoelectric oscillator in order to effect as lasting a reduction as possible of the amplitude of the acoustic longitudinal vibrations that develop in the fiction layer.

The thickness of the fiction element located below the friction layer must be of a greater value than the resonant height of the piezoelectric oscillator in order for it to reduce the amplitude of the acoustic bending vibrations occurring in the driven element.

In accordance with the invention, it is possible to insert a thin dampening layer between the body of the driven element and the friction layer, that is comprised of a viscous organic or of a porous inorganic material or of a composite of the two in order to reduce the acoustic coupling between the friction layer and the driven elements.

The piezoelectric motor according to the invention can be comprised of at least two piezoelectric oscillators, arranged opposite to each other, and of at least two friction layers, arranged on two opposite sides of the driven element, in order to be able to forego a bearing for stabilizing the longitudinal movement.

To hold the driven element in an especially stable position, the piezoelectric motor according to the invention, in a special embodied example, is comprised of at least three piezoelectric oscillators and of at least three friction layers, which are arranged parallel in relation to each other and located in at least three planes.

In the embodied example of a piezoelectric motor according to the invention that has separate generators for longitudinal waves, the electric excitation source is realized as a two-channel power amplifier. Said amplifier is comprised of a first channel and of a second channel, of formation levels connected to a basic generator and of output power amplifiers that are electrically connected, via adjustment levels, to the corresponding electrodes of the generator on the piezoelectric oscillator. They generate acoustic longitudinal waves that vibrate in the direction of the resonant length of the piezoelectric oscillator as well as acoustic longitudinal waves that vibrate in the direction of the resonant height of the oscillator.

The setup of the electric excitation source with separate generators makes it possible to achieve optimal movement paths of the fiction elements in the oscillator, via the excited acoustic waves.

In another embodied example, the electric excitation source is set up as a single-channel power amplifier, which is comprised of a formation level, that is connected to the basic generator, and an output amplifier, which is connected, via an adjustment level and an electrode commutator, to the electrodes of the correspondingly composed piezogenerator.

The output power amplifiers are set up as bridge power amplifiers, each of which includes two half-bridges. The formation levels contain two excitation channels of the referred to half-bridge power amplifiers, and one of the excitation channels is equipped with a phase control element and contains a phase control input. This allows for regulating the rate of motion of the driven element.

As realization of the motor according to the invention, it is envisioned that the motor according to the invention is equipped with a signal level transformer whose output is connected to the phase control input of a phase control element. This allows for controlling the rate of motion of the driven element by way of a linear electric signal.

In another embodied example, the motor according to the invention is equipped with a demodulator of a pulse width modulated signal whose output is connected to the phase control input of the phase control element. This allows for controlling the rate of motion of the driven element by way of a pulse width modulated signal.

Furthermore, realizing the motor according to the invention including a level detector for the zero position, whose measuring input is connected to the input of the signal level transformer or to the output of the demodulator of a pulse width modulated signal, is also possible. In the above context, the output of the level detector is connected to the input of a reverse change-over or to the control input of an electrode commutator. This realization of the motor allows for reversing the driven element.

In another realization, the basic generator is equipped with a frequency control input. This variant of the motor allows for a frequency adjustment of the basic generator.

Also envisioned is a realization of the motor according to the invention with a phase detector; the phase detector is comprised of a first phase input and of a second phase input as well as of an output, and the output of the phase detector is connected to the frequency control input of the basic generator, the first phase input is electrically connected to the electrode of the same phase of the corresponding generator of acoustic longitudinal waves, and the second phase input is electrically connected to one of these waves. This allows for an automatic frequency adjustment of the basic generator.

In the embodied example of the motor according to the invention, separate generators of acoustic waves, a sensor is realized as a thin piezo-ceramic plates, containing electrodes on its large surfaces, and which is fastened, acoustically coupled, to the surface of the piezoelectric oscillator, in particular at locations of the greatest mechanical stress of the acoustic longitudinal wave that vibrates in the piezoelectric oscillator. This way, using the sensor, it is possible to determine the mechanical resonance of the oscillator that is excited by separate generators.

In the embodied example of the motor with composite generators of acoustic waves, the sensor is realized primarily in the form of two thin piezo-ceramic plates, containing electrodes on their wide surfaces, that are fastened, acoustically coupled, to the surface of the piezoelectric oscillator. Most suitably, they are fastened at locations in which the greatest mechanical stresses of the acoustic longitudinal wave occur as well as at those points that have, in the event of a signal phase shift of one of the channels of the power amplifier with regard to the signal of another channel by 180° in relation to it, the same paths of movement. In this context, both sensor parts are connected to the second input of the phase detector by way of a sensor signal commutator. The phase detector control input is electrically connected to the control input of the reverse change-over. For this variant, the sensor also allows for a determination of the strength of the mechanical resonance of the piezoelectric oscillator.

The proposed motor can be equipped with a coordinate parameter sensor or movement parameter sensor of the driven element, which is electrically connected to the processor-controlled controlling means of the parameters measured by the sensor and whose output is connected to the signal level transformer or the demodulator of a pulse width modulated signal. This allows for adjusting the coordinate parameter sensor or movement parameter sensor of the driven element.

BRIEF DESCRIPTION OF THE DRAWINGS

Subsequently, the invention will be described in more detail using an embodiment. For further clarification, the following figures.

DETAILED DESCRIPTION OF THE PREFERRED EMBODIMENTS

Figure 1:
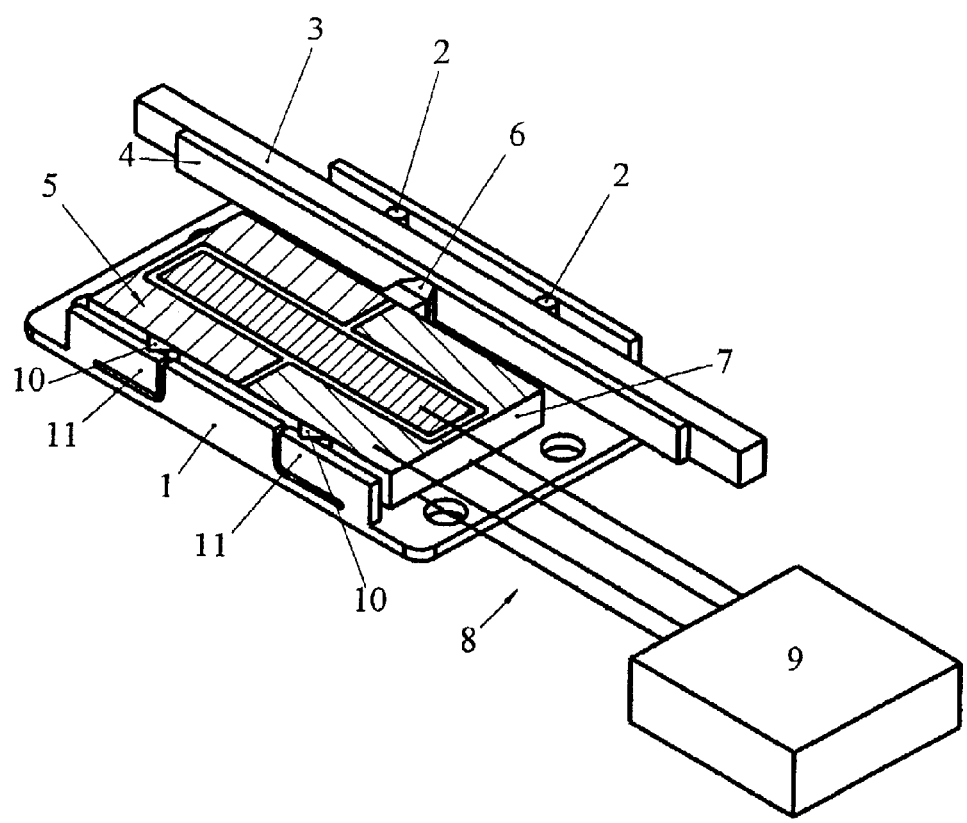
FIG. 1 illustrates a main view of the proposed motor.

FIG. 1 shows a preferred variant of the piezoelectric motor according to the invention. The motor is comprised of a housing 1, inside, which the bearing for the longitudinal movement 2 of the driven element 3 with the friction layer 4 is set up. In the motor variant addressed here, the driven element 3 is shown as a bar with a rectangular cross-section.

The driving element 5 is also arranged inside the housing 1, along with the friction element 6 that has is in friction contact with the friction layer 4.

The driving element 5 is realized as a monolithic plate-shaped piezoelectric oscillator 7 that is electrically connected to the electric excitation source 9 via the outputs 8.

To avoid any longitudinal shifting, the piezoelectric oscillator 7 is equipped with the fastening elements 10, which are set up inside the support 11.

Figure 2:
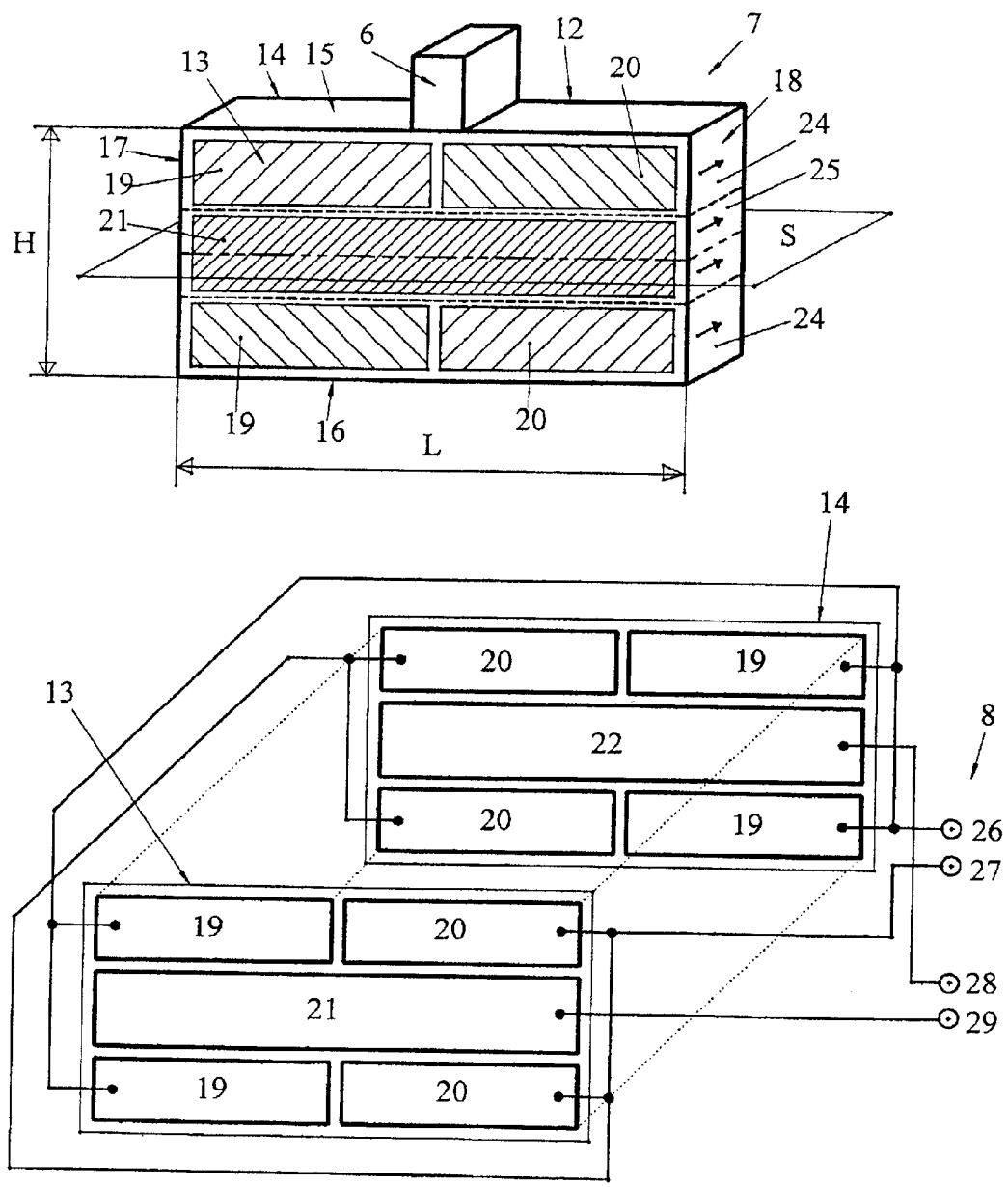
FIG. 2 illustrates a construction variant of the oscillator with excitation of a longitudinal wave with constant preceding sign.

FIG. 2 shows one of the construction variants of the piezo-oscillator 7. Its main part is comprised of the rectangular piezo-element 12. The oscillator 7 has a first main surface 13 and a second main surface 14, a first side surface 15 and a second side surface 16, a first front surface 17 and a second front surface 18, the resonant length L and the resonant height H. The piezoelectric ceramic of the piezo-element 12 is polarized normally in relation to the main surfaces 13, 14 of the oscillator 7, as seen in FIG. 2 and further indicated by way of arrows. In the variant of the oscillator 7 addressed here, the resonant length L is equal to the wave length λ of a wave that expands along the length of the oscillator 7. The resonant height 7 of the oscillator 7 is equal to one half of the wave length λ of a wave that expands along the height of the oscillator 7.

Two groups of electrodes are arranged on the two main surfaces 13, 14 of the oscillator 7. The first group of electrodes is comprised of the electrodes 19, 20, and the second group of electrodes is comprised of the electrodes 21, 22. The configuration of the electrodes 19, 20, 21, 22, their arrangement and electrical wiring is displayed in FIG. 2, bottom part.

The electrodes 19, 20 of the first group of electrodes and the piezoelectric ceramic arranged between them constitute the generator 24 of an acoustic longitudinal wave that expands along the resonant length L of the piezoelectric oscillator 7.

The electrodes 21, 22 of the second group of electrodes and the piezoelectric ceramic arranged between them constitute the generator 25 of an acoustic longitudinal wave that expands along the resonant height H of the piezoelectric oscillator 7. In the represented variant of the oscillator 7, this wave is a wave along the resonant length L of the oscillator 7 with a constant preceding sign.

The electrodes 19, 20 of the first group of electrodes are arranged in the margin areas of the main surfaces 13, 14 of the oscillator 7; in particular, symmetrically in relation to the plane of symmetry S that extends through the center of the resonant height of the oscillator 7 and stands perpendicular in relation to the main surfaces 13, 14.

The electrodes 21, 22 of the second group of electrodes are arranged in the center areas of the main surfaces 13, 14 of the oscillator 7; in particular, symmetrically in relation to the plane of symmetry S that extends through the center of the resonant height of the oscillator 7 and stands perpendicular in relation to the main surfaces 13, 14.

For the purpose of establishing the electric connection of the oscillator 7 with the electric excitation source 9, each of the electrodes 19, 20, 21, 22 is equipped with the connections 26, 27, 28, 29 that form the connecting group 8. The connections 19, 20 are used for supplying excitation voltage to the generator of the acoustic waves 24. The connections 28, 29 are used for supplying excitation voltage to the generator of the acoustic waves 25.

Figure 3:
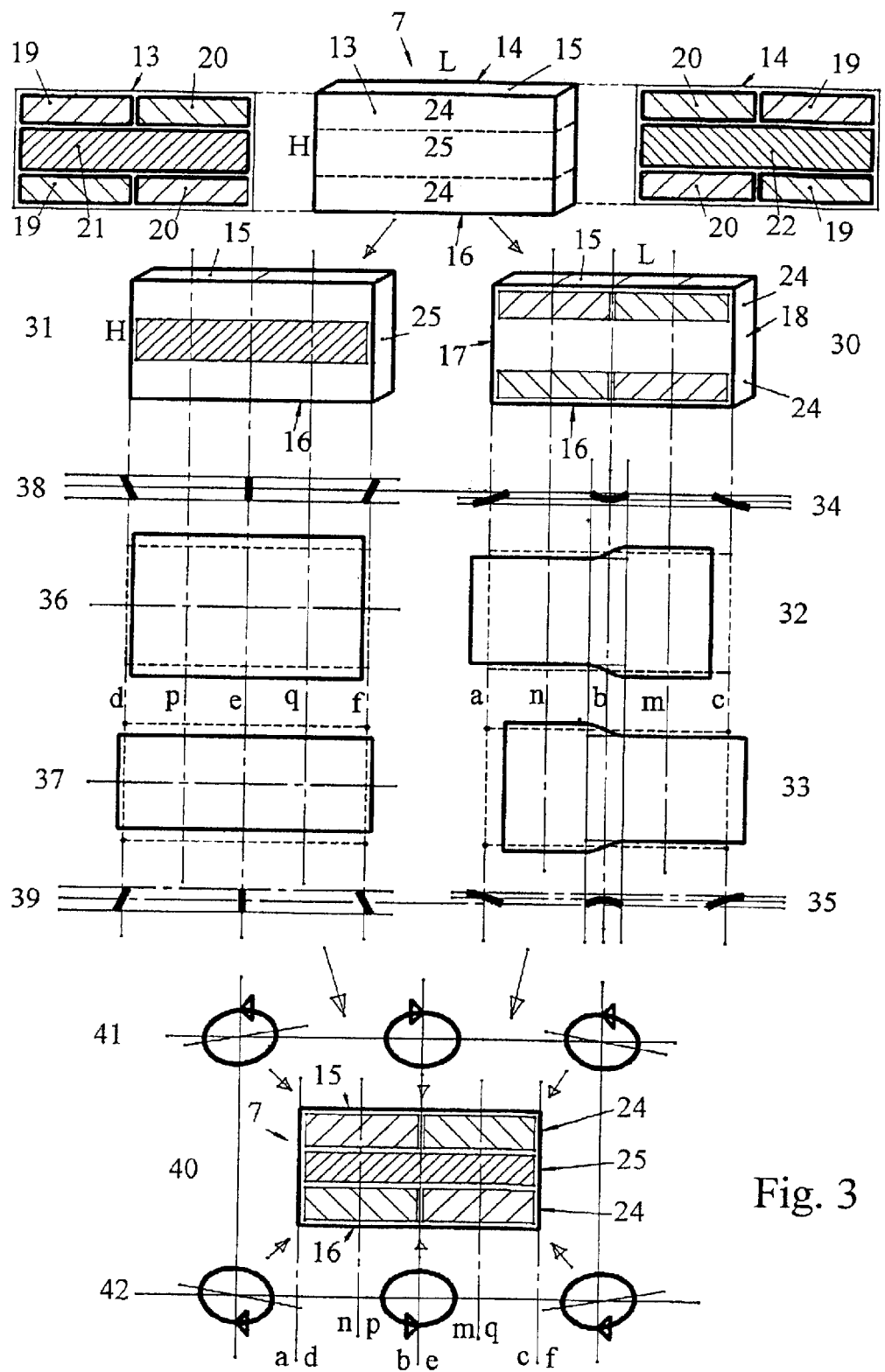
FIG. 3 illustrates the functioning of an oscillator with excitation of a wave with constant preceding sign.

FIG. 3 explains how the oscillator 7 of the motor variant addressed here functions. To explain the way it functions, inventors are relying on the principle of the independent excitation of acoustic waves in the oscillator 7. In accordance with this principle, based on the small vibration amplitude, it is possible to represent the oscillator 7 as the two independent oscillators shown in pos. 30, 31, and each of the two now contains no more than one generator of acoustic waves. The oscillator shown in pos. 30 contains only the generator 24 of the acoustic wave that expands along its resonant length L, and the oscillator shown in pos. 31 contains only the generator 25 of the acoustic longitudinal wave that expands along its resonant height H.

When the generator 24 is excited, the oscillator in pos. 30 has the oscillation forms represented in pos. 32, 33. The points that are located on its side surfaces 15, 16 along the axes a, b, c are in maximum rate of vibration and move along the longitudinal paths that are indicated in pos. 34, 35. The points that are located on its side surfaces along the axes n, m are in minimum rate of vibration and have only small transverse amplitude of the vibrations.

When the generator 25 is excited, the oscillator in pos. 31 has the oscillation forms represented in pos. 36, 37. In this instance, the points that are located on its side surfaces 15, 16 along the axes d, p, e, q, f move along the transverse paths that are shown in pos. 38, 39. This acoustic wave has a constant preceding sign along the resonant length L of the oscillator. With regard to a wave of this kind, a positive (pos. 36) or a negative shift of the side surfaces 15, 16 (pos. 37) in relation to its starting position occurs.

When the two generators 24, 25, which are part of the same oscillator 7, are excited simultaneously (refer to pos. 40), the result is a movement overlap of the points that are located on the surface 15, 16 along the axes ad, be and cf. Consequently, the points that are located along these axes move longitudinally along the closed paths that are represented in pos. 41, 42. As a first approximation, the form of these movement paths can be described as elliptical. Places along the axes ad, be, and cd on the surface 15, 16 are optimally suited locales for attaching the friction elements 6.

Places along the axes np, mq are in minimum rate of vibration and only have a transverse amplitude of the vibrations. These places are optimally suited locales for attaching the fastening elements 10.

Figure 4:
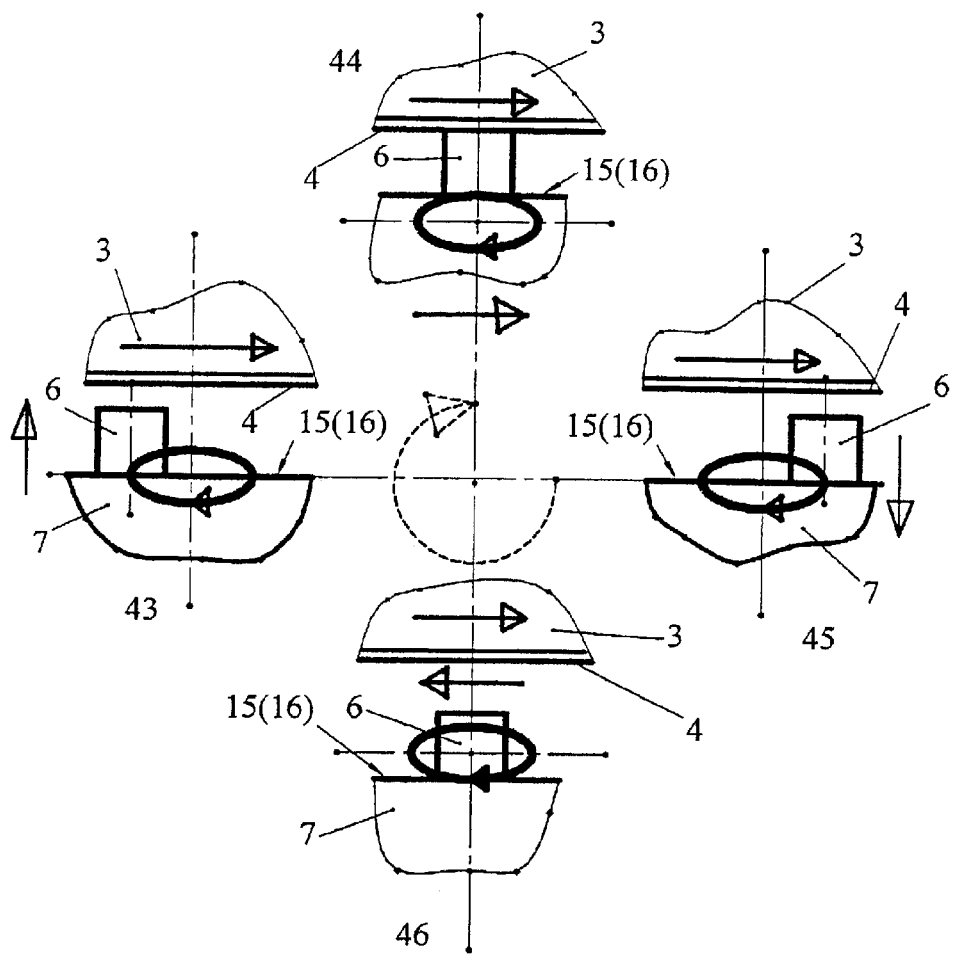
FIG. 4 illustrates the functioning of a friction contact.

FIG. 4 shows the elliptical movement phases of the friction element 6, which is attached on one of the side surfaces 15 or 16 along the axes ad, be, cf. Phase of advance pressure-pos. 43 phase of the advance movement-pos. 44, phase of the return pressure-pos. 45, phase of the return movement-pos. 46.

The direction of the movement of the friction element 6 is determined by the sign of the maximum rate of vibration of the acoustic wave that expands along the resonant length L of the oscillator 7. The friction elements 6 are attached in those places where the points of the surfaces 15, 16 have the same direction of movement on closed paths.

Figure 5:
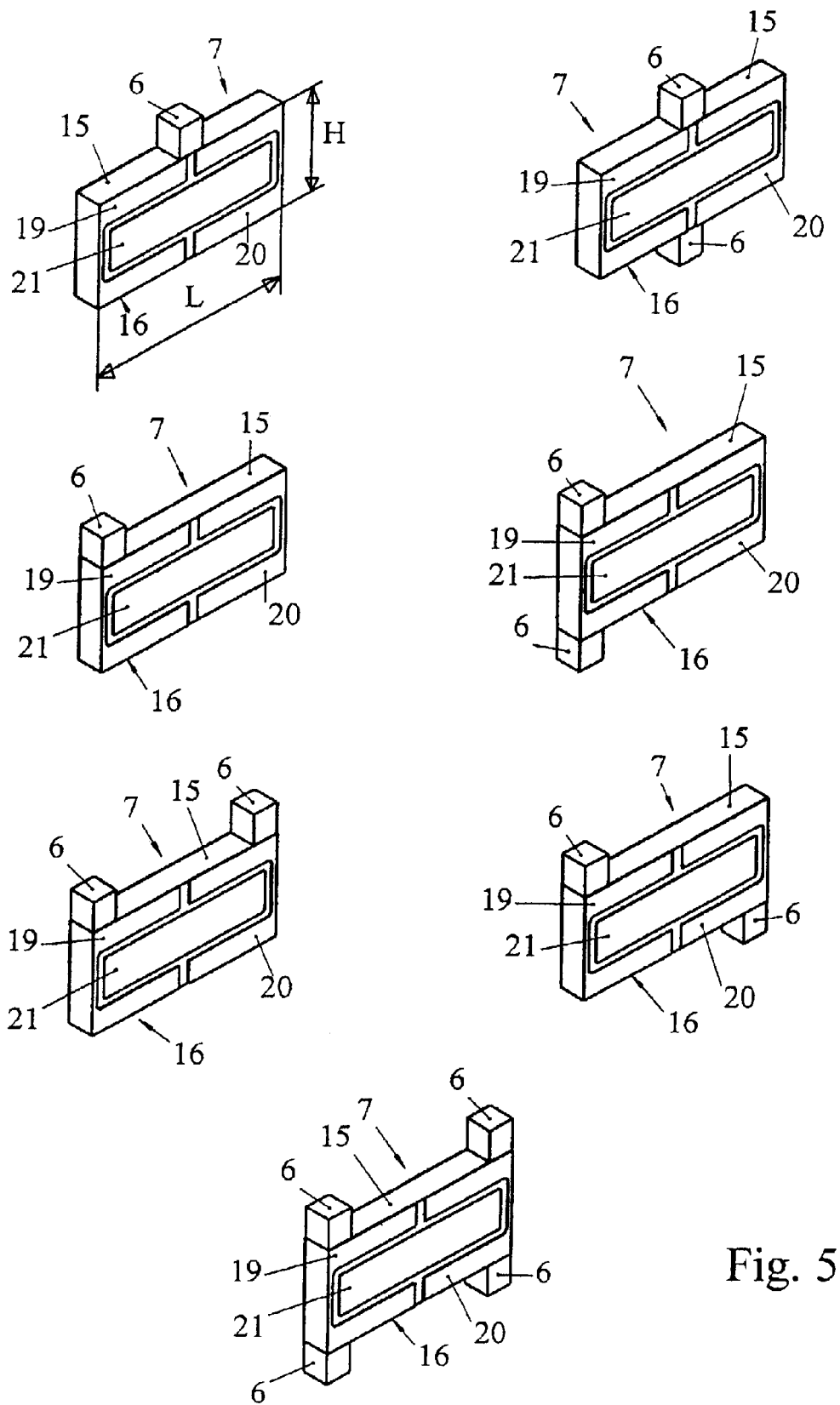
FIG. 5 illustrates the oscillator variants with a resonant length of $L=\lambda$.

FIG. 5 shows construction variants of the oscillator 7, depicted in conjunction with the friction elements 6 that are attached to its surface 15, 16 and with a resonant length L of the oscillator that is equal $\lambda$.

Figure 6:
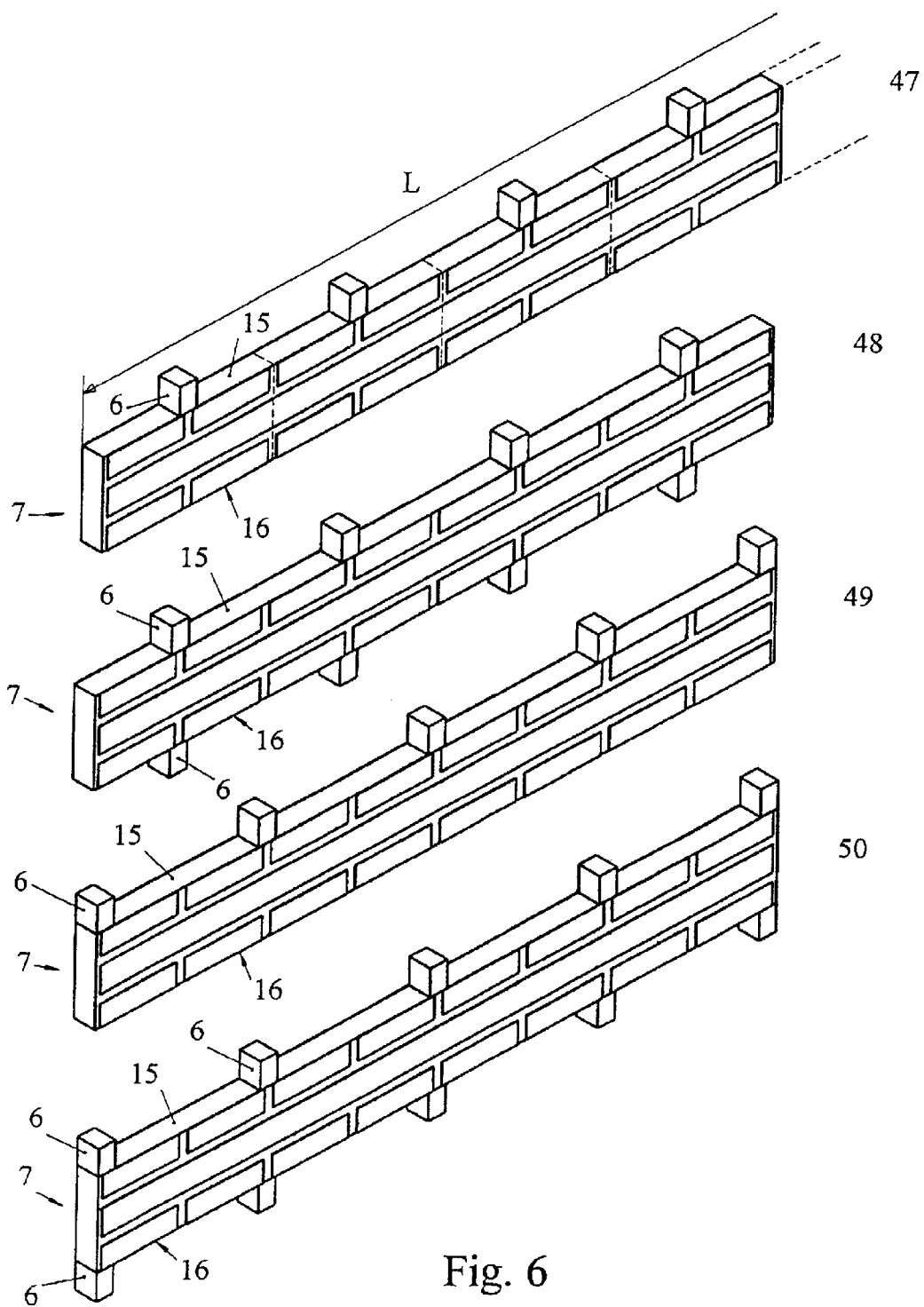
FIG. 6 illustrates the oscillator variants with a resonant length of $L=n\lambda$.

The pos. 47, 48, 49, 50 in FIG. 6 represent construction variants of the oscillator 7 with a resonant length L that is an integral multiple of $\lambda$, i.e. L=k*$\lambda$, while k=1, 2, 3 . . .

Figure 7:
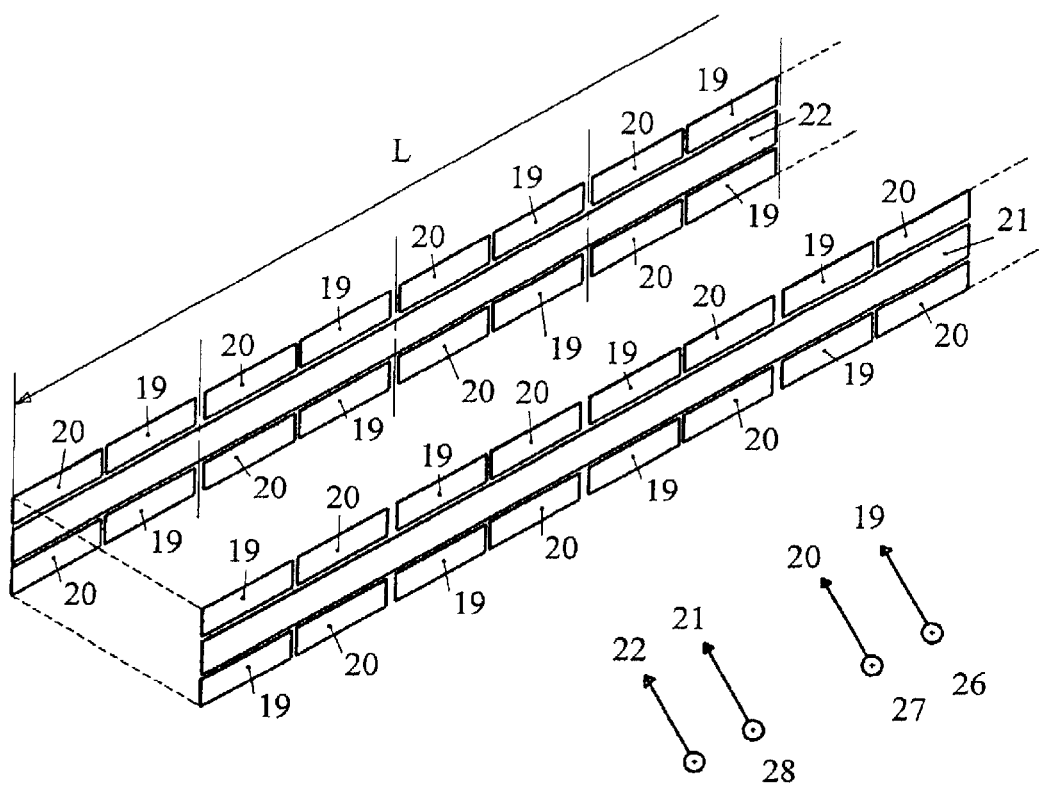
FIG. 7 illustrates electrode configurations of an oscillator with a resonant length of $L=n\lambda$.

FIG. 7 shows a configuration of the electrodes 19, 20, 21, 22 and of their electric wiring including the connections 26, 27, 28, 29 for the oscillator 7 whose resonant length L is an integral multiple of $\lambda$.

Figure 8:
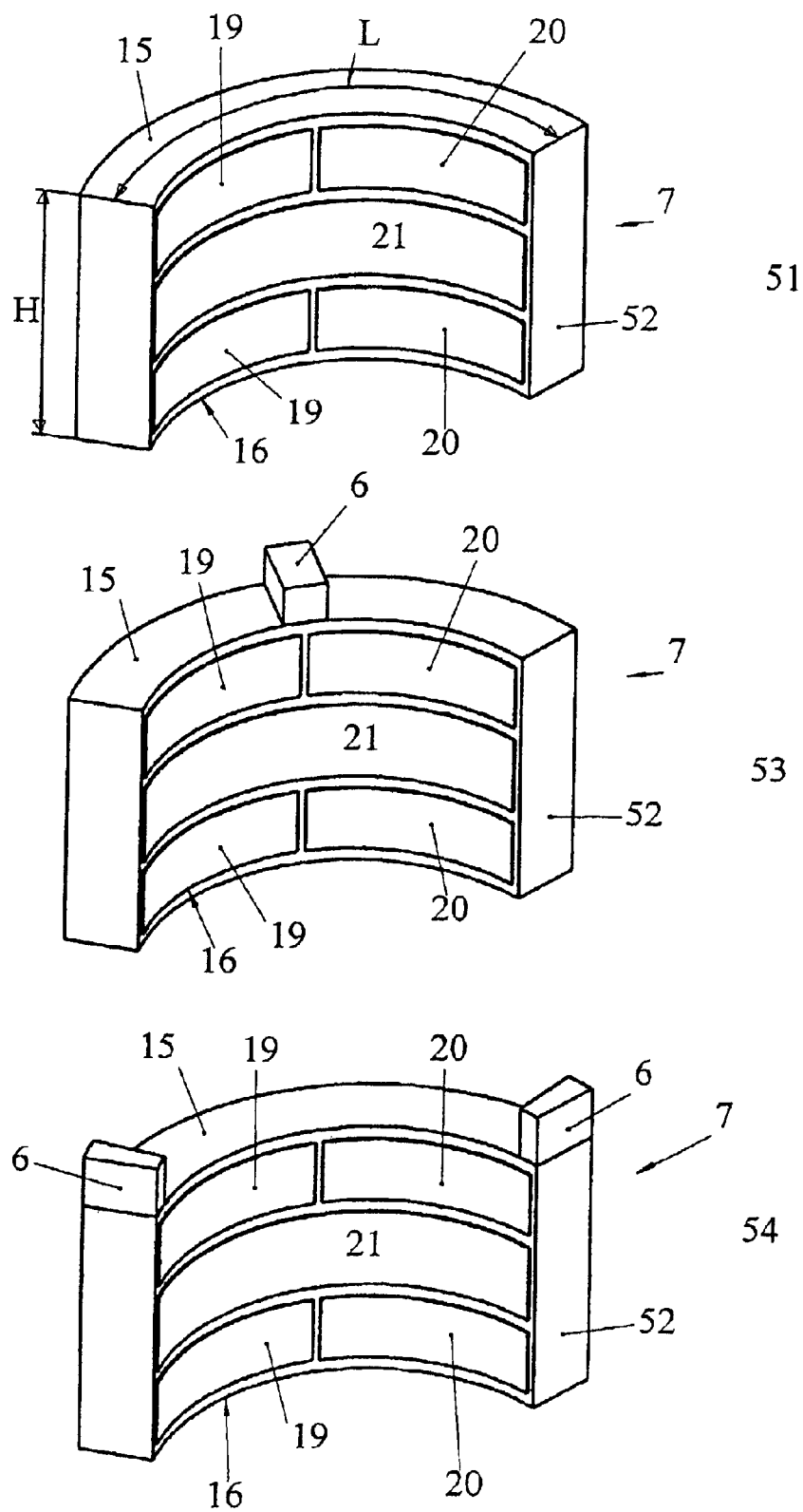
FIG. 8 illustrates the oscillator variants in the form of a cylinder part.

The pos. 51 in FIG. 8 discloses a construction variant of the oscillator 7 in the form of a cylinder part 52 whose resonant length L is equal $\lambda$. The pos. 53, 54 show variants of arrangements of the friction elements 6 on the side surfaces 15, 16 with the oscillator 6 in the form of the cylinder part 52.

Figure 9:
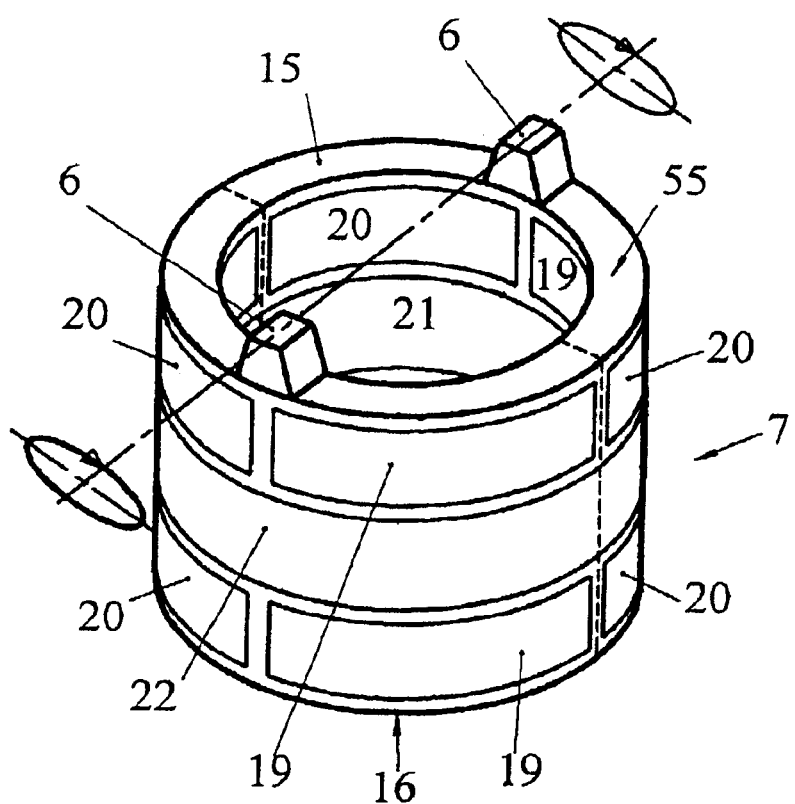
FIG. 9 illustrates the oscillator variant in the form of a cylinder with a resonant length of $L=2\lambda$.

FIG. 9 depicts a construction variant of the oscillator 7 in the form of the cylinder 55 whose resonant length is equal to 2$\lambda$. An oscillator of this type is comprised of two parts (refer to FIG. 8), with each part having a resonant length L that is equal $\lambda$. In this construction variant of the oscillator 7, the two friction elements 6 have opposite directions of movement.

Figure 10:
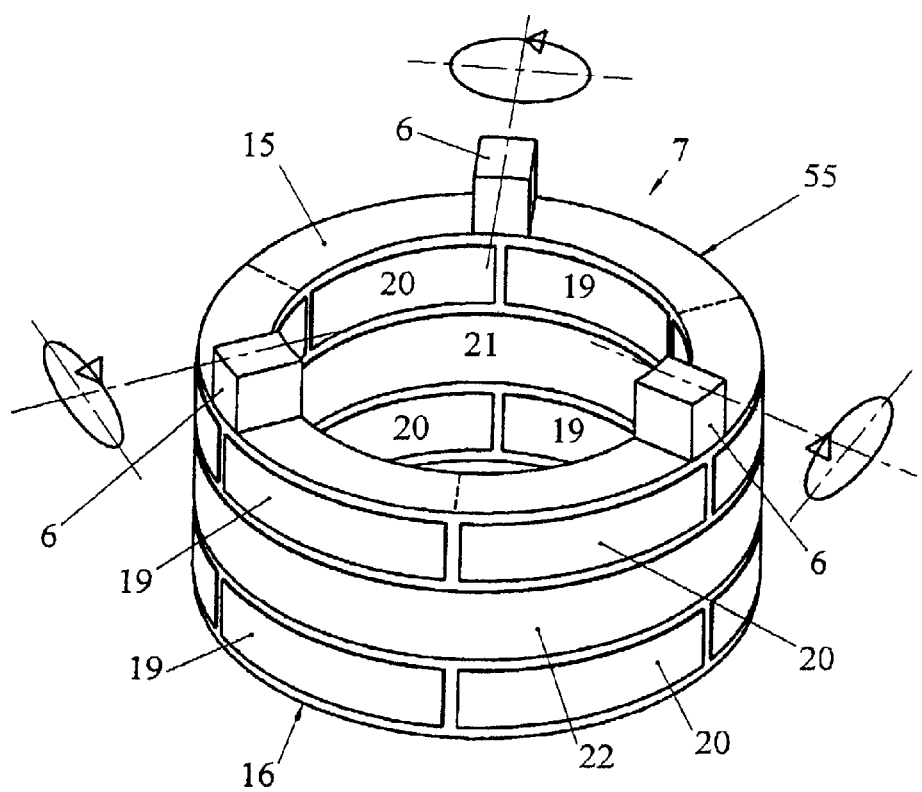
FIG. 10 illustrates the oscillator variant in the form of a cylinder with a resonant length of $L=3\lambda$.

FIG. 10 shows a construction variant of the oscillator 7 in the form of the cylinder 55, which is comprised of three parts 52 (refer to FIG. 8), having a joint resonant length of L=3$\lambda$.

Figure 11:
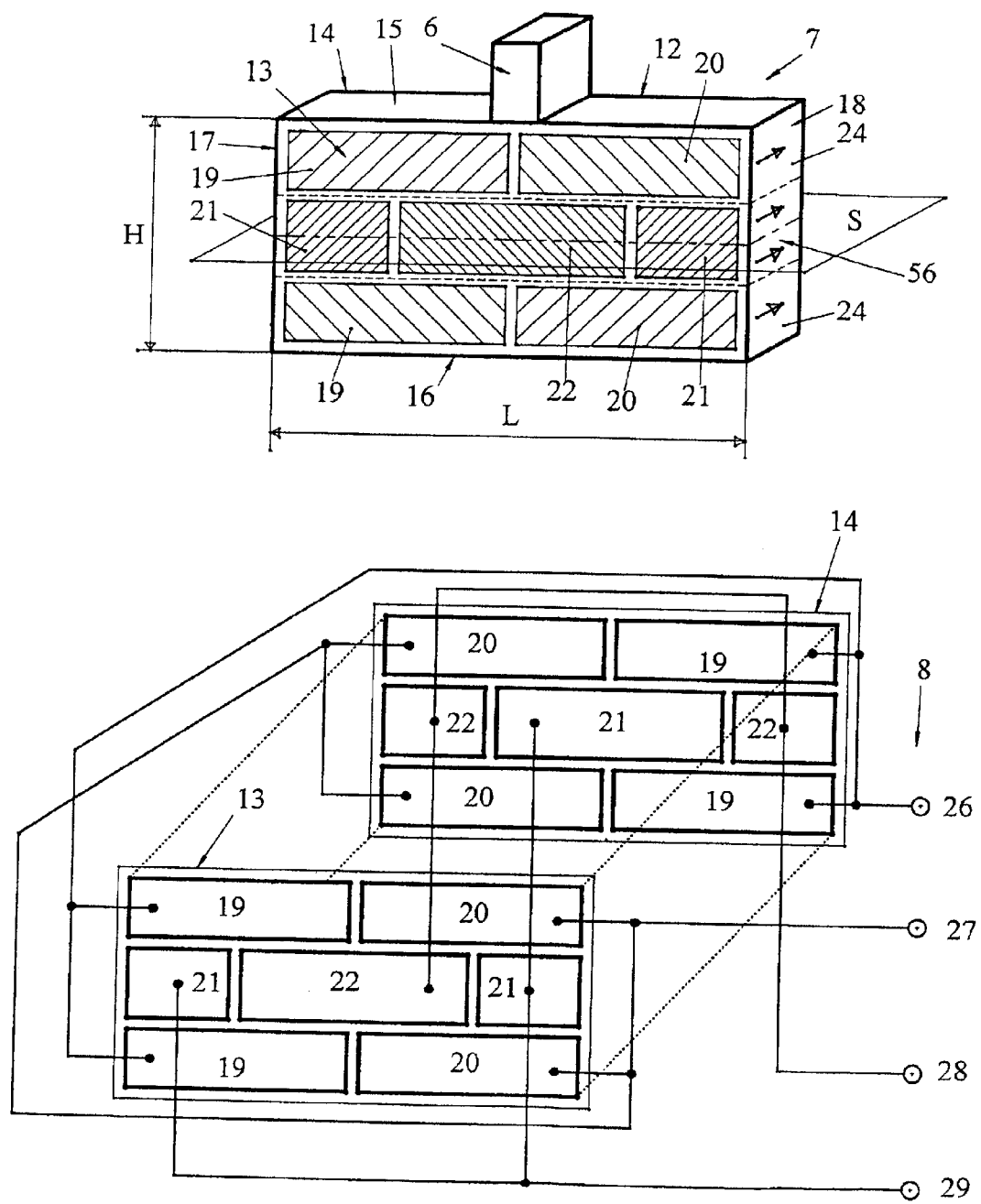
FIG. 11 is a construction variant of the oscillator with excitation of a longitudinal wave with variable preceding sign.

FIG. 11 is a representation of the piezoelectric oscillator 7, including the generator 56 that generates along its resonant length L a standing acoustic wave with variable preceding sign, which, in turn, expands along its resonant height H. The bottom part of FIG. 11 shows a configuration variant of the electrodes 19, 20 and 21, 22 of the generators 24, 25, of the way they are arranged on the main surfaces 13, 14 of the oscillator 7 and of their electric wiring with the connections 26, 27 and 28, 29.

Figure 12:
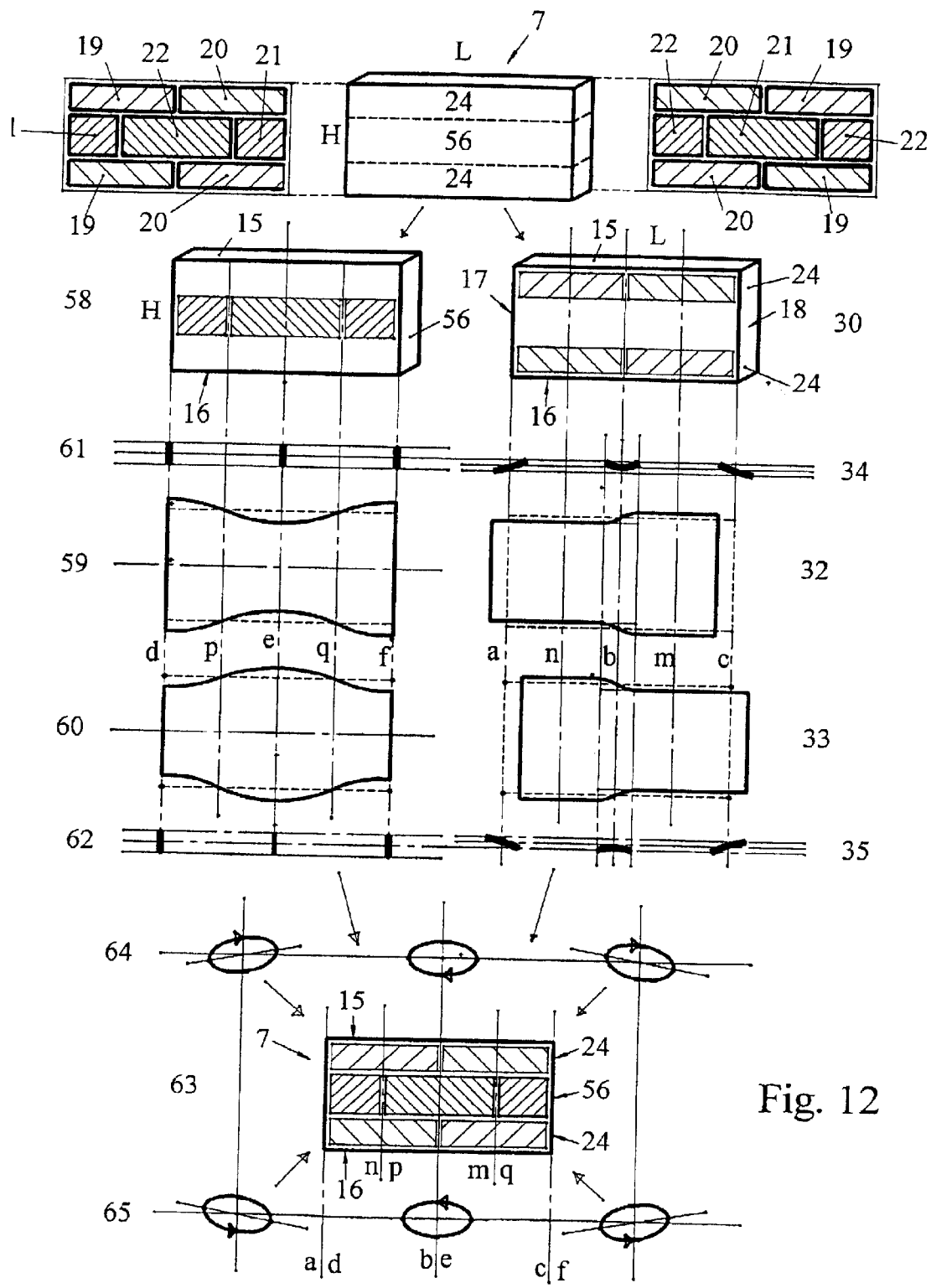
FIG. 12 shows the functioning of an oscillator with excitation of a wave with variable preceding sign.

FIG. 12 explains the way the oscillator 7 functions with the generator of the acoustic wave 56. The generator 56 excites an acoustic longitudinal wave in the oscillator 7 that expands along the latter's resonant height H and that has a variable preceding sign along its resonant length L.

To explain how it functions, inventors are relying on the principle of the independent excitation of acoustic waves in the oscillator 7. The oscillator shown in pos. 30, FIG. 12 contains only the generator 24, and the oscillator shown in pos. 58 contain only the generator 56. When the generator 24 is excited, the oscillator depicted in pos. 30 has the oscillation forms that are seen in pos. 32, 33. The points that are located on its side surfaces 15, 16 along the axes a, b, c are in maximum rate of vibration, and they move along the longitudinal paths that are indicated in pos. 34, 35. The points that are located on its side surfaces along the axes n, m are in minimum rate of vibration and have only a small transverse amplitude of vibrations.

When the generator 56 is excited, the oscillator depicted in pos. 58 has the oscillation forms that are seen in pos. 59, 60. In this instance, the points that are located on its side surfaces 15, 16 along the axes d, e, f move along the transverse paths that are shown in pos. 61, 62.

In this case, the acoustic wave produced by the generator 56 has a variable preceding sign along the resonant length L of the oscillator. For a wave of this kind, the preceding deformation sign of the side surfaces 15, 16 changes along the resonant length L.

The points that are located on its side surfaces 15, 16 along the axes p, q are in minimum rate of vibration and execute virtually no vibrations. When the two generators 24, 56, which are part of the same oscillator 7, are excited simultaneously (refer to pos. 63), the result is a movement overlap of the points that are located on the surface 15, 16 along the axes ad, be and cf. Consequently, the points that are located along these axes move longitudinally along the closed paths that are represented in pos. 64, 65. As a first approximation, the form of these movement paths can be described as elliptical.

Due to the fact that the acoustically standing wave that expands along the height H of the oscillator 7 changes the preceding deformation sign along the resonant length L, the movement of all points that are located in the maximum rate of vibration occurs in the same direction. In this instance, it is possible to set up the friction elements 6 on the side surfaces 15, 16 in all maximum rate of vibration of an acoustic wave that expands along the resonant length L of the oscillator 7. Points that are located along the axes np, mq do not vibrate. They are well suited for the purpose of attaching fastening elements 10.

Figure 13:
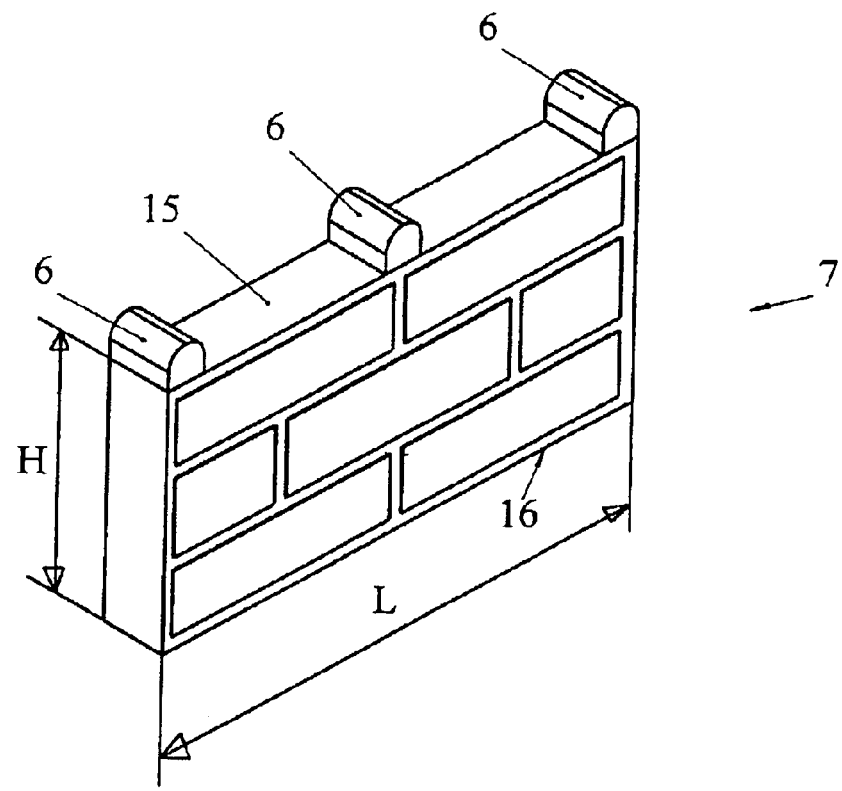
FIG. 13 illustrates oscillator variants with a resonant length of $L=\lambda$.
Figure 13:
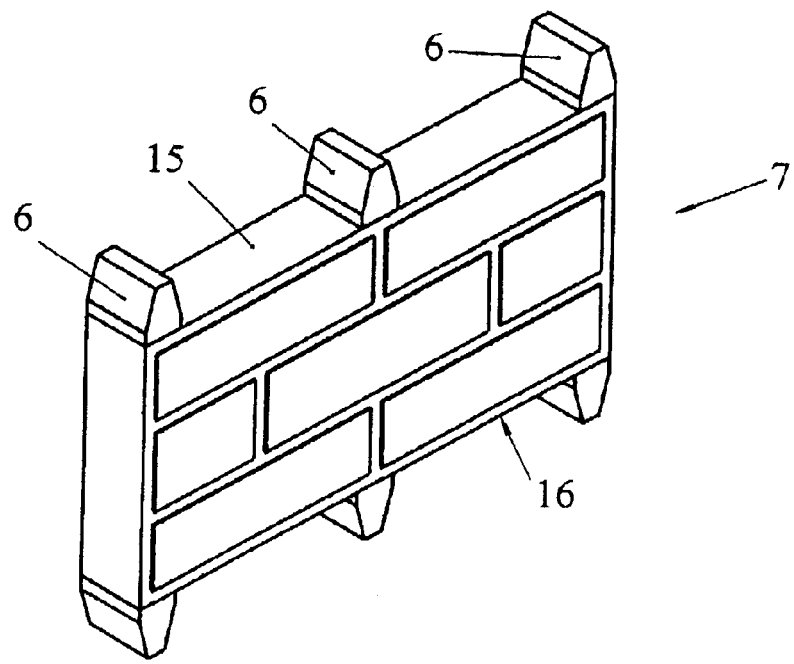

FIG. 13 shows two construction variants of the oscillator 7, with the resonant length L being equal to $\lambda$, including the friction elements 6 that are arranged on one side surface 15 and on two side surfaces 15, 16.

Figure 14:
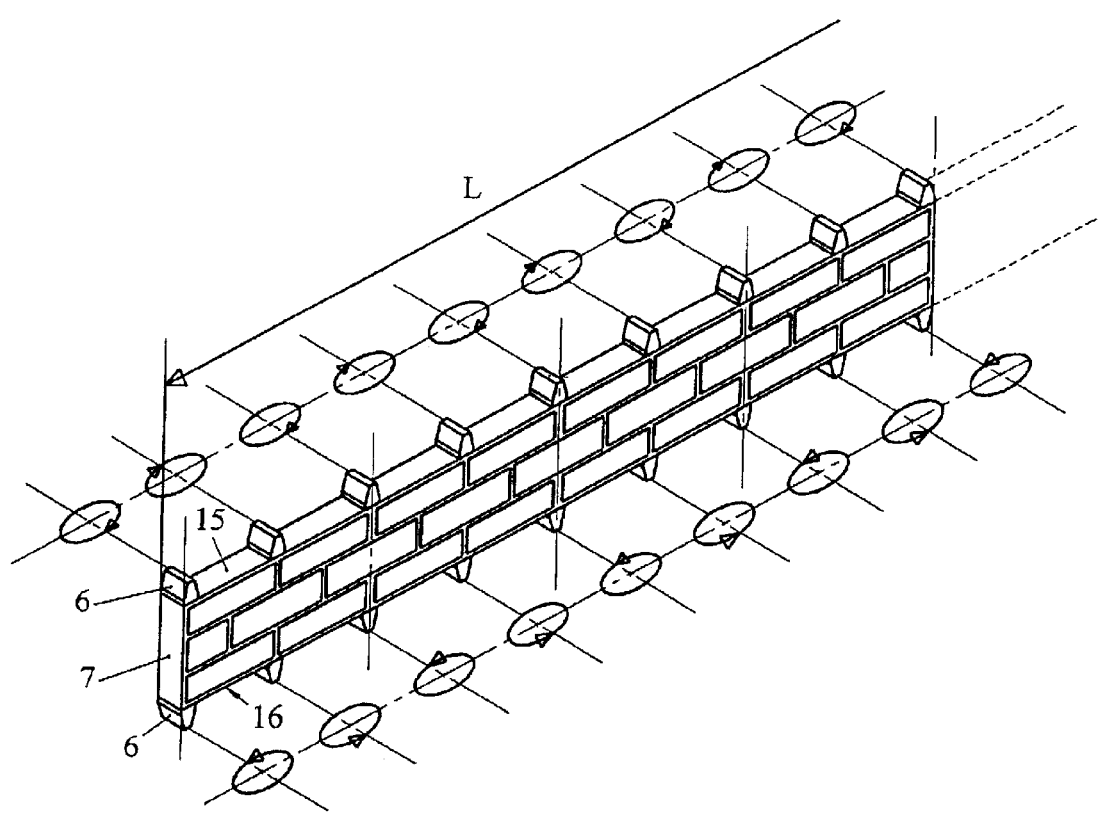
FIG. 14 illustrates oscillator variants with a resonant length of $L=n\lambda$.

FIG. 14 depicts a construction variant of a piezoelectric oscillator 7 whose resonant length L is an integral multiple of $\lambda$.

Figure 15:
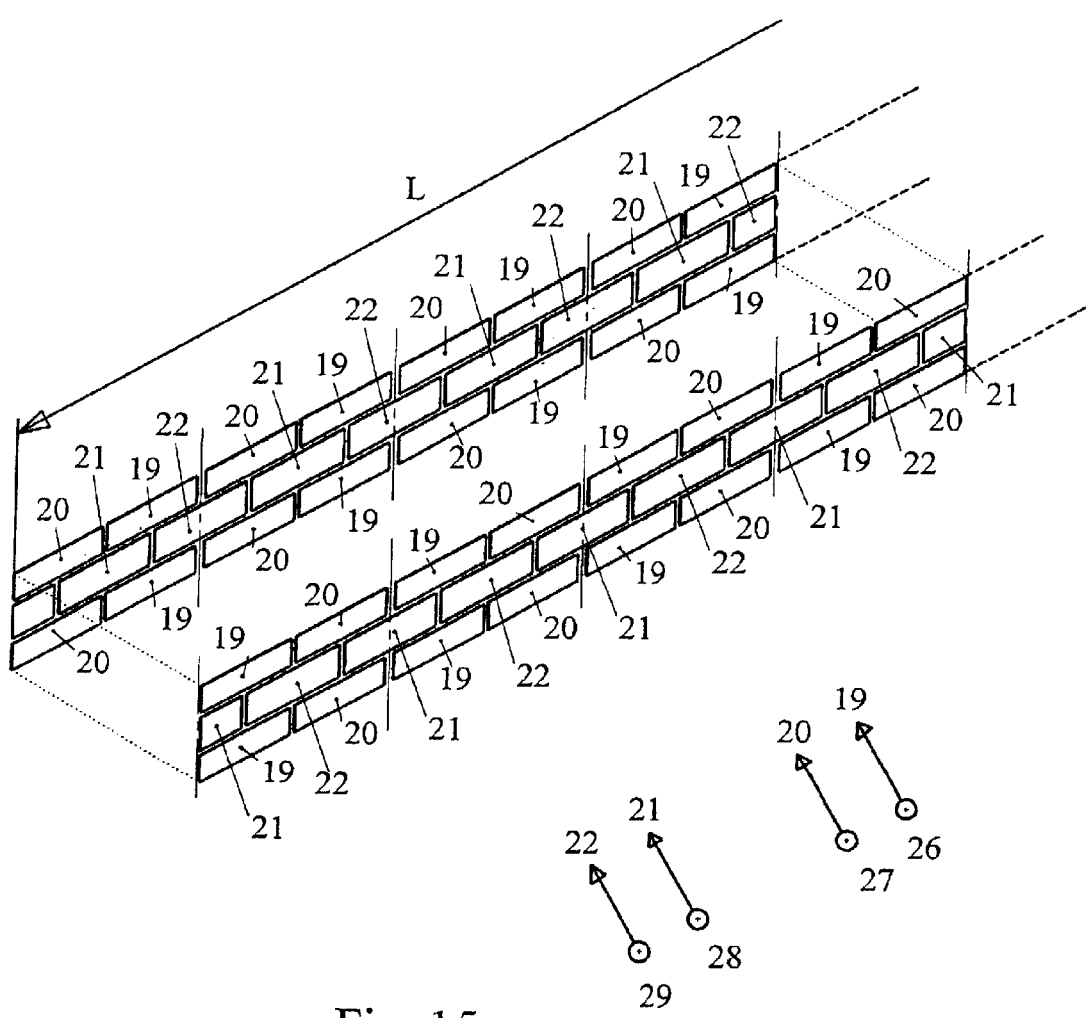
FIG. 15 shows electrode configurations of an oscillator with a resonant length of $L=\lambda$.

FIG. 15 discloses an arrangement of electrodes 19, 20, 21, 22 and of their electric wiring, with the connections 26, 27, 28, 29 for an oscillator 7 whose [resonant] length [L] is an integral multiple of $\lambda$.

Figure 16:
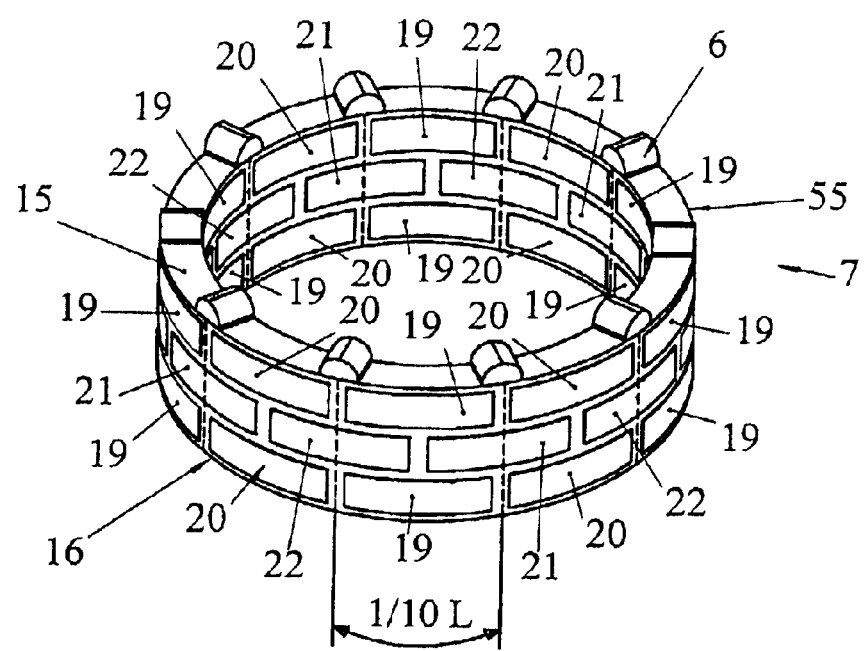
FIG. 16 illustrates oscillator variant in the form of a cylinder with a resonant length of $L=5\lambda$.

FIG. 16 shows the oscillator 7 in the form of a cylinder 55 whose resonant length L is 5$\lambda$.

Figure 17:
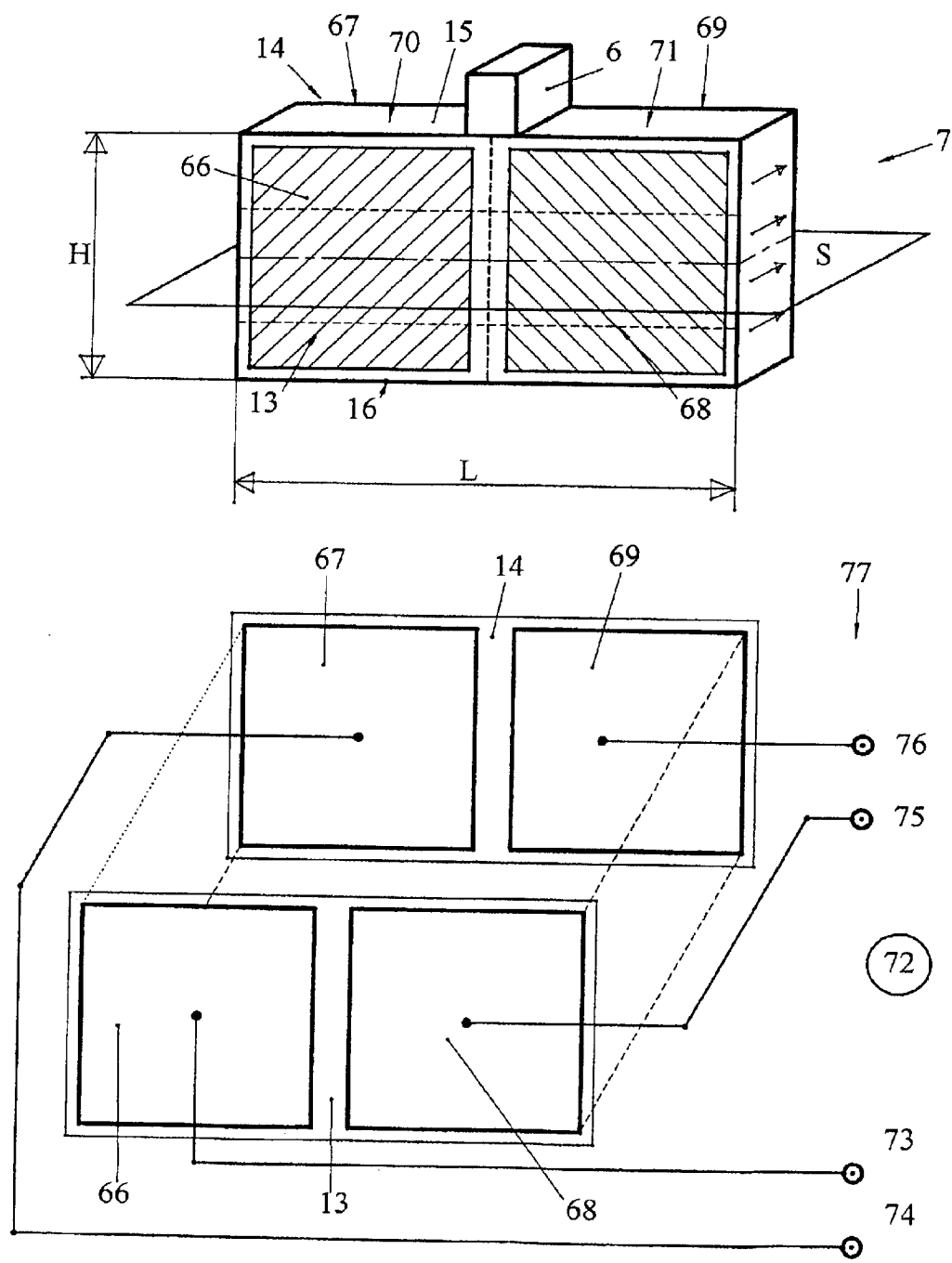
FIG. 17 illustrates oscillator variant with composite generators of acoustic waves.

FIG. 17 depicts a construction variant of the oscillator 7 whose electrodes 19 (refer to FIG. 2), which are part of the surface 13, are joined with a part of the electrode 21, and, in conjunction, they form the first combined electrode 66. The electrodes 20, which are part of the surface 14, are joined with a part of the electrode 22, and, in conjunction, they form the second combined electrode 67. The electrodes 20, which are part of the surface 13, are joined with a part of the electrode 21, and, in conjunction, they form the third combined electrode 68. The electrodes 19, which are part of the surface 14, are joined with a part of the electrode 22, and, in conjunction, they form the forth combined electrode 69. The group of the combined electrodes 66, 67, including the piezoelectric ceramic that is arranged between them, constitutes the first composite generator 70 of acoustic waves, and the group of the combined electrodes 68, 69, including the piezoelectric ceramic that is arranged between them, constitutes the second composite generator 70 of acoustic waves.

FIG. 17 pos. 72 shows a configuration variant of the combined electrodes 66, 67, 68, 69 and of x their arrangement on the surfaces 13, 14 of the oscillator 7. For purposes of the electric wiring of the combined electrodes with the electric excitation source 9, the electrodes are equipped with the connections 73, 74, 75, 76, and, in conjunction, they constitute the group of electrodes 77.

Figure 18:
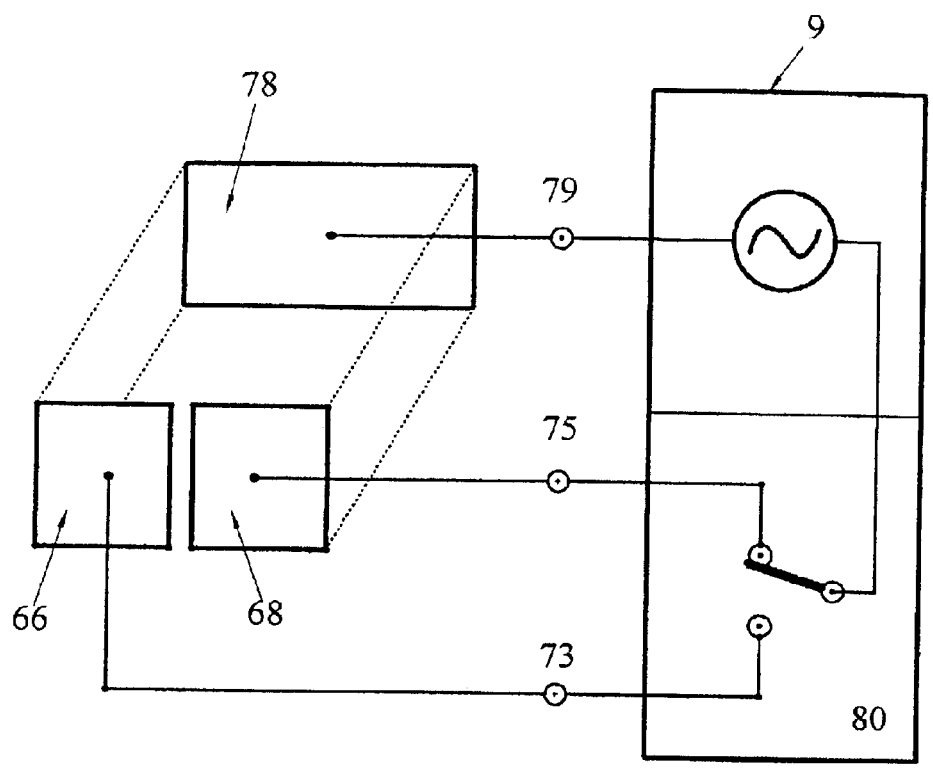
FIG. 18 shows electrode configurations of an oscillator with composite generators of acoustic waves.

FIG. 18 depicts the electrode configuration of the oscillator 7 in which two combined electrodes 67, 69 are connected to each other and form, in conjunction, a joint electrode 78 that is connected to the connection 79. In a motor variant of this kind, it is possible to equip the electric excitation source 9 with an electrode commutator 80.

Figure 19:
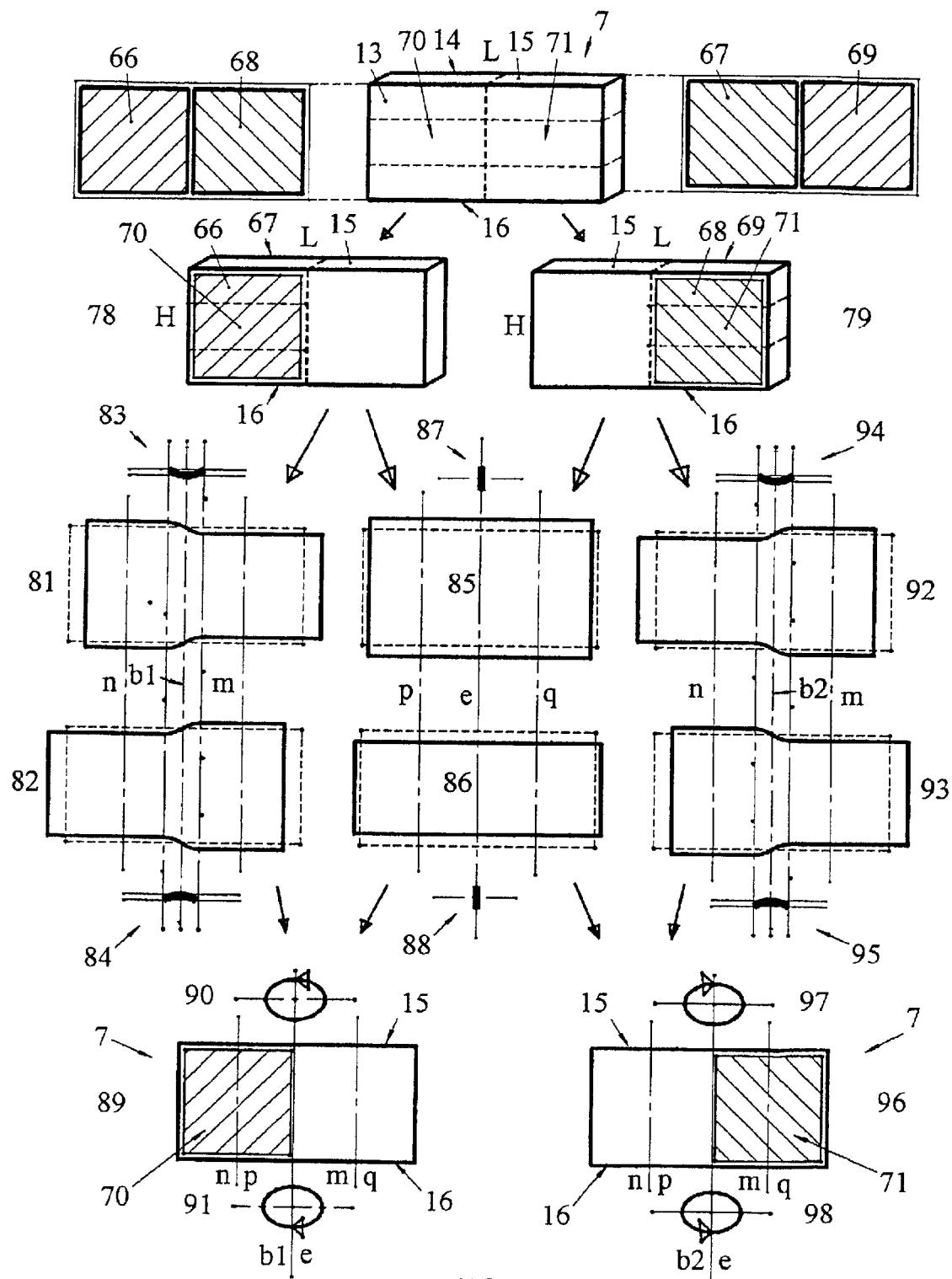
FIG. 19 shows functioning of an oscillator with composite generators of acoustic waves.

FIG. 19 explains how the oscillator 7 with the composite generators of acoustic waves 70, 71 functions. The pos. 78, FIG. 19 represents an oscillator with a generator of acoustic waves 70 that is located in the left part of the oscillator.

When this generator is excited, a standing acoustic wave is generated in the oscillator that expands along the resonance length L. When said wave expands, the oscillator 7 has the oscillation forms represented in pos. 81, 82. The points that are located on the side surfaces 15, 16 along the axis b1 have the movement paths shown in pos. 83, 84.

Also, when the generator 70 is excited, an acoustic longitudinal wave is generated in the oscillator represented in pos. 78 that expands along the resonant height H. When said wave expands, the oscillator 7 has the oscillation forms represented in pos. 85, 86. The points that are located on the side surfaces 15, 16 along the axis e have the movement paths shown in pos. 87, 88.

Due to the fact that these waves expand simultaneously in the oscillator, a movement overlap of the points located on the surfaces 15, 16 along the axes b1e occurs, which is represented in pos. 89. Consequently, as a result, these points move along the closed paths that are seen in pos. 90, 91, as indicated with the arrows.

The pos. 79 shows an oscillator in which the composite generator of acoustic waves is located in the right part of the oscillator. When this generator is excited, an acoustic longitudinal wave is generated in the oscillator that expands along the resonant length L. The oscillation phase of this wave is displaced by 180° with regard to the same wave produced by a composite generator 70. When the generator 71 is excited, the oscillator has the oscillation forms as shown in pos. 92, 93, and the points of the surfaces 15, 16 that are located along the axis b2 move along the movement paths, as represented in pos. 94, 95.

In addition, when the generator 71 is excited, an acoustic longitudinal wave is generated in the oscillator 7 that expands along the resonant height H. The oscillation phase of this wave is in phase with the wave produced by the generator 70.

The pos. 96 demonstrates a movement overlap of the points that are located on the surfaces 15, 16 along the axis b2e, which is the result of the expansion of the two waves in the oscillator 7 that were produced by the generator 71. The movement paths of these points are seen in pos. 97, 98. In this instance, the points have an opposite direction of the movement when compared with the excitation of the generator 70.

In both cases the movement paths are represented in pos. 90, 91 and 97, 98 and, in a first approximation, they can be described as elliptical.

Places on the surfaces 15, 16 along the axes b1, b2 are the attachment points for the friction elements 6. Points along the axes np, mq on the surfaces 15, 16 are located in minimum rate of vibration of the wave that expands along the resonant length L of the oscillator 7 and are optimally suited for attaching the fastening elements 10.

Figure 20:
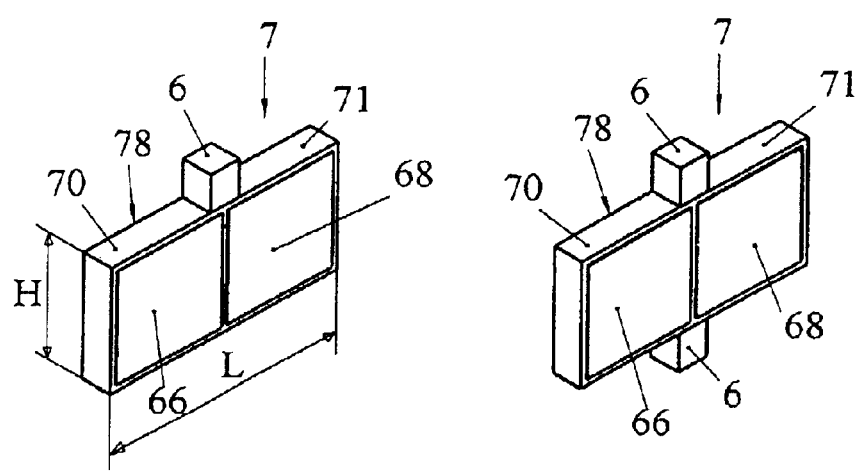
FIG. 20 illustrates oscillator variants with a resonant length of $L=\lambda$.

FIG. 20 shows two oscillators 7 including the generators 70, 71 whose resonant length L is equal to $\lambda$.

Figure 21:
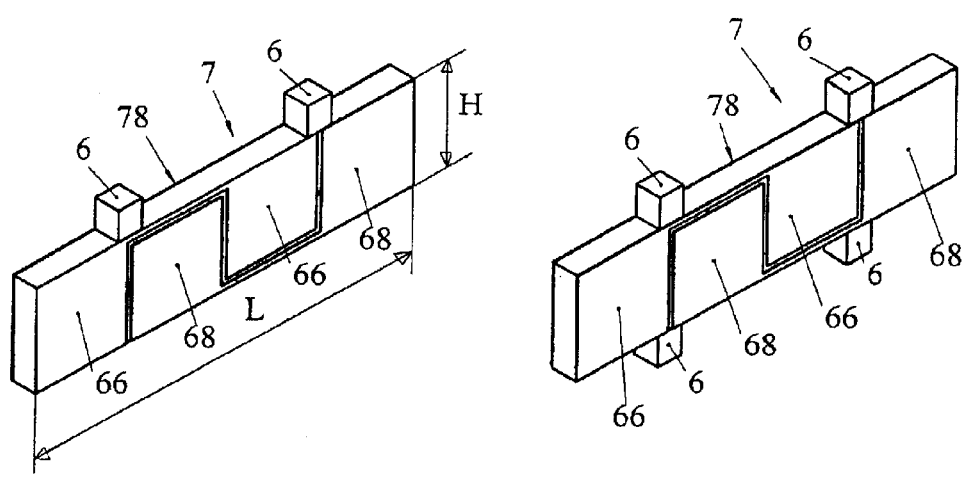
FIG. 21 illustrates oscillator variants with a resonant length of $L=2\lambda$.
Figure 22:
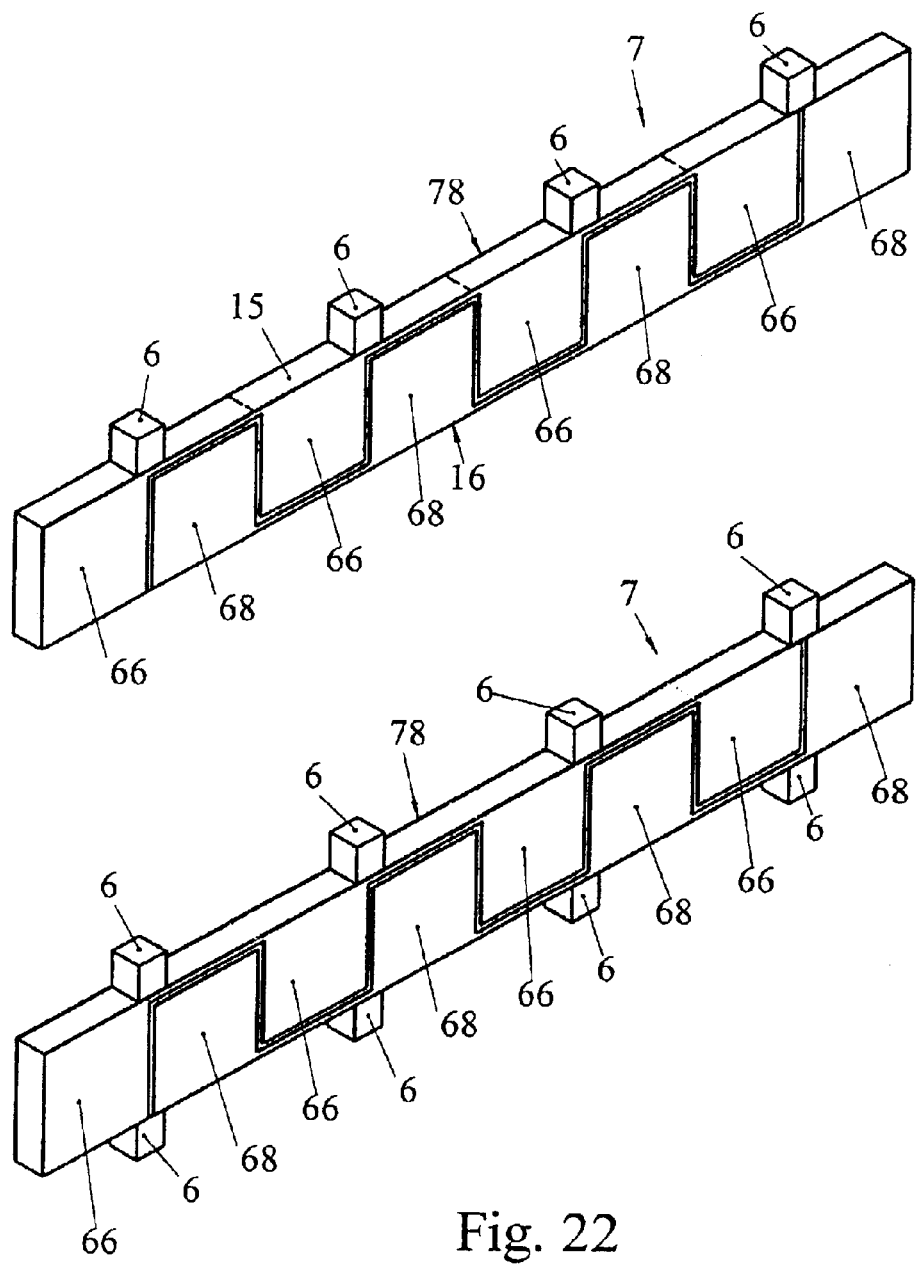
FIG. 22 illustrates oscillator variants with a resonant length of $L=4\lambda$.

The oscillators 7 seen in FIG. 21 have a resonant length L that is equal to $2\lambda$. The oscillators 7 seen in FIG. 22 have a resonant length L that is equal to $4\lambda$.

Figure 23:
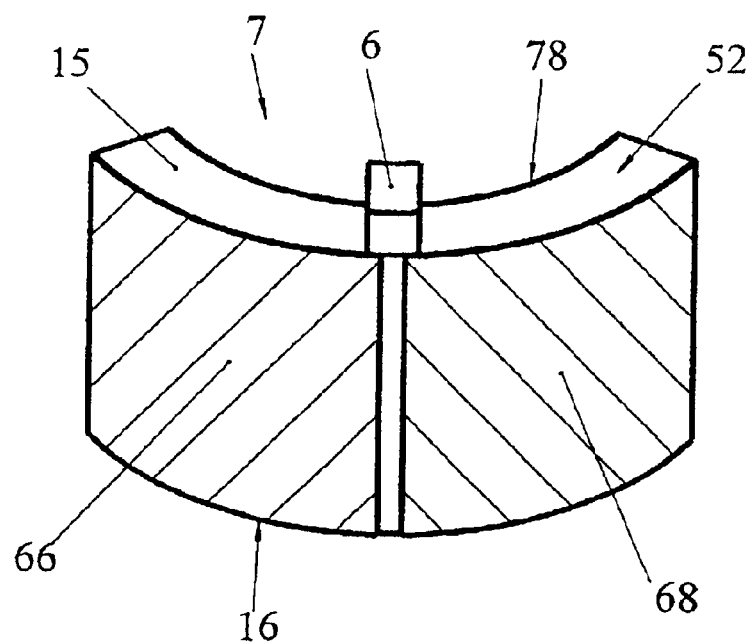
FIG. 23 illustrates oscillator variant with composite generators of acoustic waves in the form of a cylinder part.

FIG. 23 shows the oscillator 7 in the form of the cylinder part 52 with a resonant length L that is equal to $\lambda$.

Figure 24:
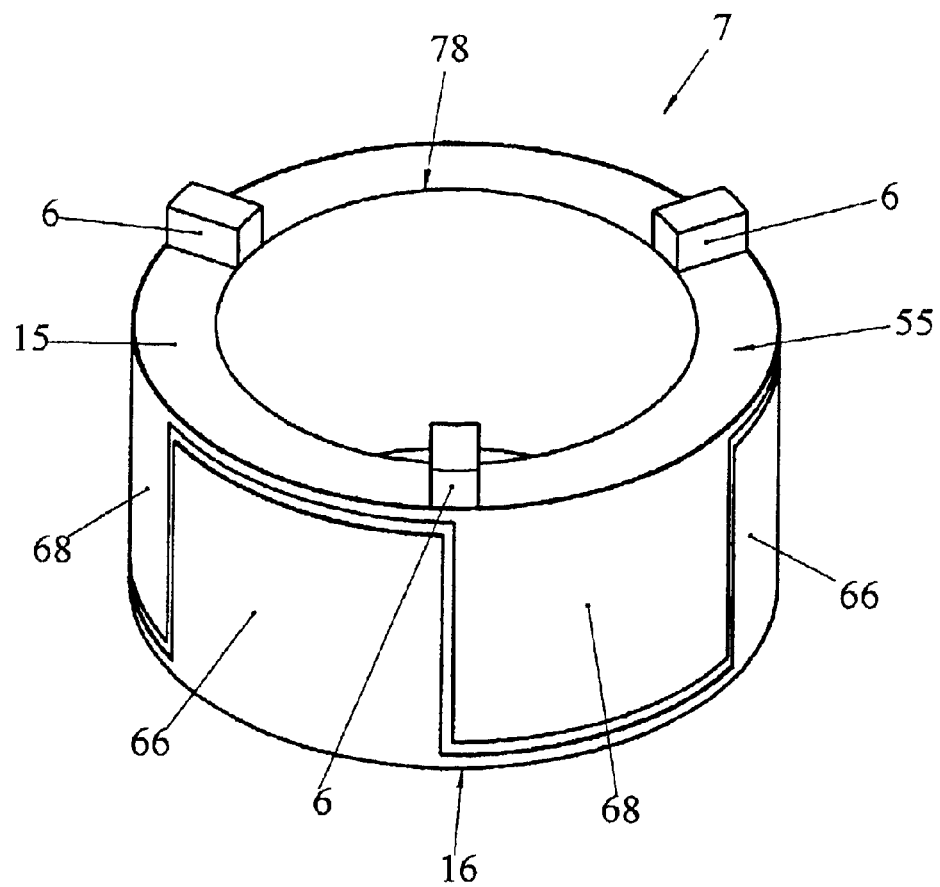
FIG. 24 illustrates oscillator variants with composite generators of acoustic waves in the form of a cylinder.

FIG. 24 shows the oscillator 7 in the form of the cylinder 55 with a resonant length L that is equal to $3\lambda$.

Figure 25:
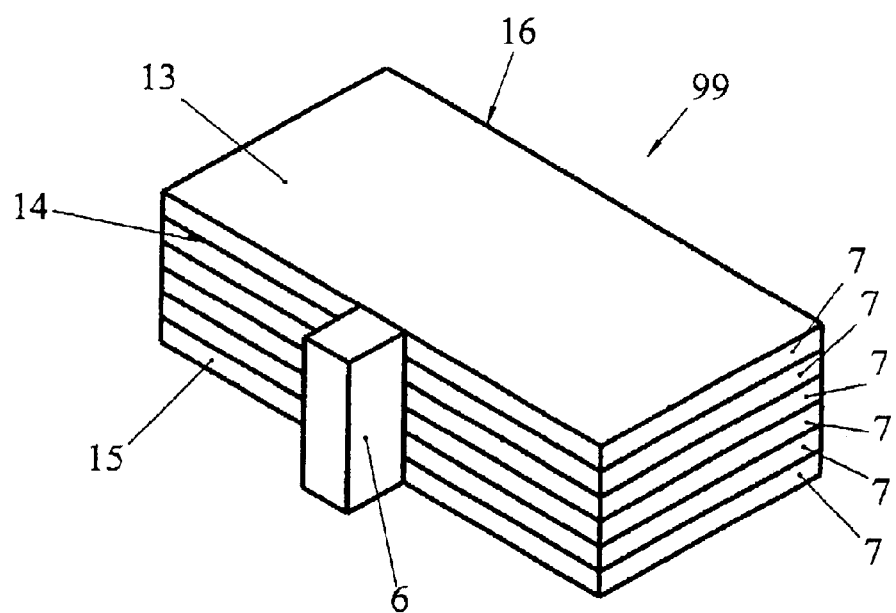
FIG. 25 illustrates oscillator variant in the form of a whole electro-mechanical resonator.

FIG. 25 depicts a piezoelectric oscillator comprised of two or several oscillators 7 that are connected to each other in such a way that they form a joint electro-mechanical resonator 99. A connection of this type can be achieved using a solid organic bonding agent, e.g. an epoxy-resin-based bonding agent, or by way of sintering.

Figure 26:
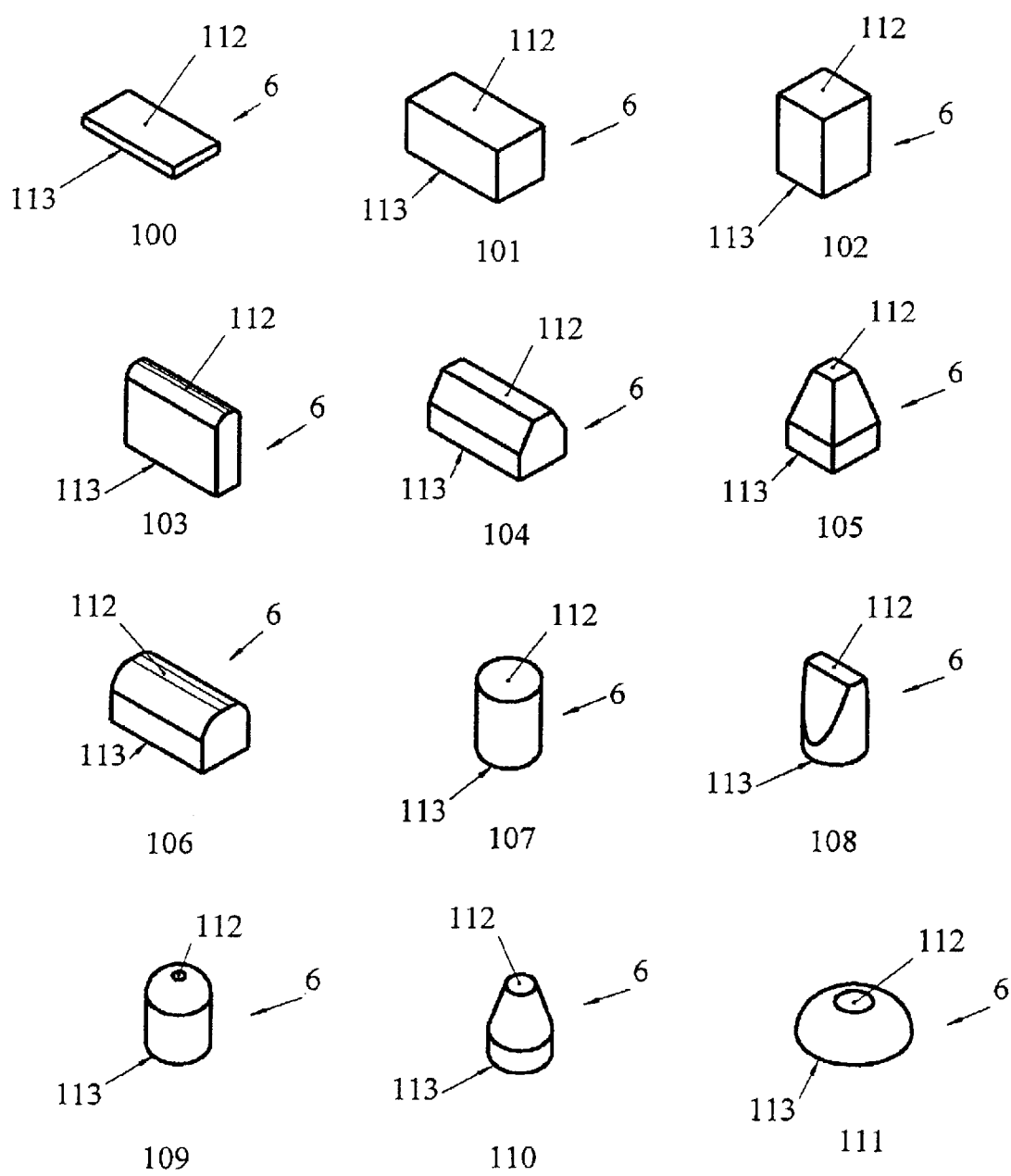
FIG. 26 illustrates variants of friction elements.

FIG. 26 shows possible construction variants of the oscillator 7. The friction elements can be manufactured as strips 100, as small rods or a prisms 101, 102, 103, as pyramid-shaped elements 104, 105, as semi-spherical elements 106, as cylindrical elements 107, 108, 109, as conical elements 110 or as semi-spherical elements 111. Each friction element 6 has the functional surface 112, which it uses to establish a friction contact with the friction layer 4, and a connecting surface 113, which it uses to establish a connection to the side surface 15 or 16 of the oscillator 7. The friction elements 6 are manufactured of a hard, wear resistant material, e.g. oxide-ceramic, metal-ceramic or their composites with other materials. It is also possible to use special types of hard wear resistant plastics.

Figure 27:
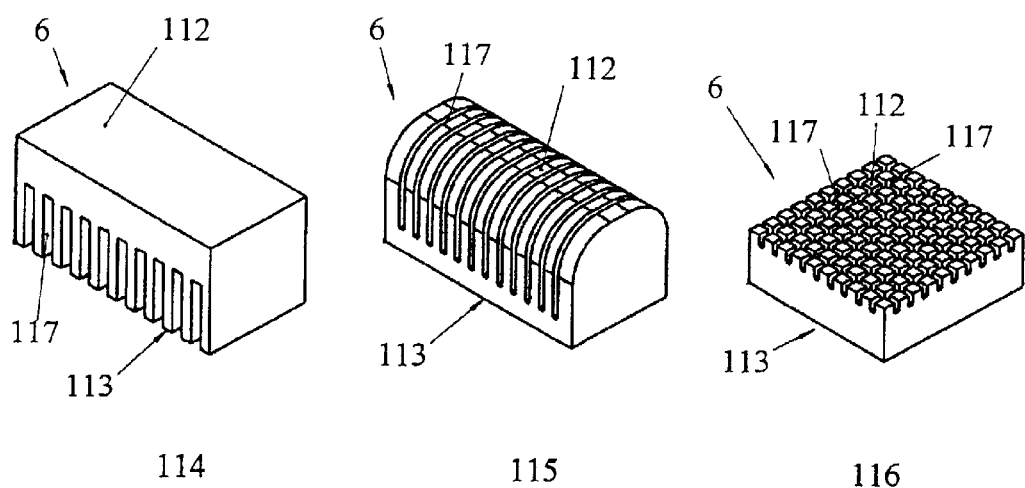
FIG. 27 illustrates variants of friction elements that have transverse grooves.

The pos. 114, 115, 116 in FIG. 27 show friction elements 6 that have transverse grooves 117. The transverse grooves 117 can be installed on the side of the connecting surface 113 pos. 114 or on the side of the functional surface 112 pos. 115. It is also possible to arrange them in a perpendicular manner in relation to each other, as seen in pos. 116.

Figure 28:
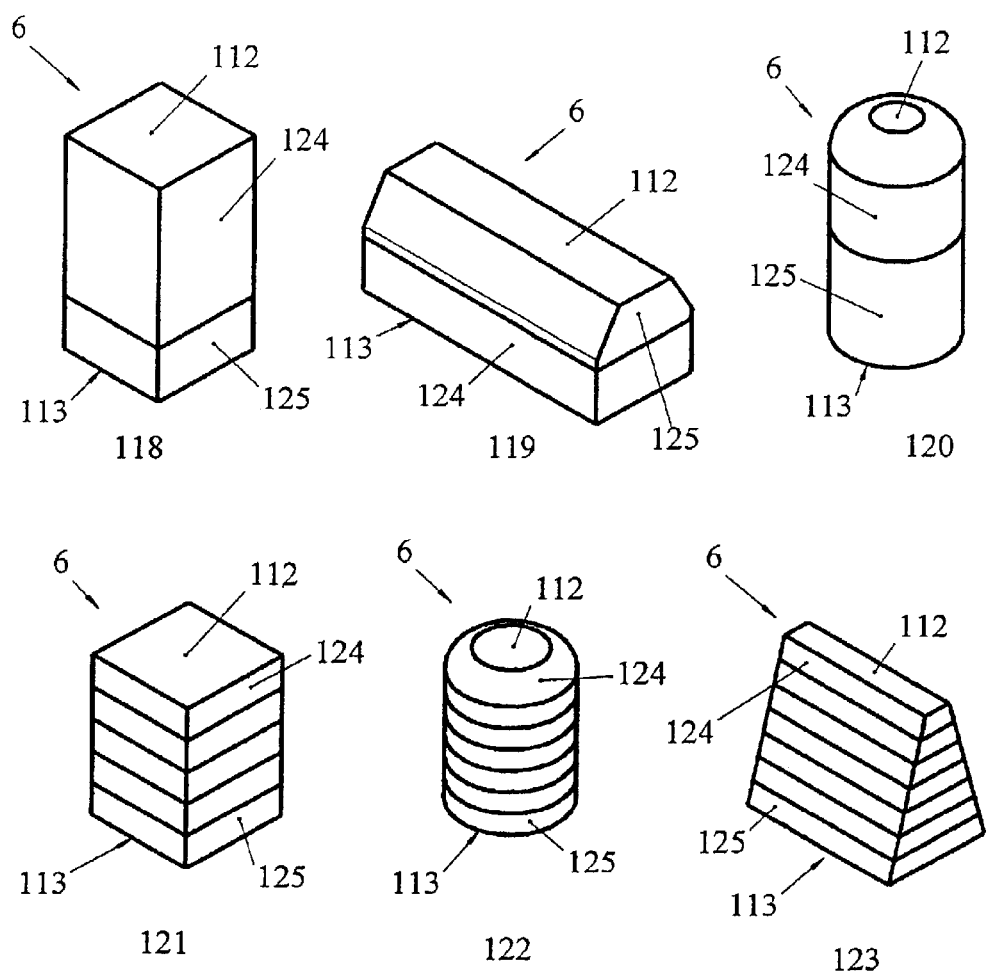
FIG. 28 illustrates variants of friction elements with multiple layers.

The friction elements 6 can have a two-layered or multiple-layered structure, as shown in pos. 118, 119, 120, 121, 122, 123 of FIG. 28. Each layer of this structure is arranged parallel in relation to the side surfaces 15, 16 of the oscillator 7. In this context, the top layer 124 of this structure is a wear resistant layer. It contains the functional surface 112. The bottom layer 125 of this structure is a connecting layer. It contains the connecting surface 113. The layers 124, 125 and the layer located between the two can have different moduli of elasticity. The wear resistant layer 125 can have a modulus of elasticity that is determined on the basis of the capacity of resistance to wear and mechanical solidity of the functional surface 112; and the connecting layer of the friction element can have a modulus of elasticity that is almost equal to the modulus of elasticity of the piezoelectric ceramic of the oscillator 7.

Figure 29:
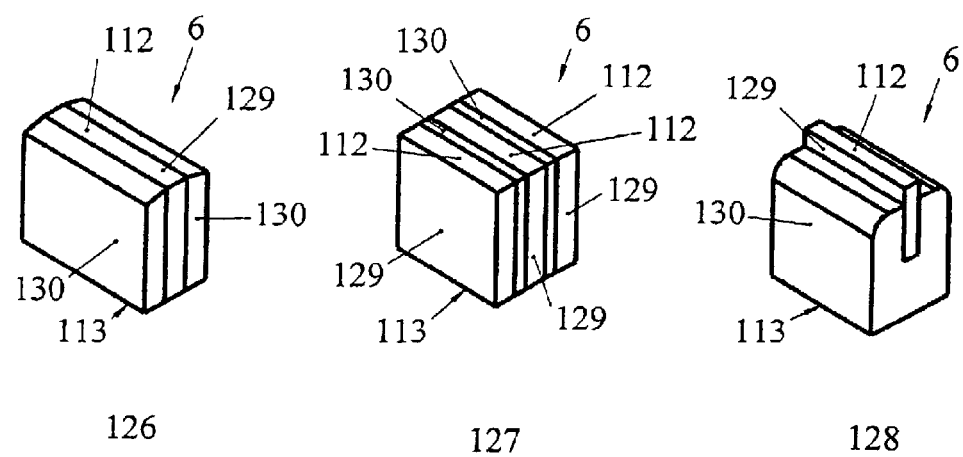
FIG. 29 illustrates variants of friction elements with layers arranged in a perpendicular manner.

The friction elements 6 that are shown in the pos. 126, 127, 128 in FIG. 29 feature the layers 129, 130, which are arranged in a perpendicular manner in relation to the side surfaces 15, 16 of the oscillator 7. In this construction variant of the friction elements, the layers 129 are wear resistant layers, and the layers 130 are dampening layers. The dampening layers ensure a dynamic solidity of the wear resistant layers. The wear resistant layer 129 can have a modulus of elasticity that is characterized by the capacity of resistance to wear and solidity of its functional surface; and the dampening layer 130 can have a modulus of elasticity that is determined based on the dynamic stability of the wear resistant layer 129.

Figure 30:
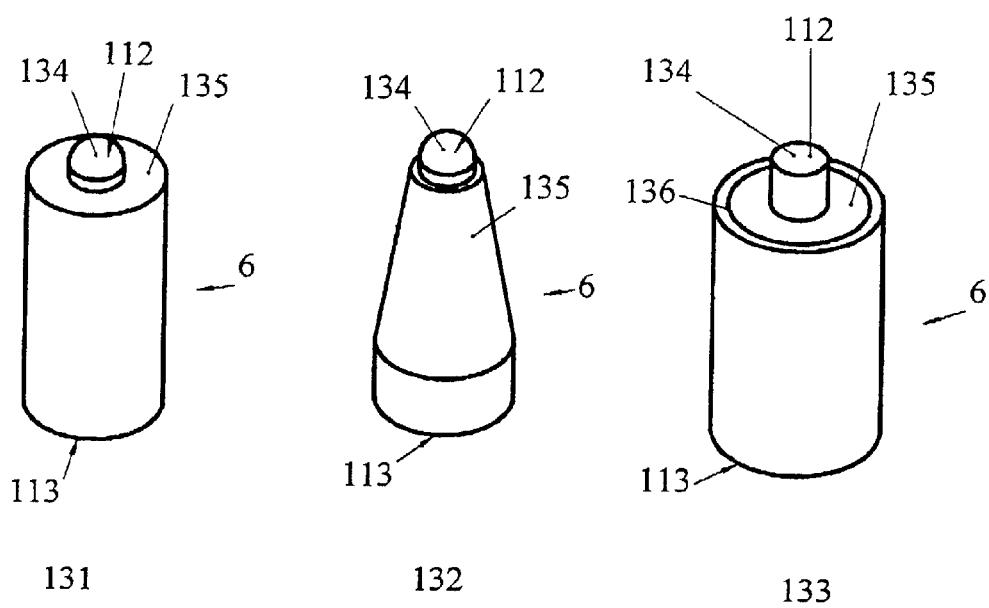
FIG. 30 illustrates variants of friction elements with cylindrical layers.

The friction elements 6 that are depicted in pos. 131, 132, 133 in FIG. 30 are comprised of the cylinder-shaped layers 134, 135, 136. These layers are concentrically arranged. The layer 134 is a friction layer. It contains the functional surface 112. The layer 135 is a dampening layer. It ensures a dynamic stability of the friction layer 134. The layer 136 is a protective layer. The layers 124, 125, the layers arranged between them 129, 130 and the layers 134, 135, 136 can be manufactured of monolithic materials and can be connected to each other by way of e.g. sintering. The connecting layer 125 of a two-layered or multiple-layered structure of the friction elements 6 can be manufactured of a porous material. Moreover, part of the two-layered or multiple-layered structure of the friction elements 6, which are represented in pos. 121, 122, 123 in FIG. 28, can be comprised of a porous material of variable porosity. In this context, the connecting layer 124 can have maximum porosity, while the wear resistant layer 125 is not porous.

Figure 31:
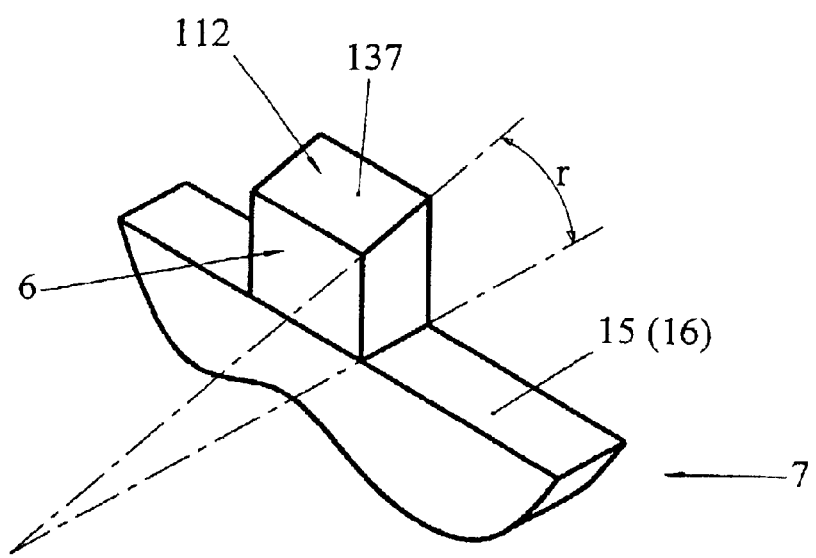
FIG. 31 illustrates friction element with inclined functional surface.

The dampening layers 130, 135 (refer to FIGS. 29, 30) can also be manufactured of a porous material. For the friction element 6 that have a plane functional surface 112, said surface can be realized as an inclined surface 137, as seen in FIG. 31. The inclined functional surface 137 is arranged at an angle r in relation to the side surfaces 15 or 16 to which the friction elements 6 are fastened.

Figure 32:
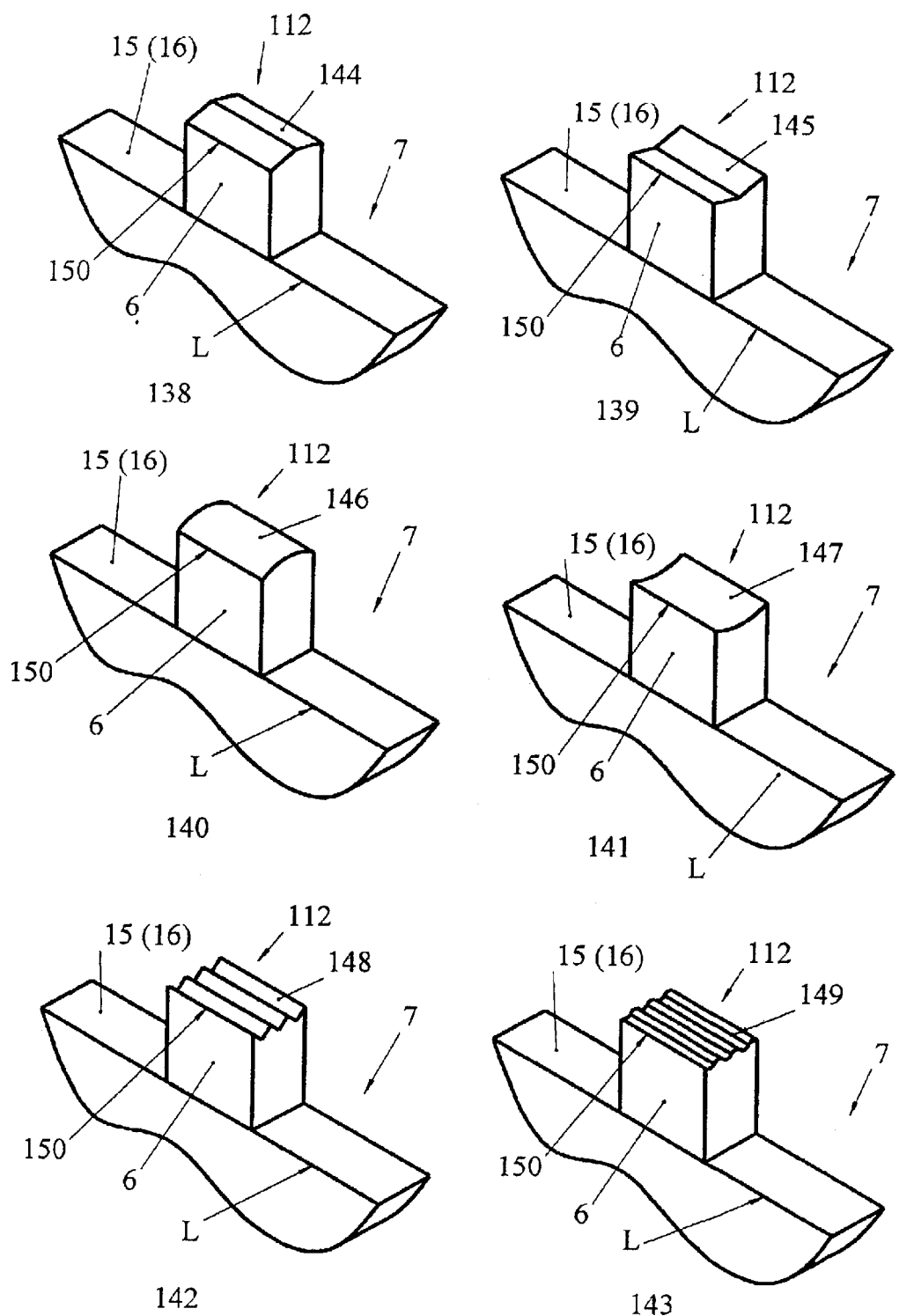
FIG. 32 illustrates variants of friction elements with different types of functional surfaces.

The functional surface 112 of the friction elements 6 can have the form that is shown in FIG. 32 pos. 138, 139, 140, 141, 142, 143. It can have the triangular-concave (143) or triangular-convex (144) form, the round concave (145) or round convex (146) or a rib-shaped (147, 148) form. The ribs or channels 149 of the functional surface 112 are arranged along the resonant length L of the piezoelectric oscillator 7. The functional surface 112 can also have another similar form. The friction elements 6 can be connected to the surfaces 15, 16 of the piezoelectric oscillator 7 using an organic material, e.g. epoxy resin. The friction elements 6 can also be connected to the surface of the piezoelectric oscillator 7 utilizing a material that forms a chemical bond with the piezoelectric ceramic, e.g. by way of lead-containing easily fusible glass. All pores of the friction elements 6 or only a part of the pores of the friction elements 6 can be filled with a material that connects the friction element 6 to the surfaces 15, 16 of the piezoelectric oscillator.

Advantageously, the transverse grooves 17 can be filled with a sound absorbing material.

Figure 33:
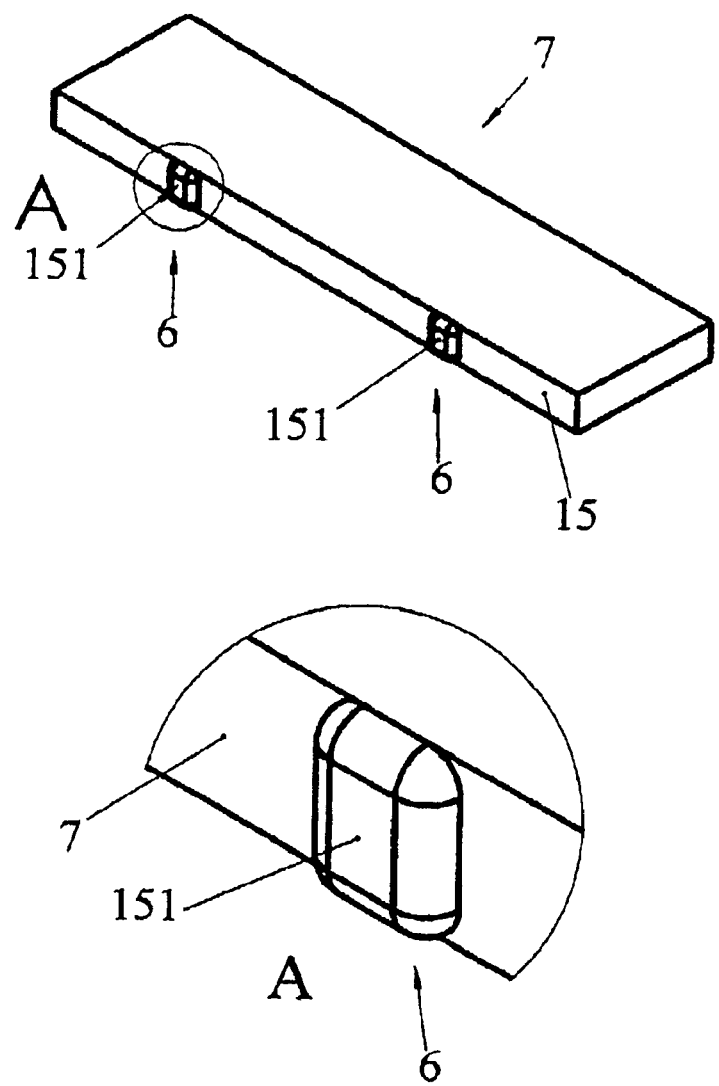
FIG. 33 illustrates friction elements as glass strips.

The friction elements 6 can be manufactured as glass strips 150 that are melted onto the side surfaces 15 or 16 of the piezoelectric oscillator 7, as shown in FIG. 33.

In this context, the friction elements that are manufactured as glass strips 150 can be coated with the powder of a wear resistant material, e.g. powdered aluminum oxide, zirconium oxide, tungsten carbide, titanium carbide or another similar material.

Figure 34:
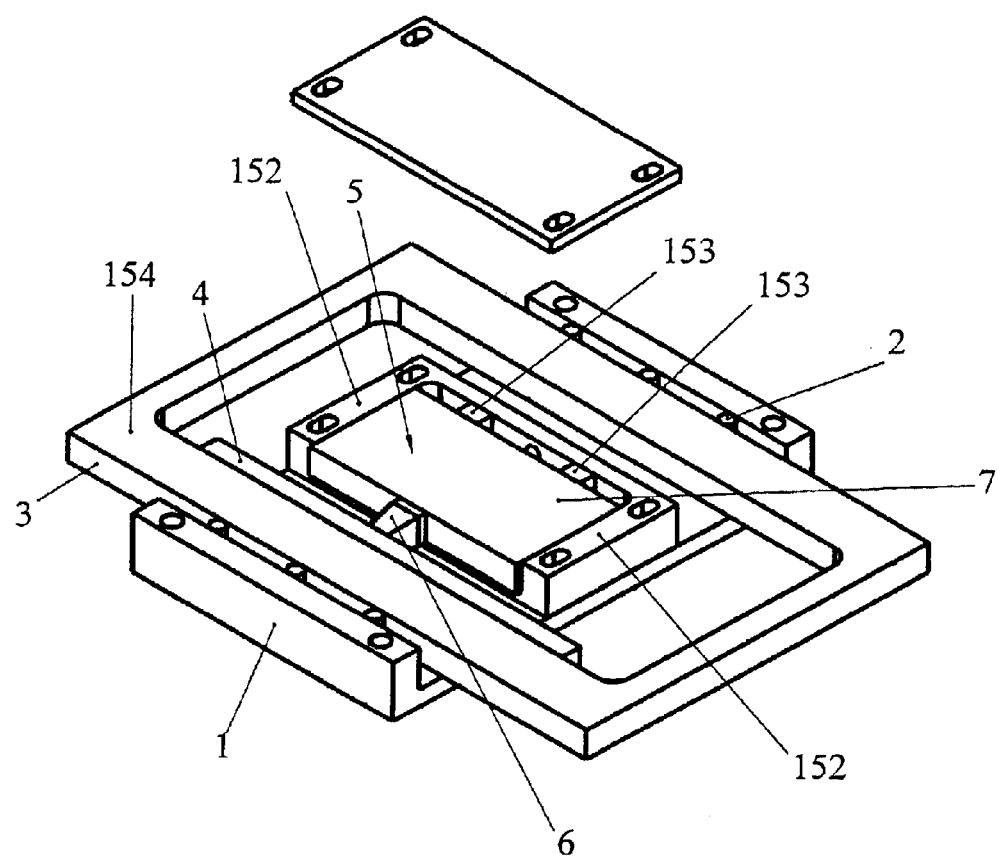
FIG. 34 illustrates a construction variant of the proposed motor.

FIG. 34 shows a piezoelectric motor with special mountings 152 of the piezoelectric oscillator 7 preventing any displacement of the oscillator in the direction of its resonant length L. In this motor variant, the friction element 6 of the oscillator 7 is pressed against the friction layer 4 using the elastic elements 153 that are manufactured as strips made of rubber or another similar materials. For the motor variant addressed here, the driven element 3 is realized as a frame 154 containing the drive element 5.

Figure 35:
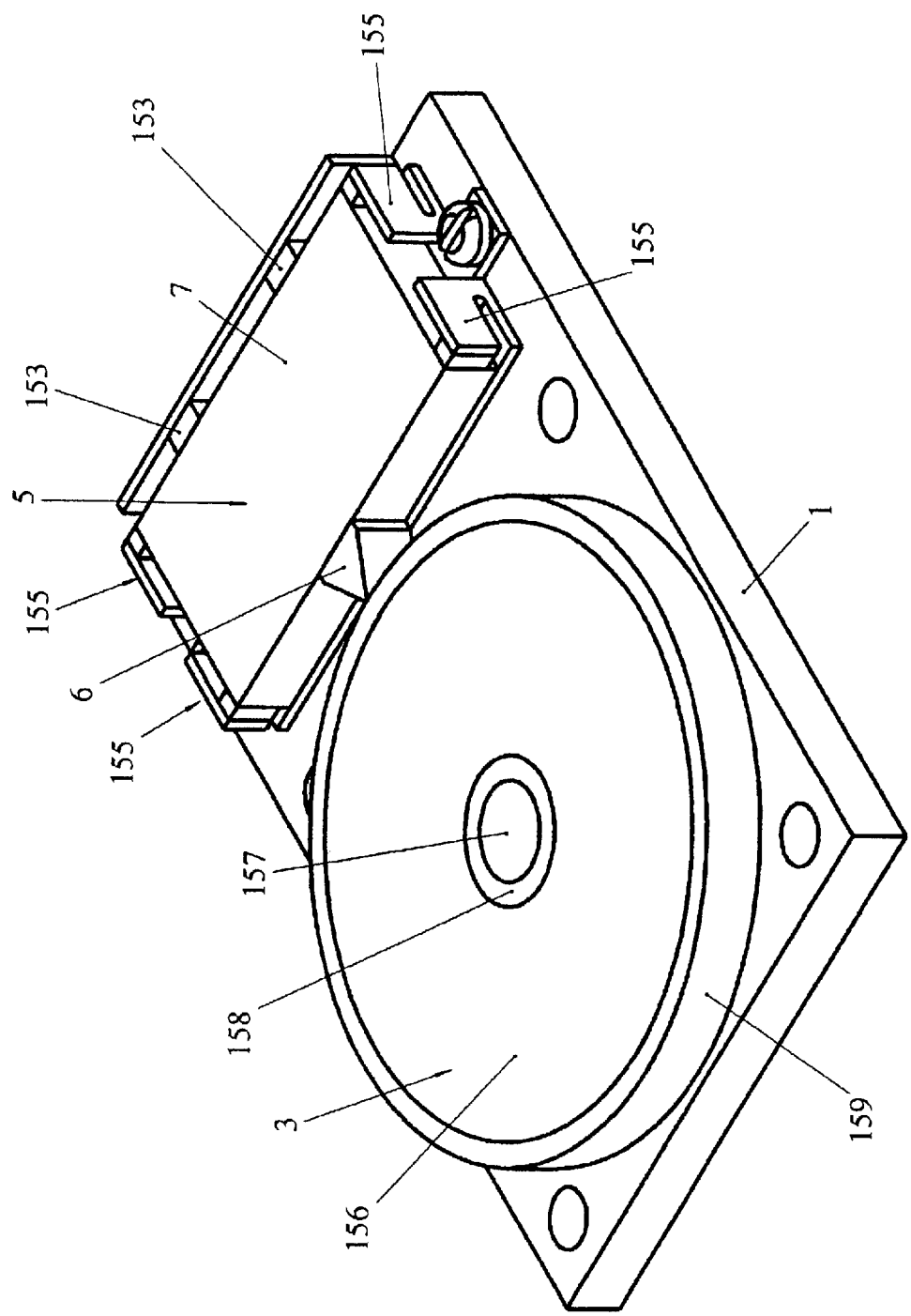
FIG. 35 illustrates another construction variant of the proposed motor.

FIG. 35 shows a construction variant of a piezoelectric motor in which the elements 155 that prevent the oscillator from shifting serve as mechanical resonators whose frequency of resonance corresponds to the oscillation frequency of the piezoelectric oscillator 7. In the motor variant shown in FIG. 35, the driven element 3 can be realized in the form of a cylinder or of a plate 156 that is set up on the shaft 157 in the bearing of the rotational movement 158. In the proposed motor, it is possible to equip the piezoelectric oscillator 7 with at least one fastening element 10 that is rigidly connected to the oscillator.

Figure 36:
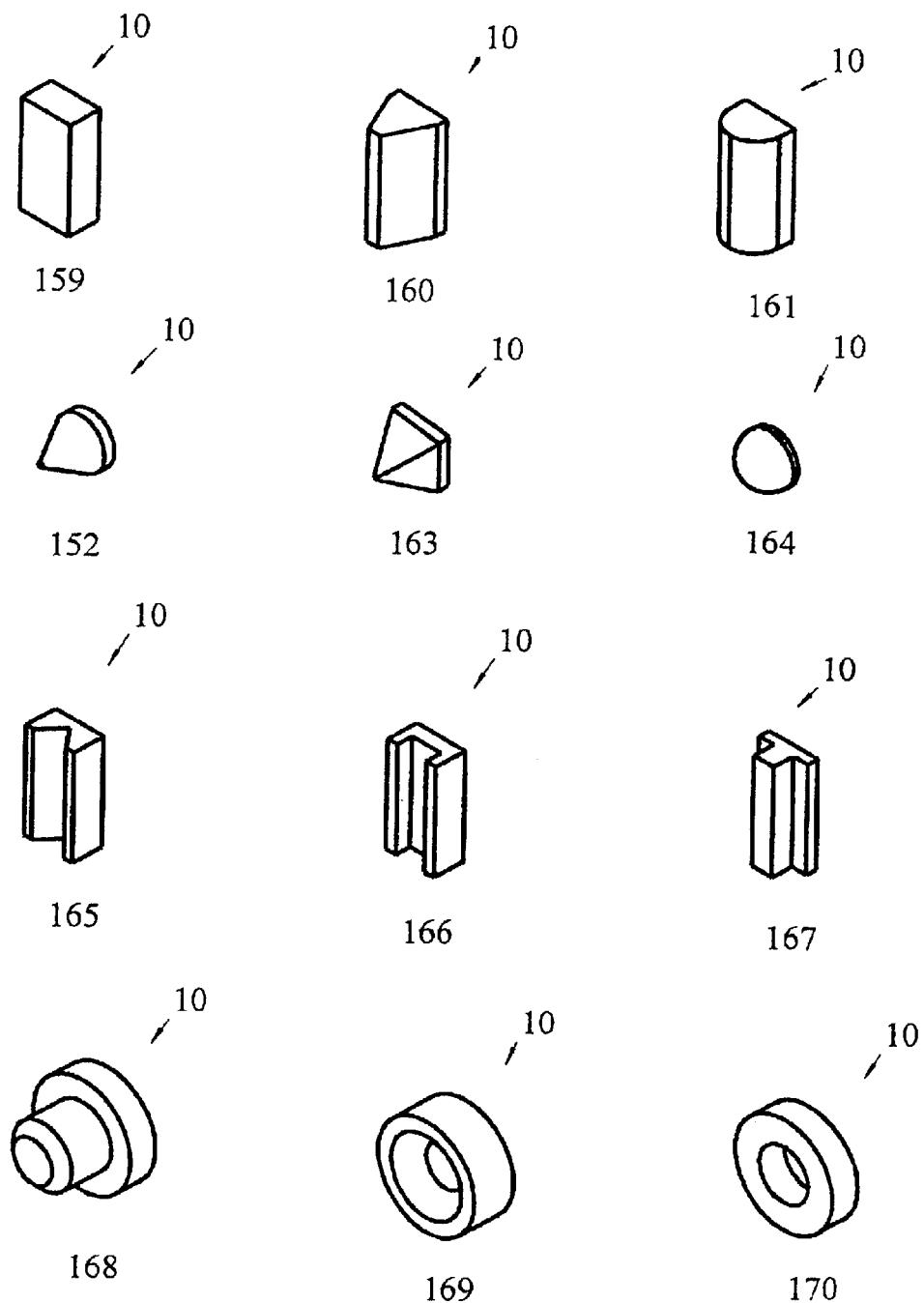
FIG. 36 illustrates variants of the fastening elements.

The construction of the fastening elements 10 is represented in the pos. 159 to 170 in FIG. 36. Accordingly, the fastening elements can be realized in the form of rectangular prisms (159), triangular prisms (160), semi-cylindrical prisms (161), or they can be conical elements (162), pyramid-shaped elements (163), as semi-spherical elements (164), rectangular elements with profile grooves (165) or projecting elements (167) or realized as cylindrical step elements (168), round elements with profile bore holes (169, 170) or other similar elements.

The fastening elements 10 can be manufactured of a material with a modulus of elasticity that is equal to the modulus of elasticity of the piezoelectric ceramics of the piezoelectric oscillator 7, e.g. of oxide ceramics, or somewhat larger. The fastening elements 10 can consists of a material with a modulus of elasticity that is much smaller than the modulus of elasticity of the piezo-ceramic of the piezoelectric oscillator 7, e.g. of special kinds of plastic materials. The fastening elements 10 can be manufactured of the same piezo-ceramic type as the piezoelectric oscillator 7.

Each fastening element 10 or one of its parts can be manufactured of a porous material.

The fastening elements 10 can be connected to the side surfaces 15, 16 of the piezoelectric oscillator 7 using a rigid organic material, e.g. an epoxy-resin-based bonding agent.

Figure 37:
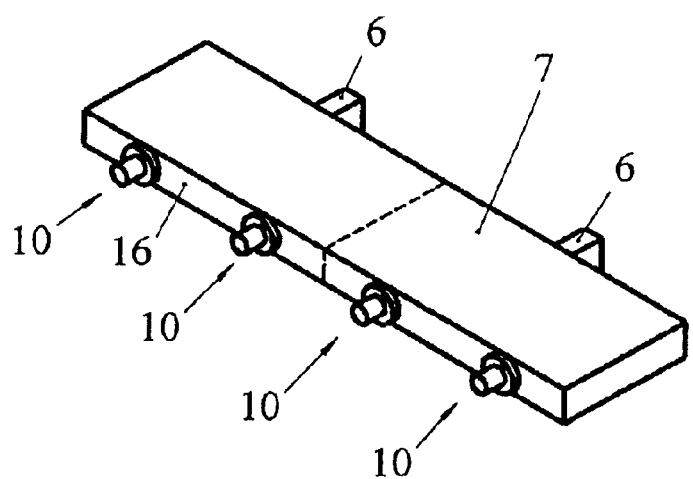
FIG. 37 illustrates attachment variant of fastening elements.

The fastening elements 10 can be connected to the side surfaces 15, 16 of the piezoelectric oscillator 7 by way of a material that forms a chemical bond with the piezoelectric ceramic or with one of the intermediate layers applied to the side surfaces 15, 16 and with the material of the fastening element, e.g. by way of a lead-containing easily fusible glass. As an example, FIG. 37 shows the piezoelectric oscillator 7 with the fastening elements 10 installed, which are realized in the form of cylindrical step-shaped elements, as represented in pos. 168 in FIG. 35.

Figure 38:
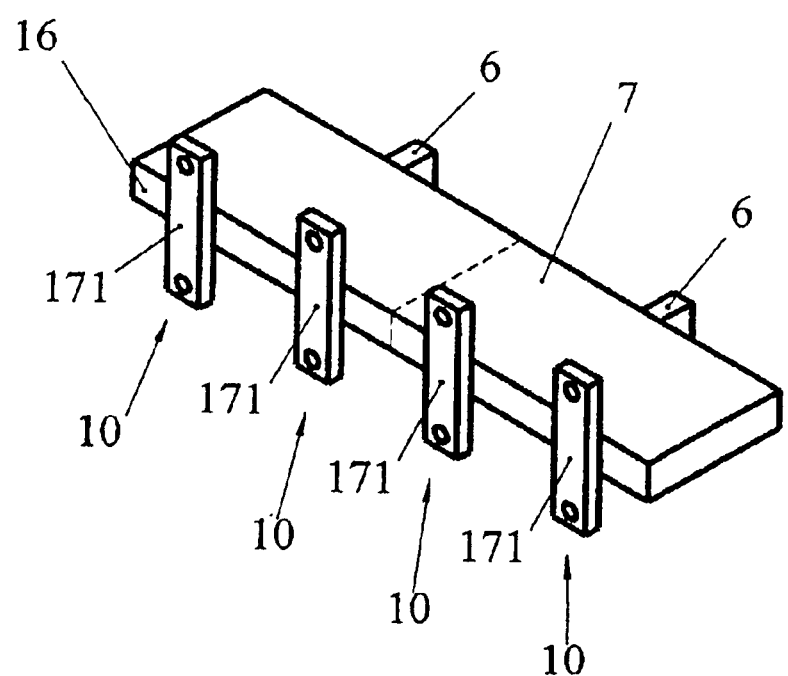
FIG. 38 illustrates friction elements in the form of resonance plates or bars.

FIG. 38 shows a variant of the oscillator 7 in which the fastening elements 10 are realized as resonance bending plates or bars 171.

Figure 39:
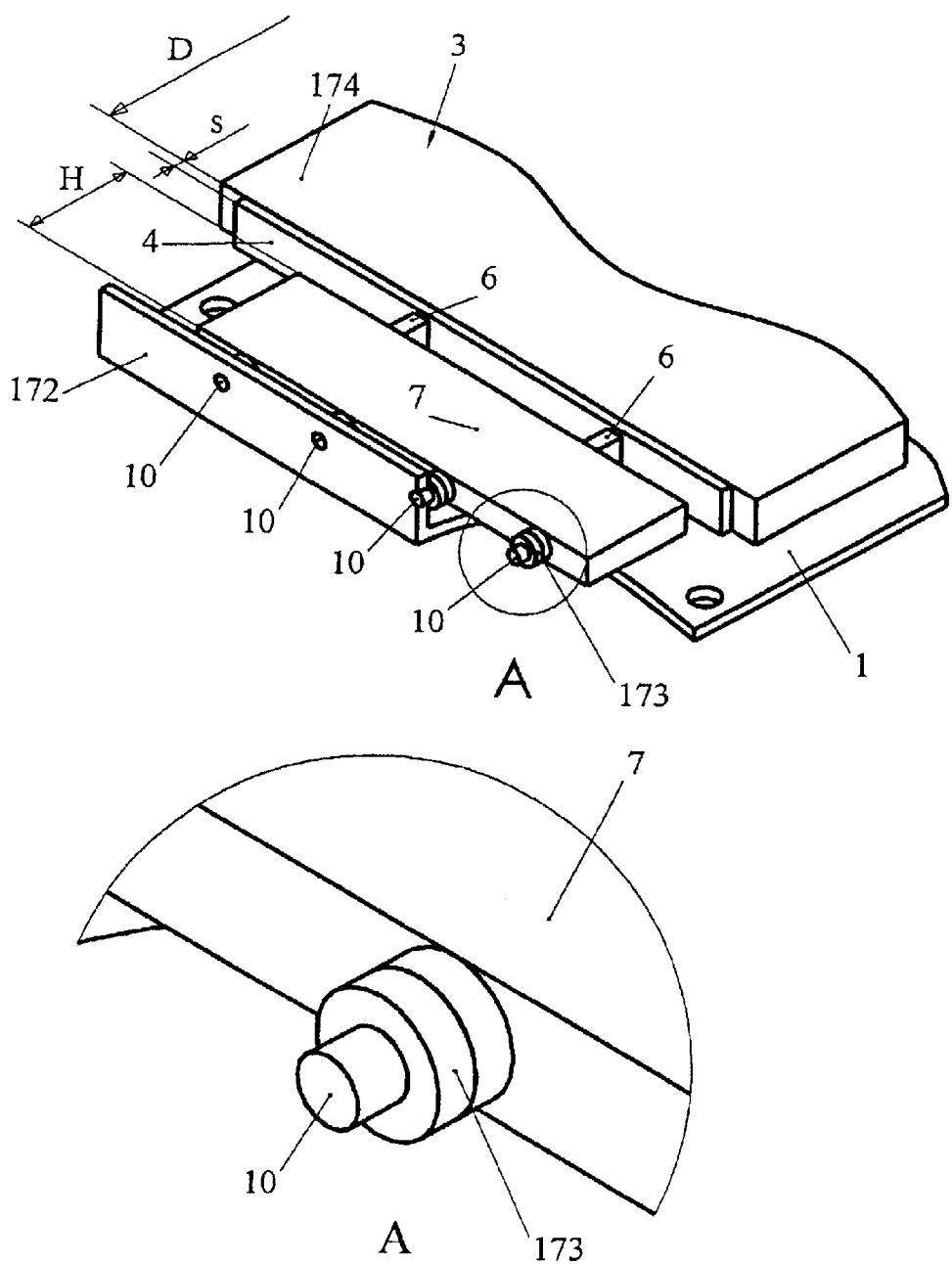
FIG. 39 illustrates attachment of the fastening elements in a rigid support mountings.

FIG. 39 depicts a construction variant of the proposed motor in which the fastening elements 10 are set up inside solid support mountings 172. In this construction variant of the motor, the oscillator 7 is attached to the friction layer 4 using the fastening elements 173, manufactured of rubber or another similar material. In this motor variant, the driven element 3 is realized in the form of a rectangular platform 174, which has the friction layer 4 arranged on its side surface. In the proposed motor the friction layer 4 is manufactured as a strip made of oxide-ceramic or of another similar material, e.g. zirconium oxide, tungsten carbide, titanium carbide, silicon oxide.

The thickness of the friction layer S (refer to FIG. 39) can be at least five times smaller than the resonant height H of the piezoelectric oscillator 7. The thickness of the body D of the friction element 3, which is located below the friction layer 4, can be larger than the resonance height H of the piezoelectric oscillator 7. For the purpose of the proposed motor, the driven element 3 can be manufactured of metal, ceramic or plastic.

Figure 40:
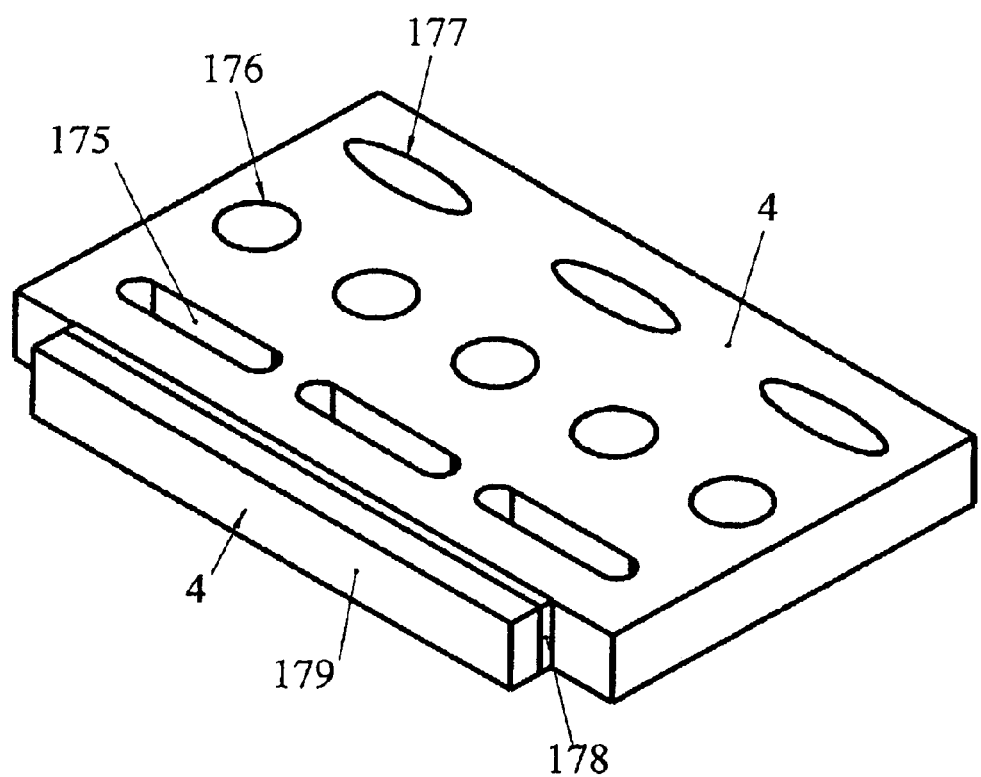
FIG. 40 illustrates driven element in the form of a platform.

FIG. 40 shows a driven element that has rectangular 175, round 176 or elliptical 177 dampening bore holes incorporated in its body. The driven element 3 can be manufactured of a hard porous material, e.g. of porous aluminum. Pores in the driven element 3 can be filled with a sound absorbing material.

It is possible to insert a thin dampening layer 178 (FIG. 40) between the body of the driven element 3 and the friction layer 4, which is comprised of a viscous organic material or of a porous material or of a composite material of the two. In the proposed motor, each friction layer 4 has a functional surface 179 that is in friction contact with the friction elements 6. This functional surface can be even, or it can have a different form, as shown in FIG. 40.

Figure 41:
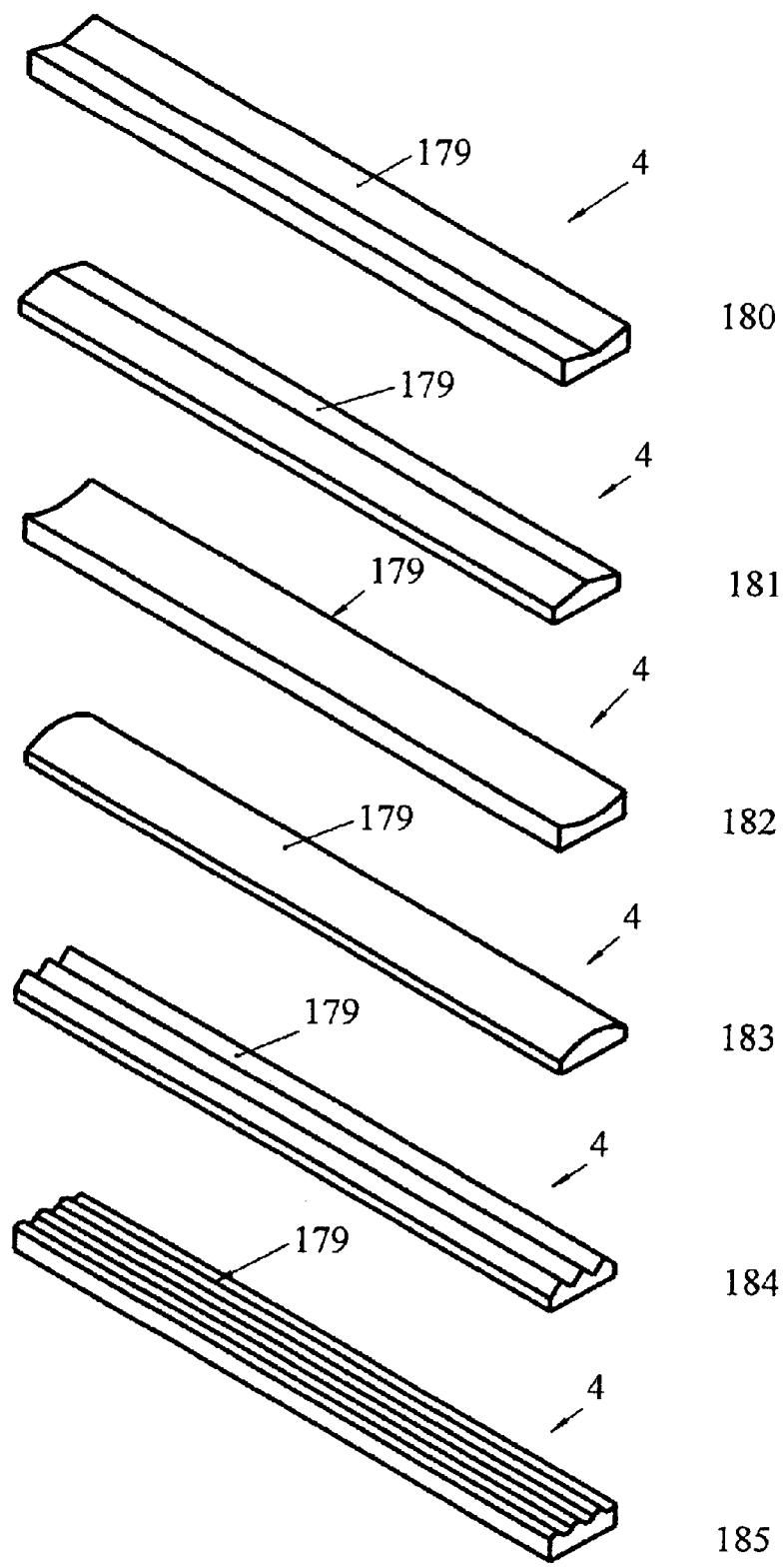
FIG. 41 illustrates variants of friction layers with different types of functional surfaces.

FIG. 41, pos. 180 to 185, demonstrate different variants of the functional surfaces 179. The functional surface 179 can have a triangular-concave (180) or triangular-convex (181) form, a round-concave (182) or round-convex (183) form or a rib-shaped (147, 148) form. The functional surface 112 can also have another similar form.

Figure 42:
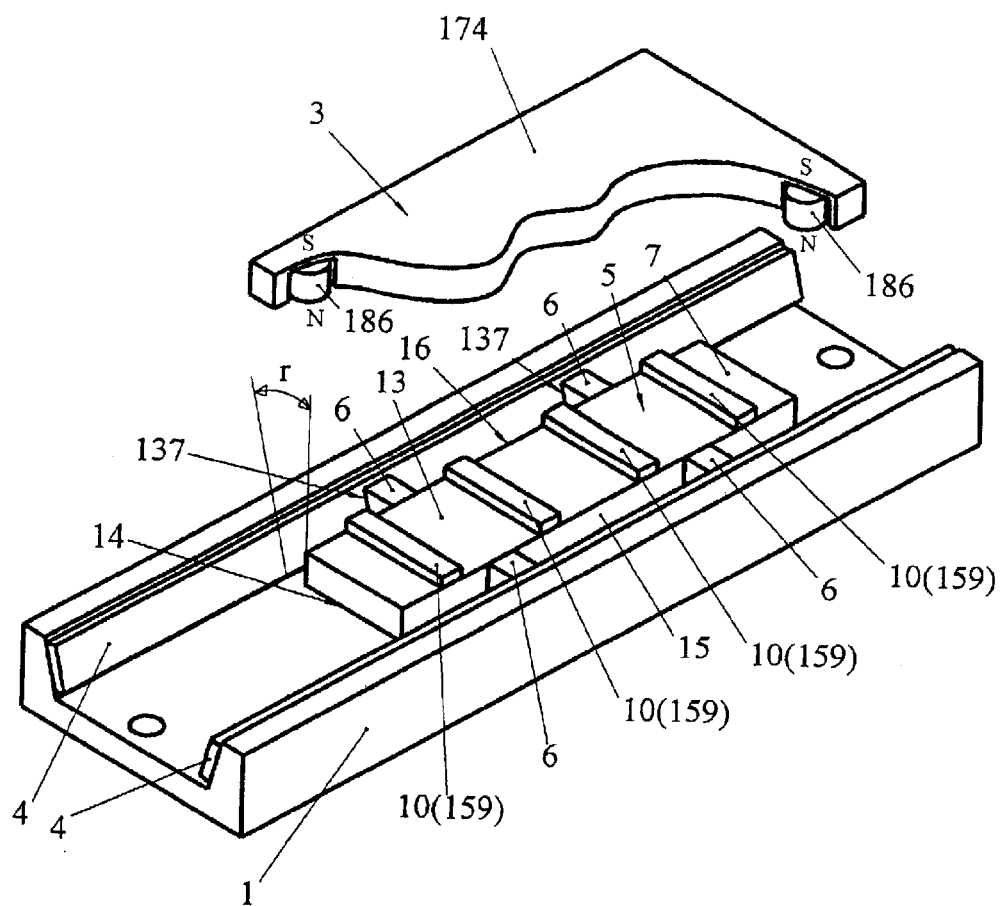
FIG. 42 illustrates a construction variant of the motor with inclined functional surface of the friction elements.

FIG. 42 represents the construction variant of the proposed motor in which the two friction layers 4 are opposite to each other and fastened to the housing 1 at an angle r in relation to the side surfaces 15, 16 of the oscillator 7. The oscillator 7 has four friction elements 6 that are arranged in pairs on the side surfaces 15, 16. The friction elements 6 are also realized with the inclined functional surfaces 137 in the same way, and they are arranged at an angle r in relation to the side surfaces 15, 16 of the oscillator 7. On one of its sides, the fastening elements 10 (159) of this motor variant are attached to the main surface 13 and, on the second of its sides, they are attached to the driven element 3 that is realized as a rectangular platform 174. The oscillator 7 is pressed against the friction layers 4 by way of the magnets 186 attached on the driven element 3.

Figure 43:
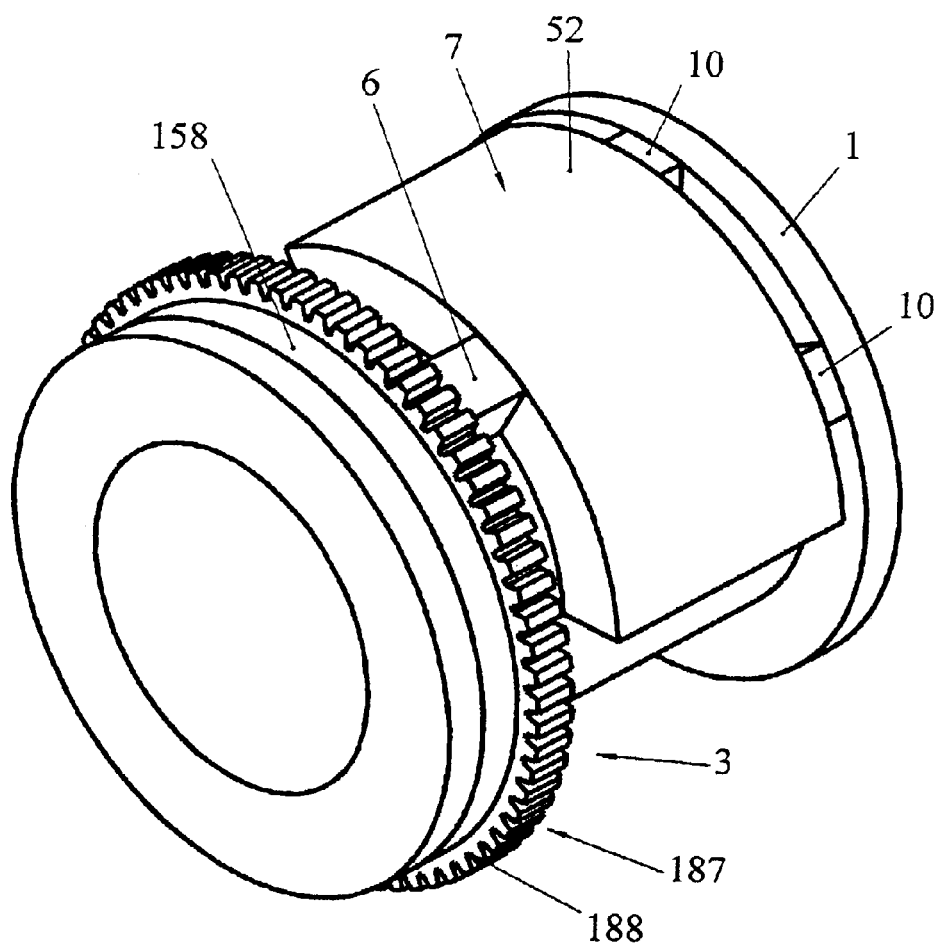
FIG. 43 illustrates another construction variant of the motor.

FIG. 43 shows a construction variant of the proposed motor in which the oscillator 7 is realized as cylinder part 52. This motor has the driven element 3, which is realized as a hollow cylinder or as a ring 187. The outside surface of the driven element is equipped with a toothed wheel 188.

Figure 44:
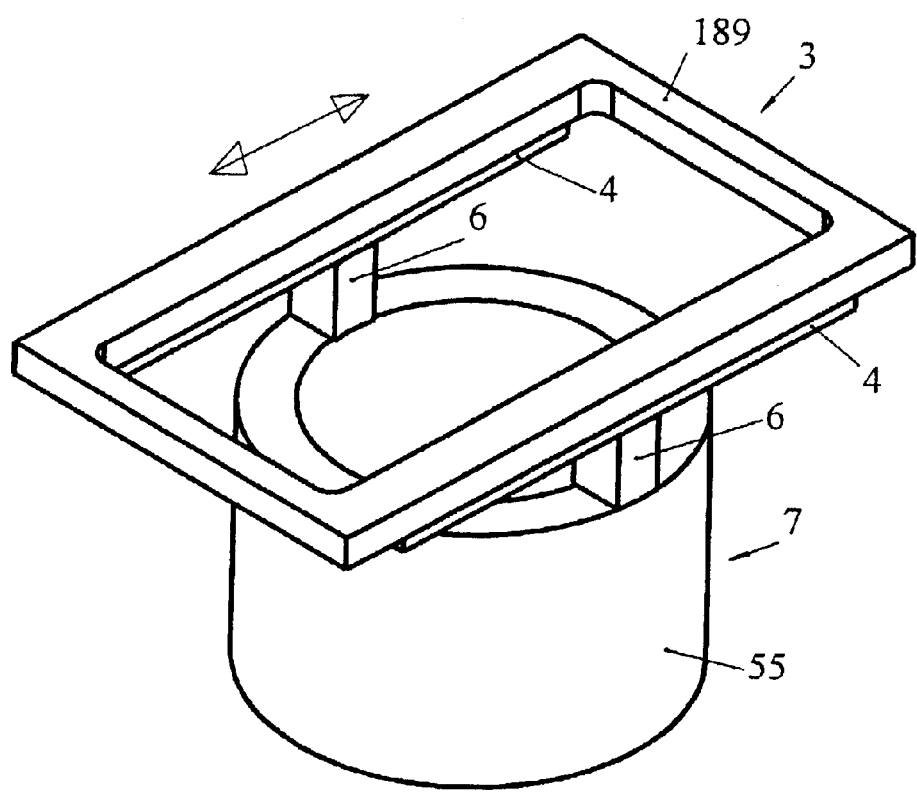
FIG. 44 illustrates construction variant of the motor with a cylindrical oscillator, with a resonant length of $L=2\lambda$.

FIG. 44 explains how a motor functions which has an oscillator 7 that is realized as a cylinder 55 with the resonant length of L=2λ. In this motor, the oscillator 7 is comprised of two friction elements 6 and the driven element 3, which is realized as a frame 189 with two parallel friction layers 4 located in one plane.

Figure 45:
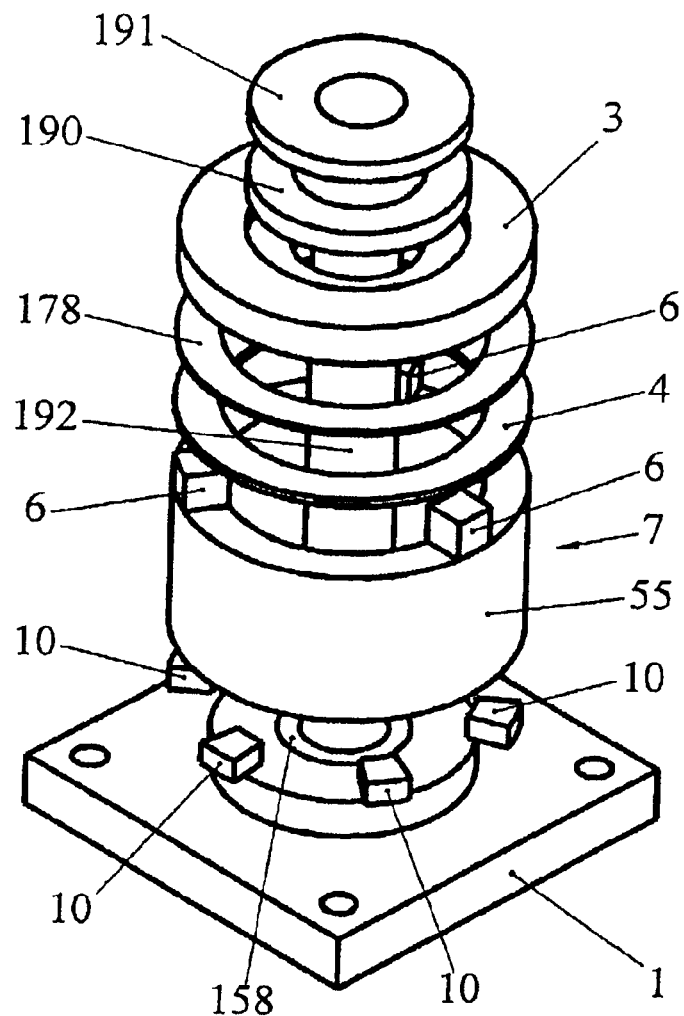
FIG. 45 illustrates construction variant of the motor with a cylindrical oscillator, with a resonant length of $L=3\lambda$.

FIG. 45 shows a construction variant of the proposed motor in which the oscillator 7 is realized as a cylinder 55 with the resonant length of L=3λ. Here, the oscillator 7 has three friction elements 6. Its driven element 3 is realized as a ring that is pressed against the oscillator 7 utilizing the elastic intermediate layer 190 and the flange 191 that is fastened to the shaft 192.

Figure 46:
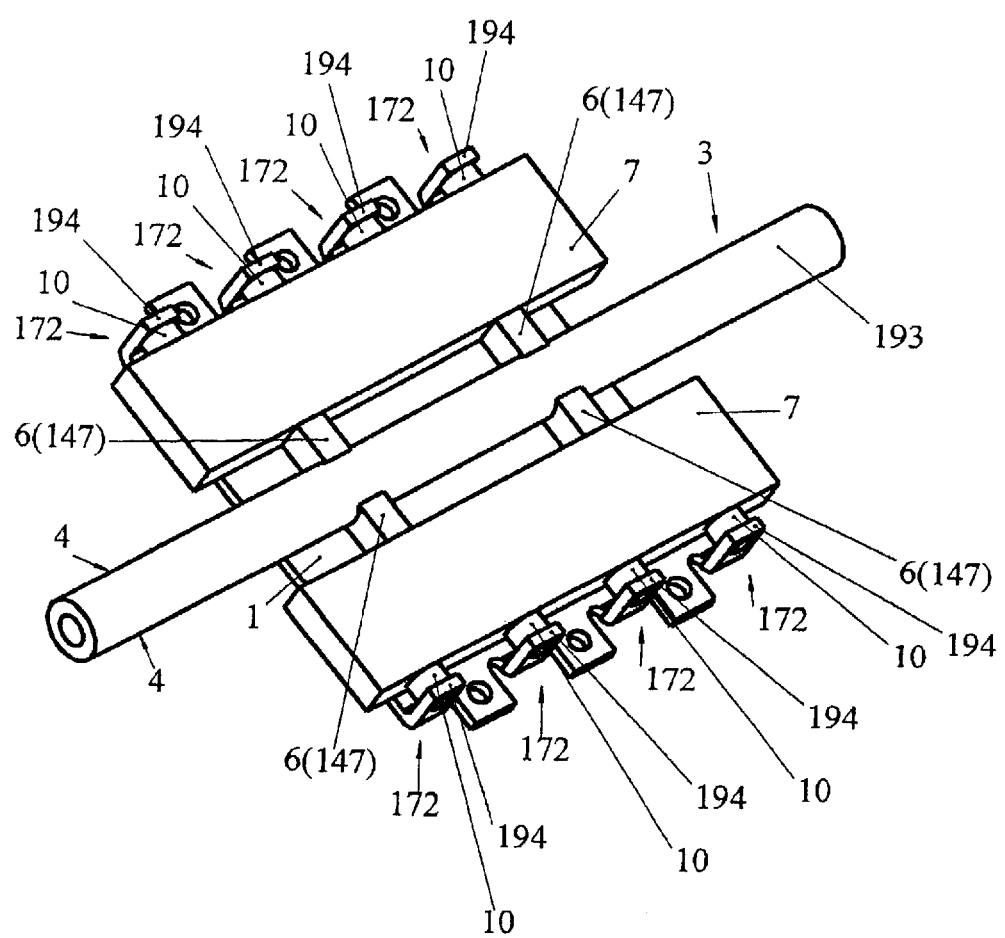
FIG. 46 illustrates another construction variant of the motor.

FIG. 46 depicts a linear motor that is comprised of two oscillators 7, which are located opposite to each other, and of two friction layers 4, which are located on the two opposite sides of the driven element. In a motor of this kind, it is possible to manufacture the driven element 3 of a bar with a round cross section of a tube 193, as shown in FIG. 46. In this context, the outside surface of the bar 193 is able to fulfill the function of the friction layer 4. For this motor, the pressing action of the oscillator 7 against the friction layer 4 can be ensured with the assistance of the rigid support mountings 172 manufactured as flat springs 194.

Figure 47:
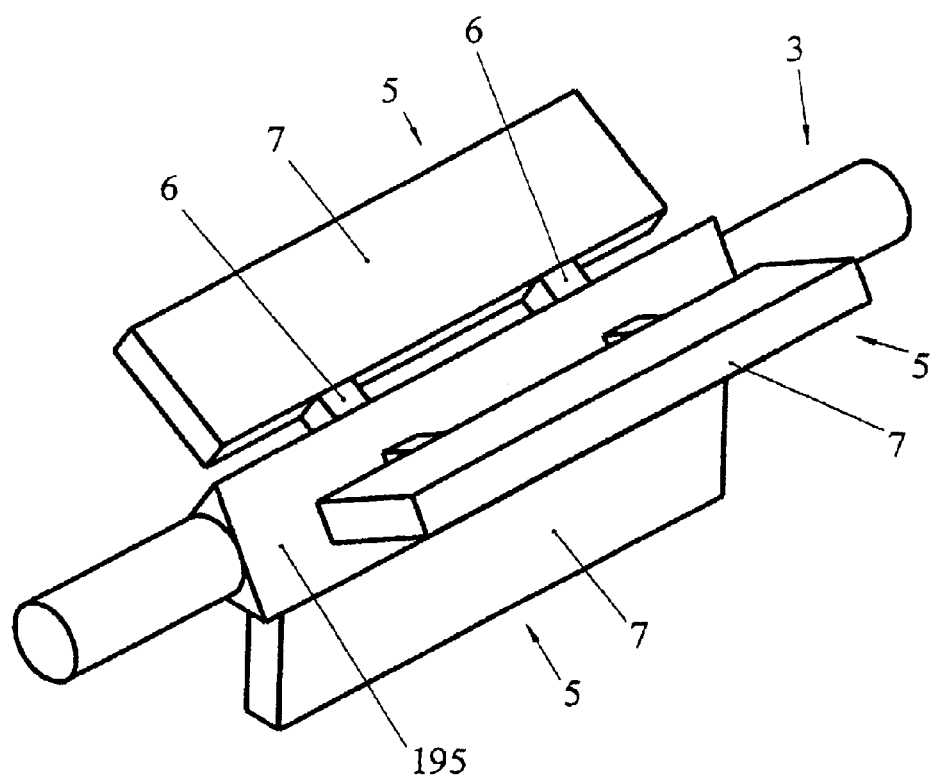
FIG. 47 illustrates construction variant of the motor with three oscillators.

FIG. 47 shows a construction variant of the motor that is comprised of at least three piezoelectric oscillators 7 and at least three friction layers 4, which are arranged parallel in relation to each other and located in at least three planes. In a motor of this type, it is possible to realize the driven elements 3 as a bar 195 with a three-corner cross section or with a multiple-corner cross section, as demonstrated in FIG. 47.

Figure 48:
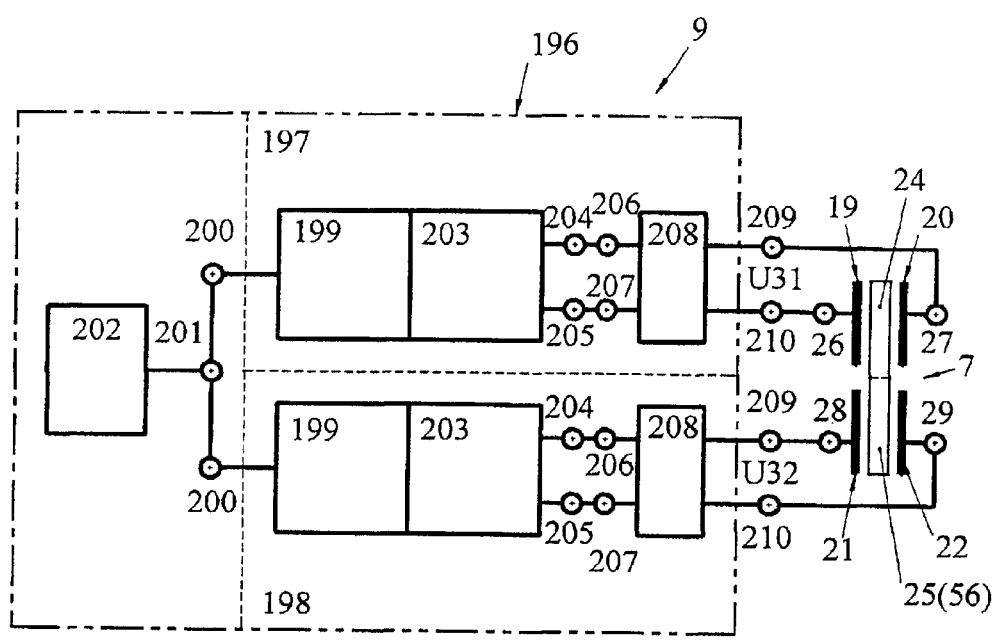
FIG. 48 illustrates block diagram of an electrical excitation source for the motor with separate generators of acoustic waves.

FIG. 48 depicts a block diagram of the proposed motor explaining the way the simplest excitation source 9 functions, which provides the two-phase voltage U31=U31 maxSin (ωot), U32=U32 maxSin (ωot±Φu). In the present instance, the electric excitation source 9 is set up as a two-channel power amplifier 196 comprised of the first channel 197 and of the second channel 198. Each channel (197, 198) includes the formation level 199 that is connected by way of its input 200 to the output 301 of the basic generator 202.

In addition, the channels, 197, 198 include the output power amplifier 203, which is electrically connected by way of its outputs 204, 205 to the inputs 206, 207 of the adjusting level 208. The outputs 209, 210 of the adjusting level 208 of the channel 197 are electrically connected to the connections 26, 27 of the generation of acoustic longitudinal waves 24 of the oscillator 7. The outputs 209, 210 of the adjusting level 208 of the channel 198 are electrically connected to the outputs 28, 29 of the generator of acoustic longitudinal waves 25 (or 56) of the oscillator 7.

Figure 49:
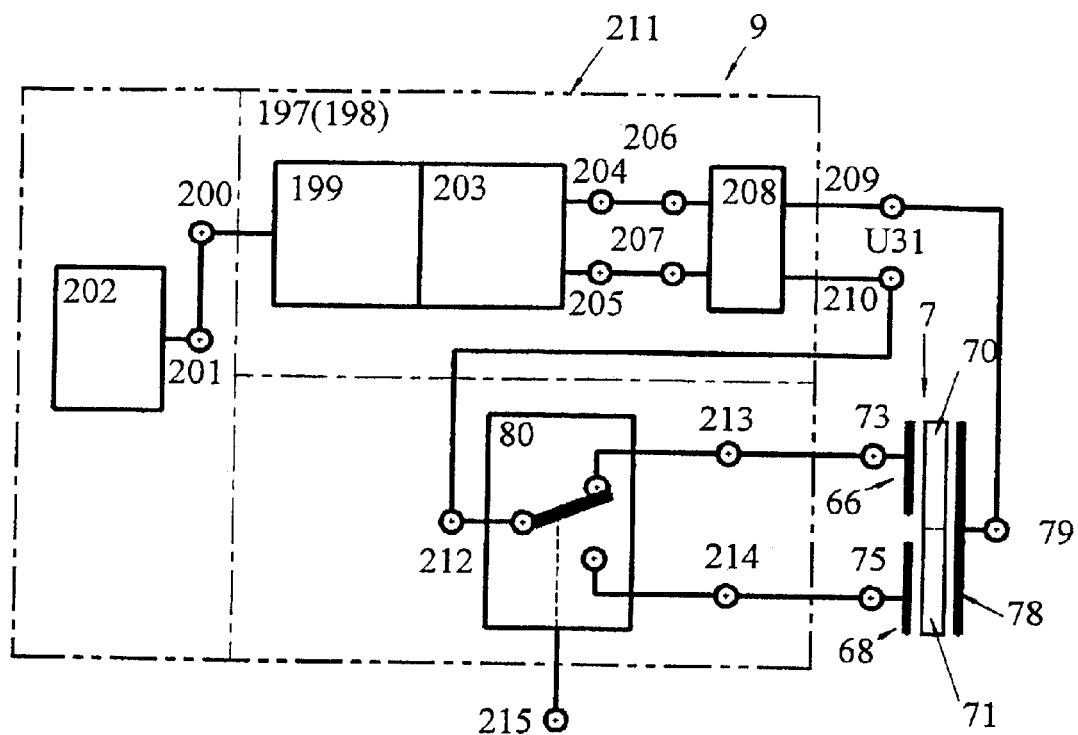
FIG. 49 illustrates block diagram of an electrical excitation source for the motor with the composite generators of acoustic waves.

FIG. 49 shows a block diagram of the proposed motor explaining the way the excitation source 9 functions, which provides the one-phase voltage U31=U31 maxSin (ωot).

The electric excitation source 9 is set up as a single-channel power amplifier 211, including the channel 197 (or 198) comprising the formation level 199, which is connected by way of its input 200 to the output 201 of the basic generator 202. In addition, the channel 197 (or 198) includes the output power amplifier 203, which is electrically connected by way of its outputs 204, 205 to the inputs 206, 207 of the adjusting level 208. The output 209 of the adjusting level 208 is electrically connected to the connection 79 of the joint electrode 78 of the oscillator 7.

The second input 210 of the adjusting level 208 is connected to the input 212 of the electrode commutator 80. The outputs 213 and 214 of the electrode commutator 80 are connected to the electrodes 66 and 68 of the composite generators 70 and 71 of the oscillator 7. In the present construction variant of the motor, the electrode commutator 80 owns the control input 215.

The proposed invention envisions a motor variant in which each of the output power amplifiers 203 of the channel 197 or 198 is set up as bridge power amplifier 216 (refer to FIG. 50), which is comprised of the first half-bridge power amplifier 217 that has the output 204 and the second half-bridge power amplifier 217 that has the output 205 acting upon which are the voltages U1 and U2. Both half-bridge power amplifiers 217 include the transistor switch 218.

In this variant, the formation levels 199 are comprised of two excitation channels 219, 220 of the half-bridge power amplifiers 217. Each of the excitation channels 219, 220 includes the driver 221 and the formation level 222. Furthermore, one of the excitation channels, e.g. the channel 220, can be equipped with a signal phase control element 223 that has the control voltage Ust acting upon its phase control input 224.

Figure 50:
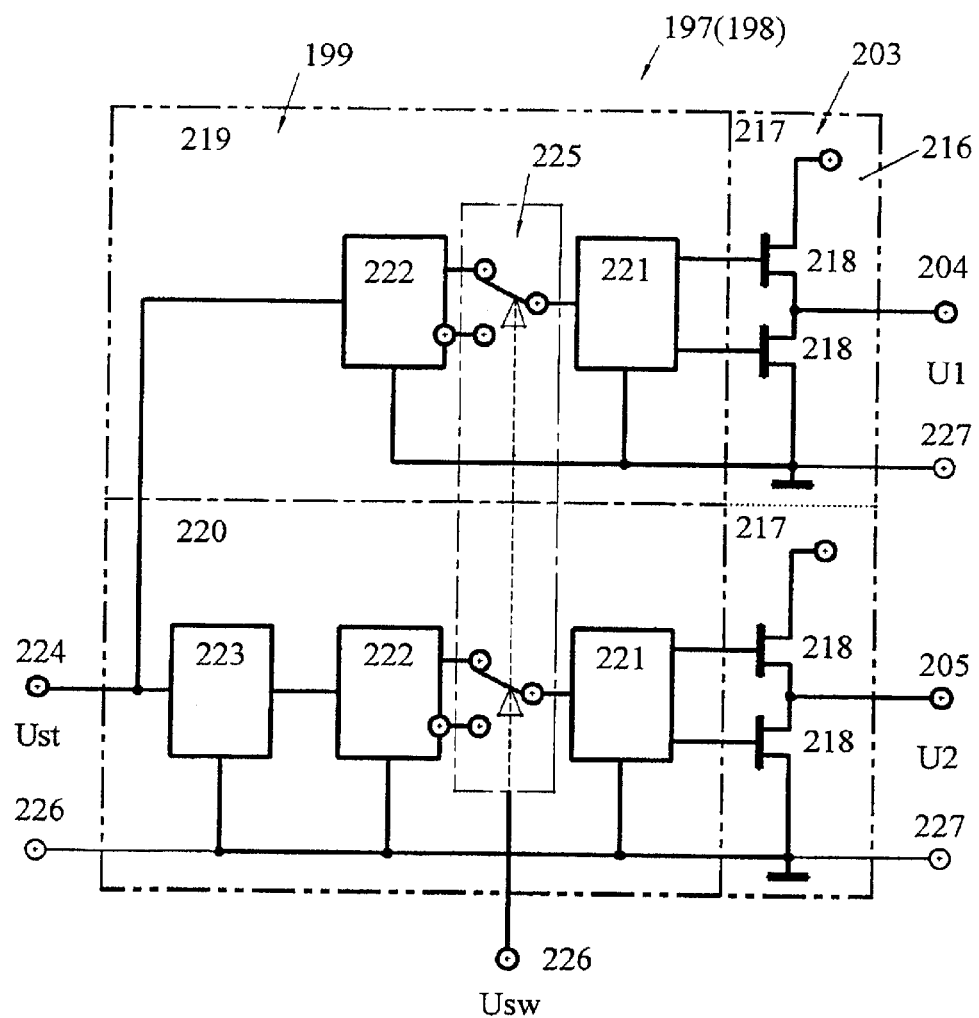
FIG. 50 illustrates block diagram of the first channel and of the second channel of the power amplifier.

Also, one of the channels 197, 198 can be equipped with the reverse change-over 225 that has the control voltage Usw acting upon its control input 226 (refer to FIG. 50).

The connection 227 is connected to the ground or to the joint zero potential of the excitation source 9. The pos. 228 to 233 in FIG. 51 demonstrate possible variants of the adjusting elements 208, including the integrating transformer 234, the compensation coil 235 and the resonance condenser 236.

Figure 52:
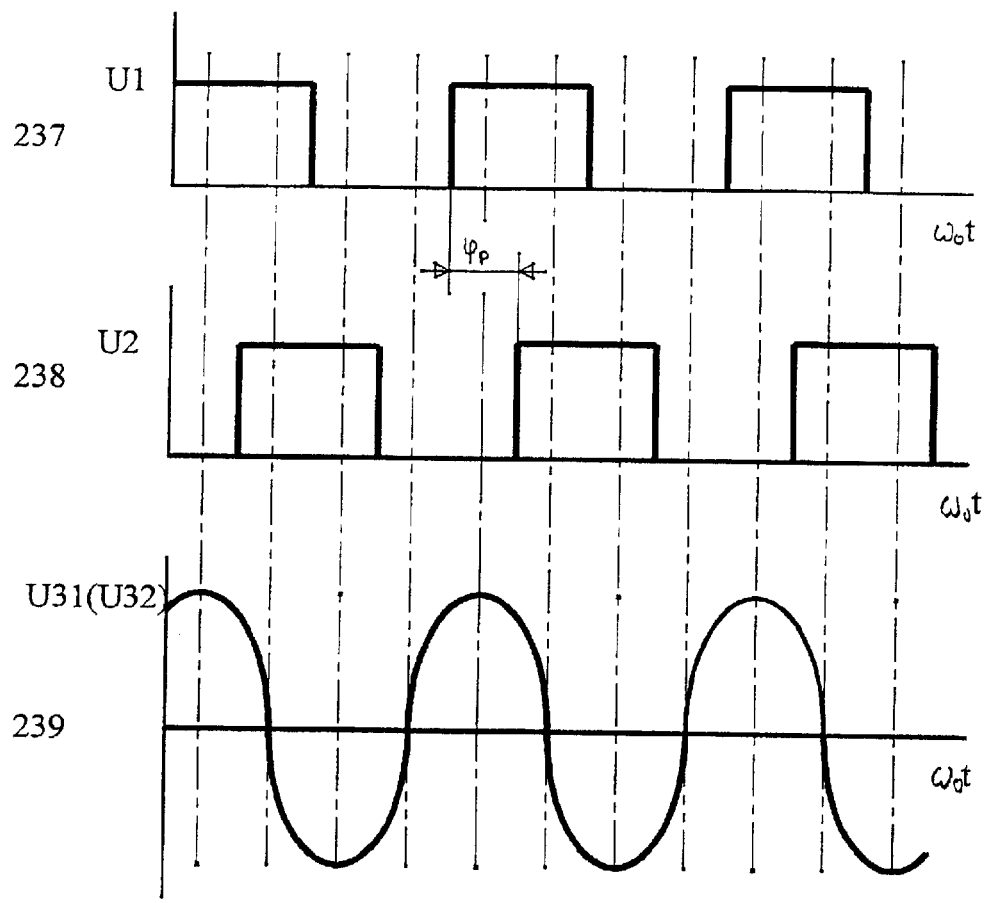
FIG. 52 illustrates diagrams of electrical voltages.

The pos. 237 to 239 in FIG. 52 represent diagrams of the electric voltages U1, U2, U31 (U32). The voltage U1 is applied between the output 204 and the joint potential 227 of the first half-bridge amplifier 217. The voltage U2 is applied between the output 205 and the joint potential 227 of the second half-bridge amplifier 217. These voltage curves have rectangular forms. The voltages U31 or U32 are effective at the outputs 209 and 210 of the adjusting element 208. This voltage has the form of a sine curve.

The voltages U1 and U2 are displaced in relation to each other by the phase displacement angle Φp. The signal phase control element 223 determines the angle Φp, and the control voltage, that is active at its control input 224, modifies the angle.

Figure 53:
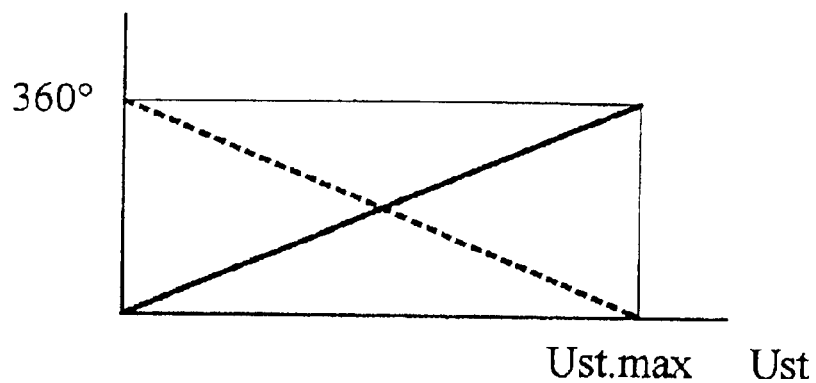
FIG. 53 illustrates characteristic curve of the signal phase control element.

Using the solid line, FIG. 53 depicts the desired dependence of the phase displacement angle Φp on the control voltage Ust of the signal phase control element 223. The dotted line indicates another possible dependence.

Figure 54:
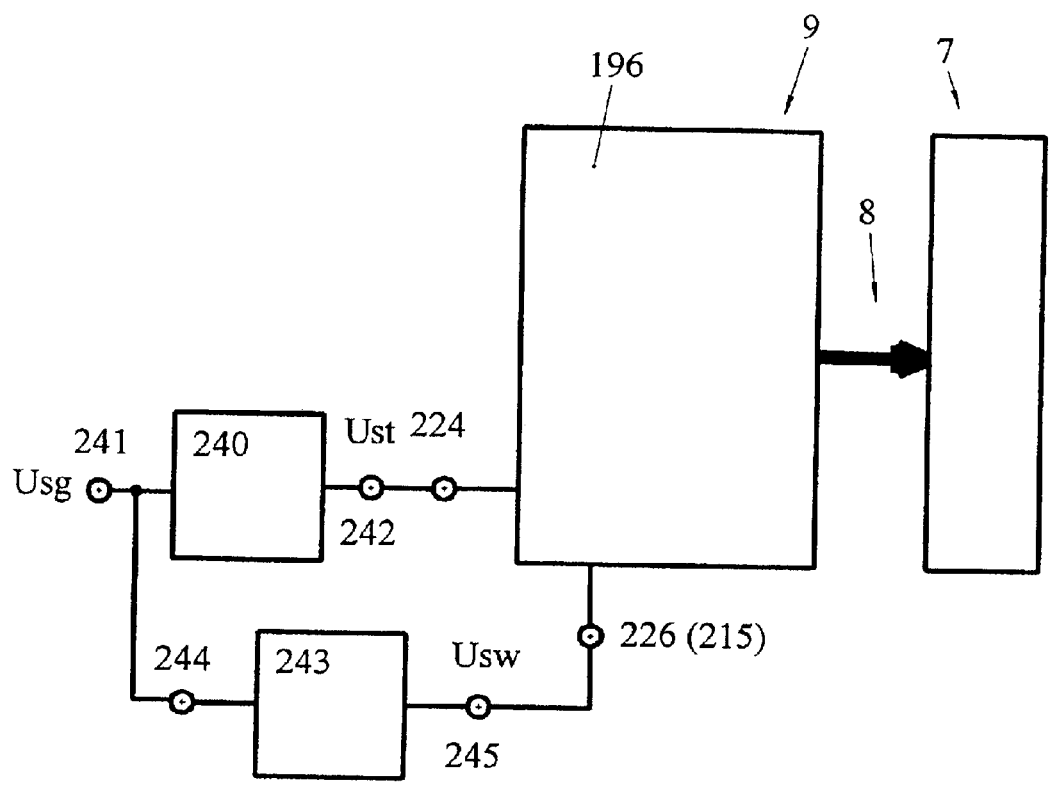
FIG. 54 illustrates block diagram of the motor with a signal level transformer.

FIG. 54 represents a block diagram of the proposed motor equipped with a transformer 240 of the control signal Usg, which contains the signal input 241 and the output 242 of the control voltage Ust and which is connected to the phase control input 224 of the phase control element 242. In a variant of an embodied example, the transformer 240 can be realized as a level transformer of the signal voltage Usg into the voltage Ust.

Figure 55:
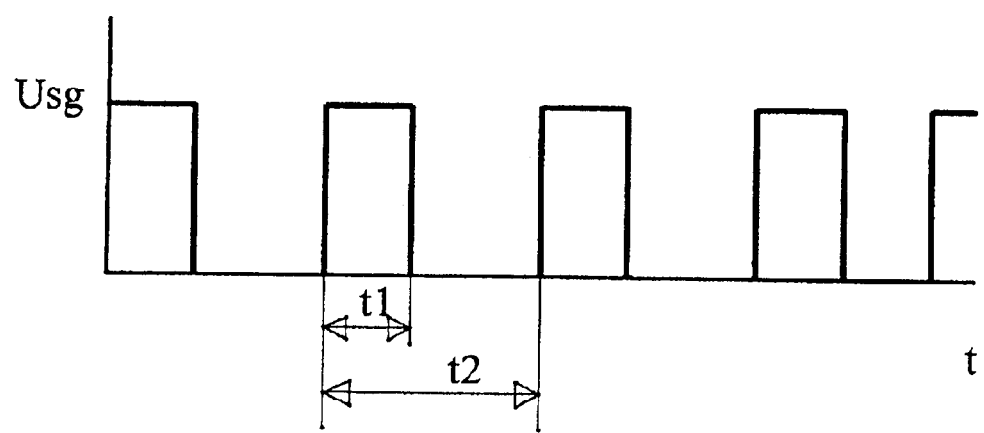
FIG. 55 illustrates diagram of a pulse width modulated signal.

In another variant of an embodied example, the transformer 240 is a demodulator of a pulse width modulated signal that transforms the signal width ratio t1/t2 into the control voltage Ust. The diagram of the pulse width modulated signal is shown in FIG. 55.

Moreover, it is possible to equip the variants of the proposed motor addressed in the present context with a level detector 243 of the zero position whose measuring input 244 is connected to the input 241 of the transformer 240. Its input 245 can be connected to the control input 226 of the reverse change-over 225 or to the control input 215 of the electrode commutator 215 (refer to FIG. 54). The switch over voltage Usw is active at the output 245 of the level detector 243.

Figure 56:
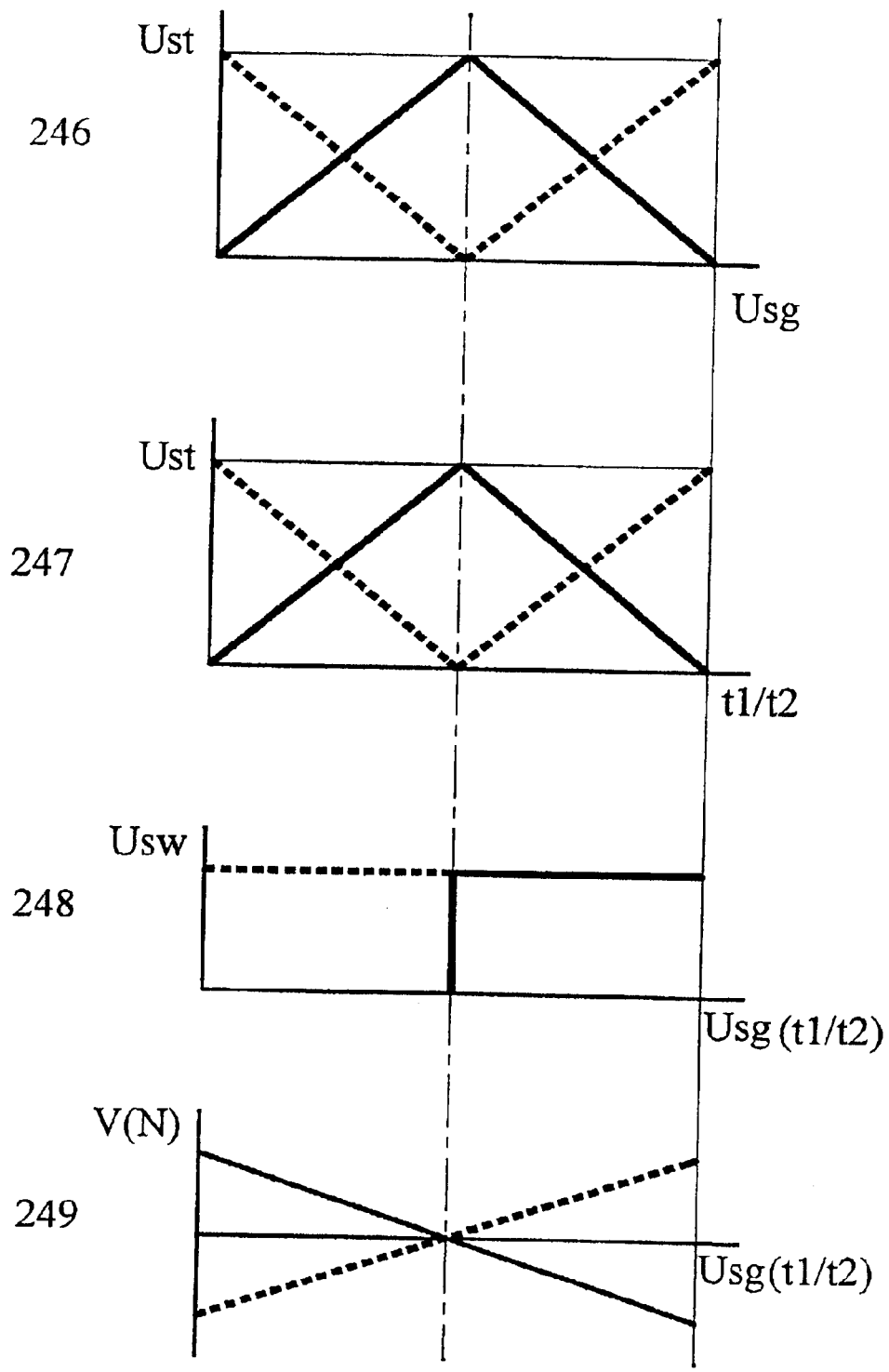
FIG. 56 illustrates variants of characteristic curves.

Using solid lines, FIG. 56, pos. 246, 247 show the desired transfer characteristics of the transformer 240. Using a solid line, FIG. 56, pos. 248 shows the transfer characteristic of the level detector of the zero position 243. Using the solid line and the dotted line, FIG. 56, pos. 249, shows possible control characteristics of the movement of the driven elements of the proposed motor 3.

Figure 57:
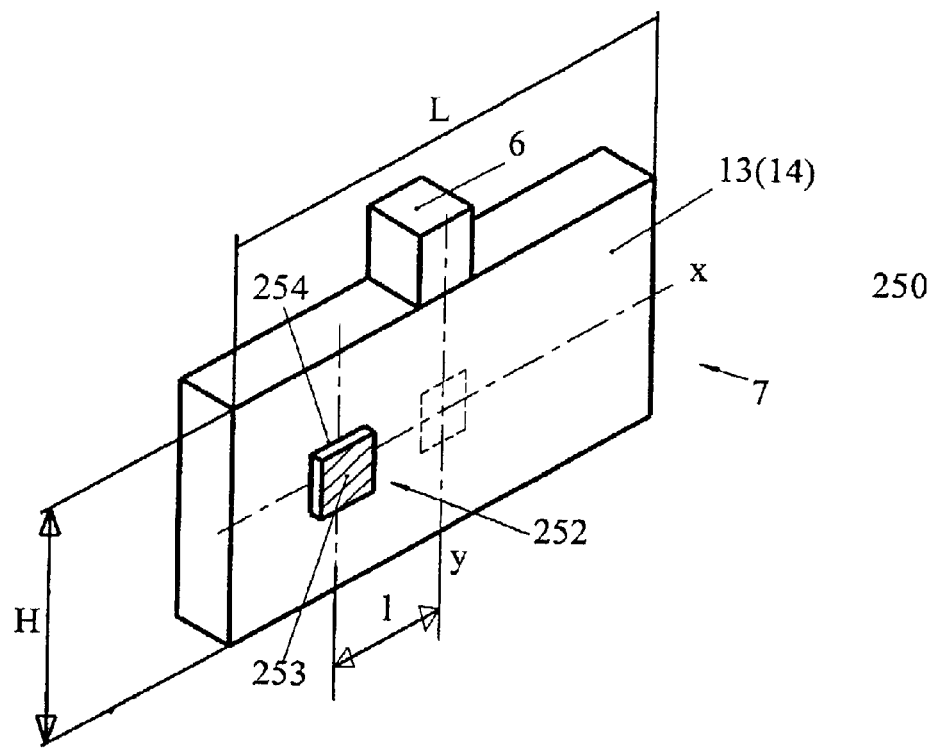
FIG. 57 illustrates variants of a sensor for detecting the mechanical stress of the oscillator.
Figure 57:
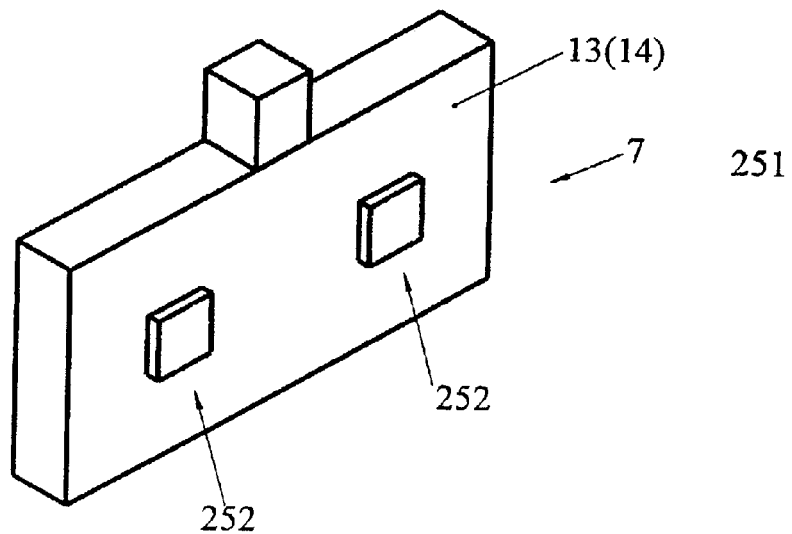

FIG. 57, pos. 250, 251 represent possible construction variants of the sensor of the mechanical stress of an acoustic longitudinal wave that expands in the oscillator 7. The sensor 252 can be realized as a thin rectangular or as a round (now shown here) piezoelectric plate, with the electrodes 253, 254 on its wide surfaces and with polarization that is directed perpendicular in relation to the electrodes, as disclosed in pos. 250.

The sensor 252 is, acoustically coupled, mounted on one of the main surfaces 13, 14 of the oscillator 7, in particular at the location that has the maximum mechanical stress of the corresponding acoustic longitudinal wave that expands in the oscillator 7. The sensor can be fastened on the surface of the oscillator 7, in particular along the x-axis at a distance of l=¼ L from the vertical y-axis, as seen in FIG. 57, pos. 250. The sensor can be also arranged in the center, along the x-axis and the y-axis, as shown in FIG. 57, pos. 250.

The sensor 252 can be realized in the form of two thin piezo-ceramic plates that are acoustically fastened to one of the main surfaces 13, 14 of the piezoelectric oscillator 7, in particular at the locations that experience the greatest mechanical stress, of an acoustic longitudinal wave that expands along the resonant length of the oscillator and whose points have the same movement paths in the presence of a 180° signal phase displacement of one of the power amplifier channels 197, 198 with regard to the signal of another. The sensor plates are fastened symmetrically at a distance of ¼L in relation to the vertical y-axis on the surfaces 13, 14 of the oscillator 7, as seen in FIG. 57, pos. 251.

The acoustic fastening of the sensor 252 to the surfaces 13, 14 of the oscillator 7 can be achieved by way of gluing it to one of the electrodes 253, 254 of the sensor 252, utilizing a hard bonding agent on the basis of an epoxy resin, or by way of soldering it to the corresponding electrode (19, 20, 66, 78) of the oscillatory 7.

Figure 58:
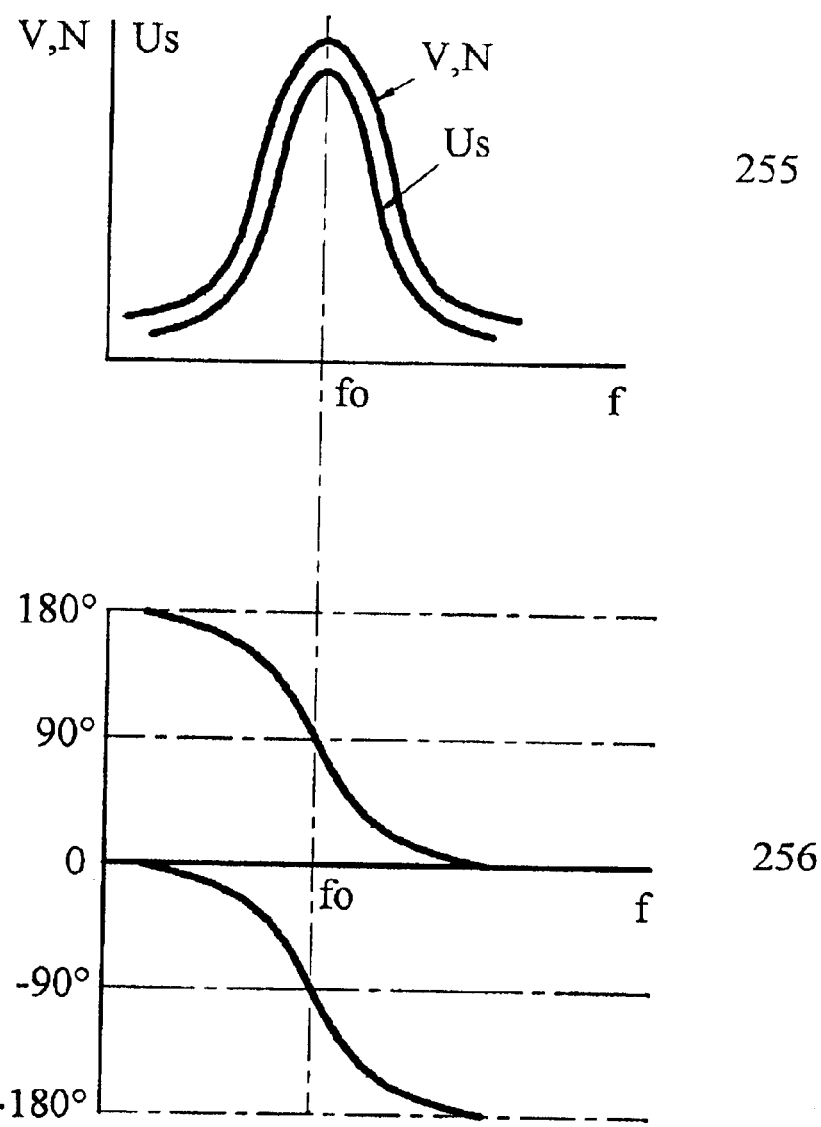
FIG. 58 illustrates characteristic curves of a sensor of the mechanical stress.

FIG. 58, pos. 255, 256 show the frequency characteristics of the sensor 252. The pos. 255 indicates a dependence between the voltage Us of the sensor signal and the dependence of the rate of motion V or the number of revolutions N of the driven element 3 on the excitation frequency f of the oscillator 7. The pos. 256 demonstrates the dependence of the phase displacement angle Φp between the voltage at the connection 26 of the electrode 19 of the sensor 7 and the voltage Us of the sensor signal for two opposite polarization directions of the sensor 252.

Figure 59:
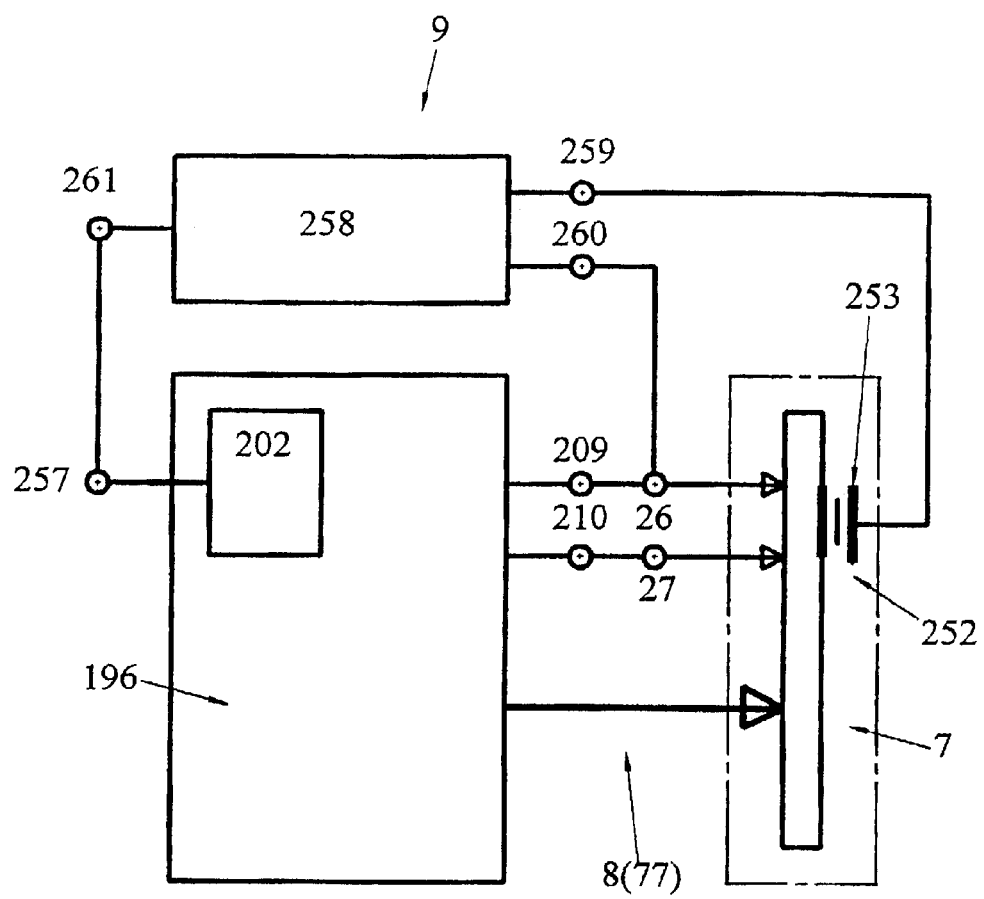
FIG. 59 illustrates a construction variant of the motor with a frequency control input of the basic generator and with a phase detector.

In the context of the construction variants of the proposed motor, the basic generator 202 can be equipped with an excitation frequency control input 257 (refer to FIG. 59). Furthermore, it is possible to equip the proposed motor with the phase detector 258, which has the first output 259, the second phase input 260 and the output 261.

The first output 259 of the phase detector 258 can be connected to the electrode 253 of the sensor 252. The second output 260 is connected to the connection 26 of the electrode 19 of the oscillator 7. The phase detector output must be connected to the frequency control input 257 of the basic generator 202, as depicted in FIG. 59.

Figure 60:
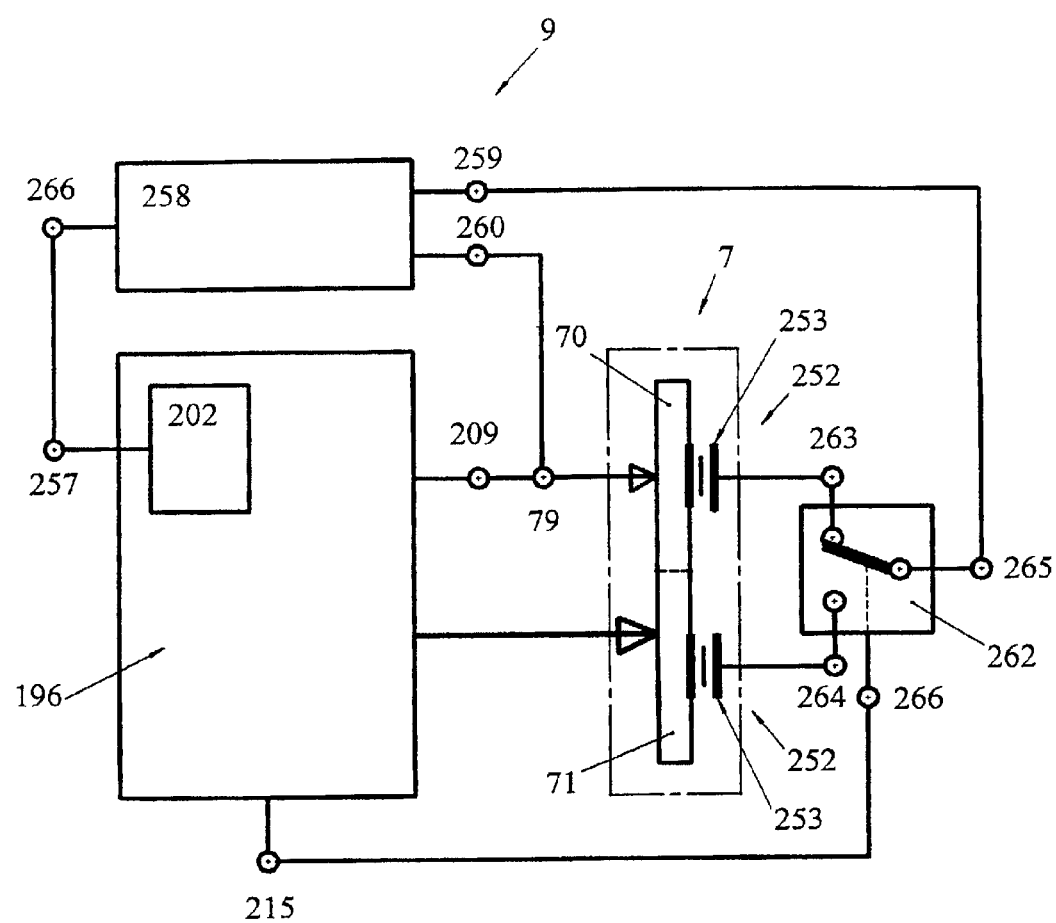
FIG. 60 illustrates block diagram of a construction variant of the motor with a two-part sensor.

FIG. 60 shows a block diagram of the construction variant of the proposed motor with the sensor 252, which is manufactured of two thin plates. This variant of the motor is equipped with the signal commutator of the sensor 262 containing the first input 263, the second input 264, the output 265 and the control input 266. The first input 263 of the commutator 262 is connected to the electrode 253 of the first plate of the sensor 252, and its second input 264 is connected to the electrode 23 of the second sensor plate 252, and the output 256 is connected to the phase input 259 of the phase detector 258. The control input 266 of the commutator 262 is connected at the control input 215 of the electrode commutator 80.

Figure 61:
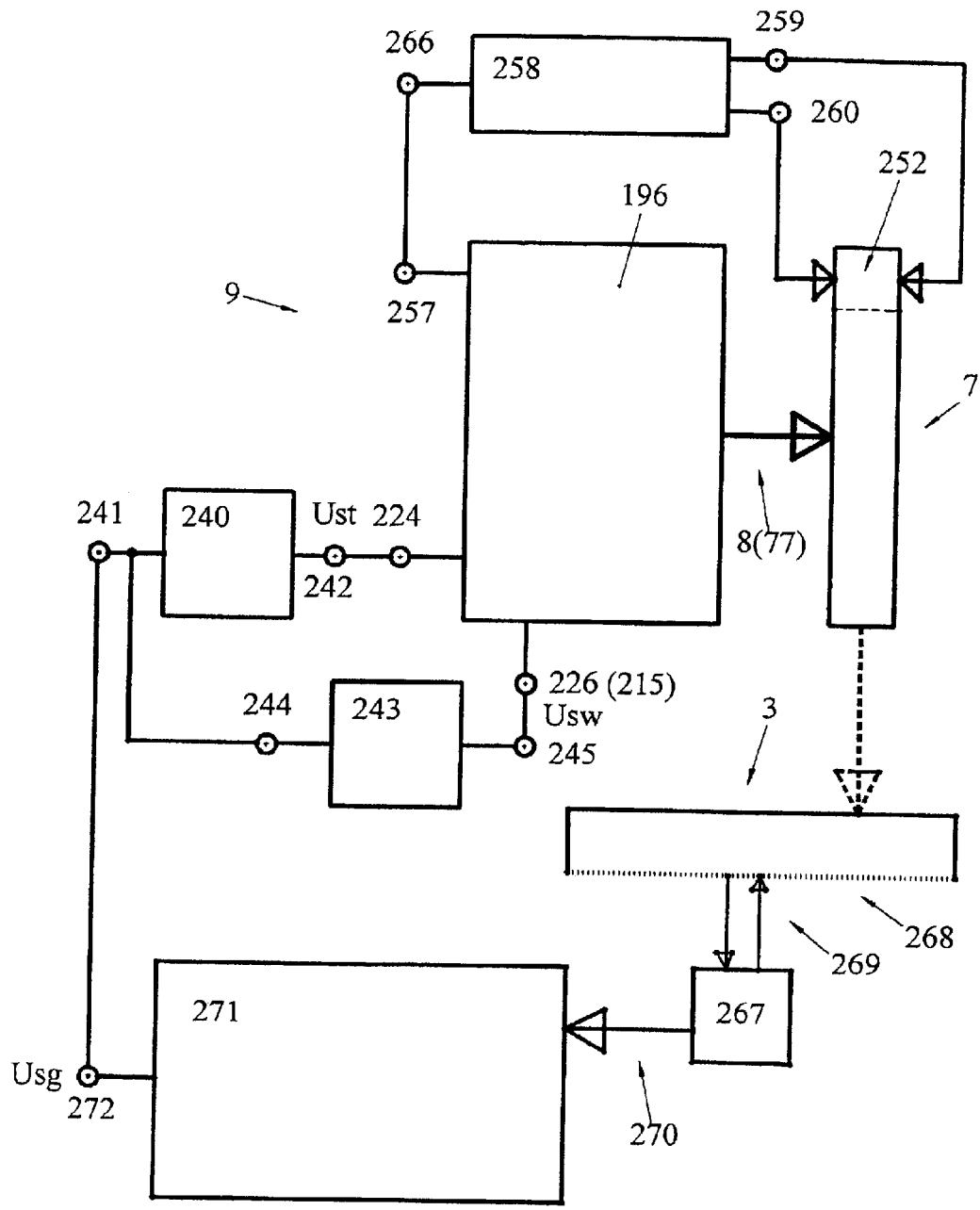
FIG. 61 illustrates block diagram of a construction variant of the motor with a processor-controlled controlling means.

FIG. 61 depicts a block diagram of a construction variant of the proposed motor that is equipped with a coordinate parameter sensor or movement parameter sensor 267 of the driven element. The sensor 267 has the scale 268 and the display device 269. The information output of the sensor 267 is electrically connected to a processor-controlled controlling means 271. The output 272 of the processor-controlled controlling means 271 is connected to the input 241 of the transformer 240.

The manner in which the proposed piezoelectric motor functions relies on the simultaneous electrical excitation of an acoustic longitudinal wave in the monolithic piezoelectric oscillator 7 that expands along the resonant length L and of an acoustic longitudinal wave that expands along the resonant height H of the oscillator 7.

To be understood as an acoustic wave that expands along the oscillator length L of the oscillator 7 is such a wave whose expansion causes the particles of the oscillator 7 to vibrate, preferably in the direction of the oscillator length L. During its expansion, this wave is reflected on the two front surface areas 17, 18 of the oscillator 7, resulting in the formation of a standing wave.

To be understood as an acoustic wave that expands along the oscillator height H of the oscillator 7 is such a wave whose expansion causes the particles of the oscillator 7 to vibrate, preferably in the direction of the oscillator height H. During its expansion, the wave is reflected on the two side surface areas 15, 16 of the oscillator 7, resulting in the formation of a standing wave.

The resonance length L of the oscillator 7 is equal or is a multiple of an integer of a wave length of the acoustic standing wave that expands along the oscillator length L.

The resonance height H of the oscillator 7 is one half of the wave length of the acoustic standing wave that expands along the oscillator height H.

The resonance length L and the resonance height H of the oscillator 7 are tied to the condition that the frequencies of the waves expanding in the oscillator are identical.

This condition defines certain limitations with regard to the geometric dimensions of the oscillator 7. Since the two waves that are generated in the oscillator are of the same kind, provided the frequency is the same, their wave lengths are also approximately the same, i.e. $\lambda\sim v$. This means that the relationship between L/H of the oscillator is approximately 2 or a multiple of an integer of 2, i.e. 4, 6, 8.

The acoustic wave that is generated in the oscillator 7 and that expands along the resonant height H can have a constant preceding sign or a variable preceding sign along the resonant length L.

In one construction variant of the motor, the excitation of the two acoustic waves in the oscillator 7 occurs by utilizing two independent generators of the acoustic waves 24, 25 or 56.

In another construction variant of the motor, the excitation of two waves can be accomplished simultaneously by employing a composite generator of the acoustic waves 70 or 71.

The difference between the generators 24, 25 and 56 lies in the configuration of the electrodes 19, 20 of the first group of electrodes and of the electrodes 21, 22 of the second group of electrodes that constitute these generators, in particular with regard to the arrangement of these electrodes on the surface of the oscillator 7 and in their mutual wiring. The electrodes 19, 20 of the first group of electrodes are arranged in the margin areas of the main surfaces 13, 14 of the oscillator 7, in particular symmetrically in relation to the plane of symmetry S, which runs through the center of the resonant height H of the oscillator 7. This configuration of the electrodes 19, 20 makes an acoustic longitudinal wave possible, due to excitation in the oscillator 7, that expands along the resonant length L.

The electrodes 21, 22 of the second group of electrodes are arranged in the center areas of the main surfaces 13, 14 of the oscillator 7, in particular symmetrically in relation to the plane of symmetry S, which runs through the center of the resonant height H of the oscillator 7. This configuration of the electrodes 19, 20 makes an acoustic longitudinal wave possible, due to excitation in the oscillator 7, that expands along the resonant height H.

The electrodes 19, 20 of the first group of electrodes can be connected to the electrodes 21, 22 of the second group of electrodes resulting in a composite generator of acoustic waves 70, 71. The generators 70, 71 excite, simultaneously, an acoustic longitudinal wave in the oscillator 7 that expands along the resonant length L and an acoustic longitudinal wave that expands along the resonant height H of the oscillator 7. In all instances addressed here, the acoustic longitudinal waves that are generated in the oscillator 7 do not have a bending component.

The electric excitation of the generators 24, 25, 56, 70, 71 in the variants of the proposed motor occurs by way of an electric excitation source 9 which provides, depending on the construction of the oscillator 7, a periodic single-phase excitation voltage or two-phase excitation voltage. The excitation voltage is supplied to the electrodes of the generators 24, 25, 56, 70, 71 of the acoustic waves, thereby exciting them. Based on this circumstance, the acoustic waves addressed previously are generated in the oscillator 7. It is the action of these waves upon the friction elements 6 that affects the friction elements to perform an elliptical movement.

The elliptical movement of the friction elements 6 (refer to FIG. 1) causes the longitudinal movement of the driven element 6 in the one or in the other direction, depending on the phase displacement of the waves expanding in the oscillator 7.

The friction element, which is arranged on the side surface 15 or 16 in accordance with FIG. 4 moves, due to the expansion of two acoustic longitudinal waves in the oscillator 7, along the elliptical paths shown in pos. 43, 44, 45, 46. This movement can be subdivided into four phases.

(i) Advance pressure phase—pos. 43. The friction element moves in the direction of the friction layer 4 and is pressed against the friction layer 4. During this phase, a coupling is created between the friction element 6 and the friction layer 4; (ii) Advance movement phase—pos. 44. The friction element transfers, by way of the frictional forces, the force to the driven element 3 and induces the driven element 3 to move; (iii)) Reverse pressure phase—pos. 45. The friction element 6 returns from the friction layer 4 and interrupts the friction contact; and (iv) Reverse movement phase—pos. 46. The friction element executes a reverse movement.

FIG. 9 indicates, as outlined previously, a construction variant of an oscillator 7 that is realized as the cylinder part 52 and that has a resonant length L=2λ. In an oscillator of this type, the friction elements 6 have opposite directions of movement of their elliptical movement paths located in two parallel planes, thereby making them suitable for use in linear motors. The friction elements 5 can be set up on a side surface 15 or 16 or on the two surfaces simultaneously.

FIG. 10 discloses the oscillator 7 as a cylinder 55 with the joint resonant length L =3λ. In an oscillator of this kind, the friction elements 6 have the same direction of movement with regard to their elliptical movement paths, with the latter being located in three planes that are arranged at a 120° angle. These oscillators are suitable for use in revolving cylinder motors.

In motors where the friction elements 6 have transverse grooves 117 (refer to FIG. 27), these grooves can be filled with a sound absorbing material. This way, parasitic vibrations that develop in parts of the friction elements 6 are dampened. To simplify the manufacturing technologies of the friction elements 6, it is possible to produce the friction elements 6 as glass strips 151 that are melted onto the side surfaces 15 or 16 of the piezoelectric oscillator 7, as shown in FIG. 33.

Friction elements of this kind can be applied to the oscillator 7 utilizing screen print technology, including further thermal treatments. To improve the mechanical solidity and the capacity of resistance to wear of the friction elements 6, it is possible to fill the friction elements 6, which are manufactured as glass strips 151, with a powder of a wear resistant material, e.g. with powdered aluminum oxide, zirconium oxide, tungsten carbide, titanium carbide or of another similar material.

FIG. 34 shows two limiting elements 152 of the piezoelectric oscillator 7 that prevent the oscillator 7 from shifting along the resonant length L. These elements must be manufactured of a plastic material that has a small friction coefficient with regard to the piezoelectric ceramic, e.g. of teflon or of another similar material.

To avoid that the oscillator becomes stuck between the limiting elements, the distance between the limiting element is chosen as somewhat larger than the resonant length L of the oscillator 7. The gap between the oscillator 7 and the limiting elements 152 (not shown in FIG. 34) must be approximately 0.05 . . . 0.1 mm. Such a gap ensures reliable pressure of the friction element 6 against the friction layer 4 by way of the elastic elements 135.

In this motor variant, the limiting elements 152 reliably maintain the piezoelectric oscillator 7 within the limits of the width of the gap in terms of its longitudinal shifting. The driven element 3 can be realized in this and in other variants of the motor as a frame 154 that contains the driving element 5.

FIG. 35 shows a motor variant in which the limiting elements 155 are in the form of mechanical resonators whose frequency of resonance corresponds to the oscillation frequency of the piezoelectric oscillator 7 during motor operation. These elements are manufactured of elastic metal plates that, due to insulating spacers, compress the oscillator 7, thereby preventing it from shifting along the resonant length L.

During the operation of the motor, the limiting elements 155 vibrate along with the oscillator 7 without introducing considerable mechanical losses into the resonance system of the oscillator 7, which reduces the mechanical losses during motor operation.

During the breaking process of the driven element 3 the piezoelectric oscillator shifts somewhat in the direction of the brake force within the limits of the elasticity of the limiting element 155.

The construction variant of the electrical excitation source 9 represented in FIG. 48 functions in this way:

At its output 201, the basic generator 202 produces an electrical voltage with a frequency that corresponds to the mechanical frequency of resonance f0 (or the angular frequency ω0) of the acoustic vibrations of the oscillator 7, and at which frequency an acoustic longitudinal wave expands along the oscillator's resonant length L. This voltage is applied to the inputs 200 of the formation levels 199 of the first channel 197 and of the second channel 198. The formation levels 199 excite the power amplifiers 203 they are connected to.

In different variants of the proposed motor it is possible for one of the formation levels 199, either that of channel 197 or of channel 198, to contain a phase adjuster element that changes the signal phase of channel 199 by an angle of ±ωu in relation to the signal of channel 198. The phase adjuster element is not shown. The outputs 204, 205 of the power amplifier 203 of the channels 197, 198 are connected to the inputs 206, 207 of the adjusting elements 208, and the electrical voltages U31, U32 are generated at the outputs 209, 210 of the adjusting elements. These voltages have the following form: U31=U3 maxSin (ωt), U32=U32 maxSin (ωt±Φu).

The phase displacement angle Φu between the voltages U31 and U32 determines the optimal phase displacement angle between the acoustic waves on the oscillator 7. This angle depends on the dimensions of the oscillator 7 and on the oscillator construction. In different motor variants, it is between 0 . . . +90°. Regarding an explanation of the way this works, additional motor variants will be addressed for which this angle is zero, i.e. the phase adjuster element is omitted.

The variant of the electric excitation source depicted in FIG. 49 functions in this way: At its output 201, the basic generator 202 produces an electrical voltage with a frequency that corresponds to the mechanical frequency of resonance f0 (or the angular frequency ω0) of the acoustic vibrations of the oscillator 7 and at which frequency an acoustic longitudinal wave expands along the oscillator's resonant length L. This voltage is applied at the input 200 of the formation level 199 of the channel 197 (198). The formation level 199 excites the power amplifier 203 it is connected to.

The outputs 204, 205 of the power amplifier 203 of the channels 197, 198 are connected to the inputs 206, 207 of the adjusting elements 208, and the electric single-phase voltage is generated at its outputs 209, 210, which alternately excite the generator 70 or the generator 71 of the oscillator. This voltage has the form U31=U31 maxSin (ωt).

Changing-over the excitation of the generator 70, 71 by way of the electrode commutator 80 leads to a change of the direction of movement of the driven element 3.

In the variant shown in FIG. 50 of one of the channels 197, 198, the power amplifier is set up as a bridge power amplifier 216. This amplifier is comprised of two half-bridge power amplifiers 217, and the electrical voltages U1, U2 are supplied at the outputs 204, 227 and 205, 227 of the half-bridge power amplifier 217.

The excitation of the half-bridge power amplifier 217 occurs utilizing the formation levels that are comprised of two excitation channels 219, 220. Each of the excitation channels 219, 220 includes the drivers 221 and the formation level 222. The drivers 221 generate electric voltages for controlling the transistors 218, and the formation elements 222 supply electrical voltages for controlling the drivers 221. Moreover, it is possible to equip one of the excitation channels, e.g. the channel 220, with a signal phase control element 223.

The signal phase control element 223 allows for a phase displacement between the voltages U1, U2 at an angle of ωp, which can vary between 0 and 360°, depending on the control voltage Ust at the output 224. With regard to the two-phase excitation sources 9, one of the channels 197, 198 can be equipped with the reverse change-over 225, and the control voltage Usw (refer to FIG. 50) acts upon the control input 226 of the reverse change-over 225. The change-over 225 functions in such a way that that, when activated, the phase displacement angle between acoustic waves expanding in the oscillator 7 is shifted by 180°. This results in a change of direction of the driven element 6.

Figure 51:
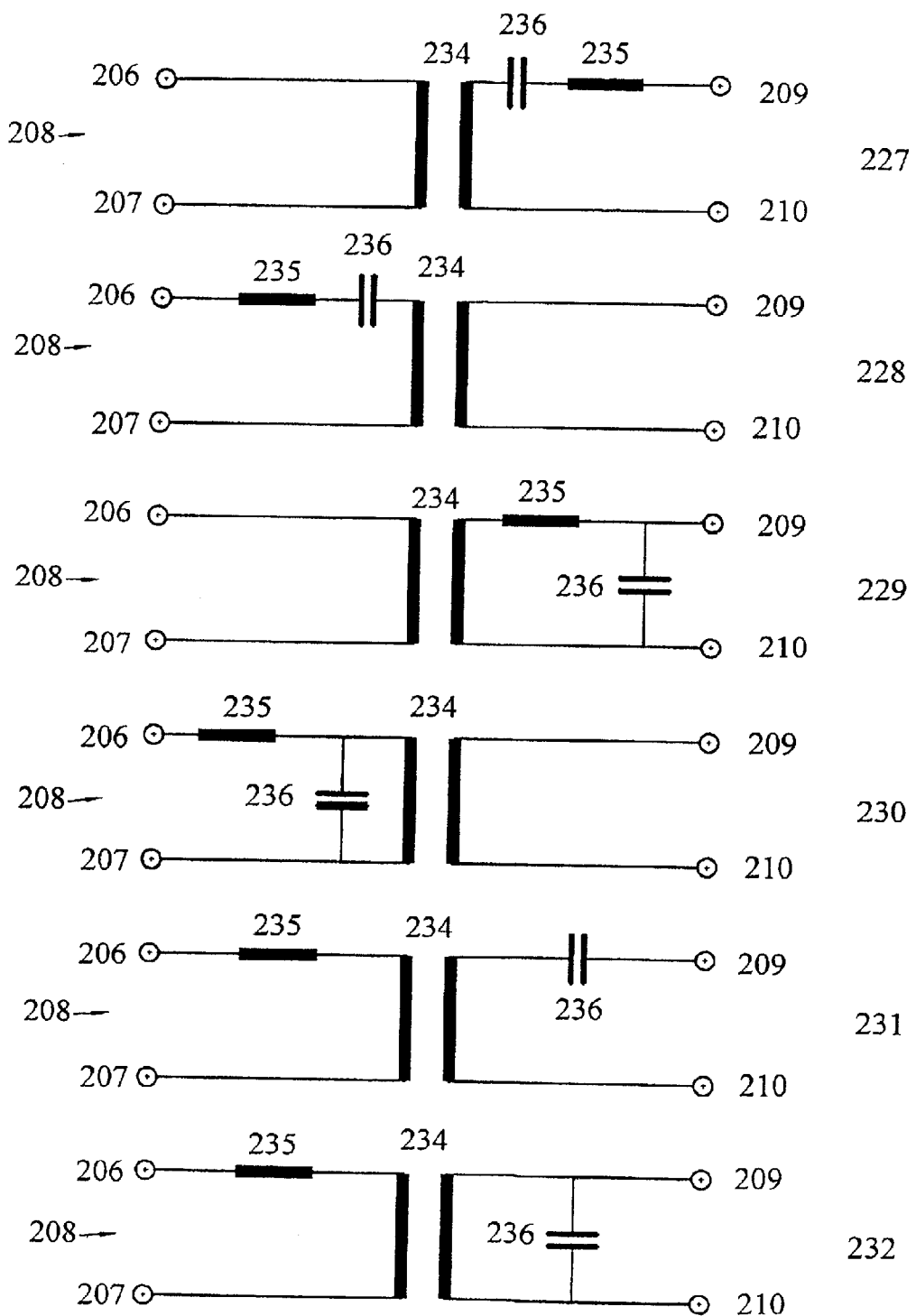
FIG. 51 illustrates variants of an adjustment step.

The adjusting levels 208, that are shown in FIG. 51 pos. 227 to 232, are used for adding the voltages U1, U2 that are effective at the outputs 204, 227 and 205, 227 of the half-bridge power amplifier 216 as well as for increasing and filtering of the voltages. The addition is achieved by way of a summing transformer 234. The transformer also partially increases the voltage. The filtering and another voltage increase are implemented using a resonant circuit that is formed by way of compensation inductivity 235 and the resonance condenser.

FIG. 52 shows diagrams of the voltages U1, U2, U31 or U32. The voltages U1, U2 have a rectangular shape, because the power amplifiers 217 are operated with a high level of effectiveness during circuit operation. The voltage control element changes the phase displacement angle between the voltages U1 and U2. A modification of this angle leads to the change of amplitude of the voltages U31 and U32. At a phase displacement of 0°, the voltage U31 or U32 is also zero; and at a phase displacement of 360°, the voltage U31 or the voltage U32 reaches its maximum value. Changing the amplitude of the voltages U31 and U32 results in a proportionate amplitude modification of the excitation of the oscillator 7, virtually leading to the proportionate increase or reduction of the rate of motion V or number of revolutions N of the driven element 3.

Using a solid line, FIG. 53 represents the desired dependence of the change of the phase displacement angle ωp on the control voltage Ust of the phase control element 223.

The dotted line indicates another possible relationship of dependence.

Having a signal phase control element 223 available in the proposed motor makes it possible, utilizing the control voltage Ust, to vary the rate of motion V or the number of revolutions N of the driven element 3, while maintaining, simultaneously, the high values of the level of effectiveness of the power amplifier 217.

The proposed motor can be equipped with a transformer 240 of the control signal Usg, which arrives at signal input 241. The block diagram of such a motor is seen in FIG. 54.

The construction of the transformer 240 depends on the form of the control signal Usg.

If the signal Usg has the form of a changing unipolar singe-phase voltage, the transformer 240 can be set up as a voltage level transformer of the control signal Usg into the voltage Ust, which is effective at its output 242. In this instance, the transformer can have a transfer characteristic as demonstrated in FIG. 56 pos. 246 by way of a solid line.

If the signal Usg has the form of a rectangular pulse width modulated signal with changing scanning ratios t1/t2 (refer to FIG. 55), the transformer 240 must be set up as a demodulator of a pulse width modulated signal that transforms the scanning ratio t1/t2 of this signal into the control voltage Ust.

In this instance, the transformer can have a transfer characteristic as indicated in FIG. 56 pos. 247 by way of a solid line. The addressed variants of the proposed motor can be equipped with the level detector of the zero position 243. The level detector of the zero position 243 determines, based on the control signal Usg, the zero position of the driven element 3 and adjusts the control voltage Usw that changes the direction of the movement of the driven element 3. Using a solid line, FIG. 56 pos. 248 represents the desired transfer characteristic of the level detector of the zero position 243.

A motor that is equipped with the level detector of the zero position 243 has the control characteristic as shown in FIG. 56 pos. 249 and indicated by way of a solid line. The dotted line indicates another possible control characteristic. The proposed motor can be equipped with a sensor 252 for recording the mechanical stress of an acoustic longitudinal wave that expands in the oscillator 7. The sensor 252 can be acoustically fastened to one of the main surfaces 13, 14 of the oscillator, in particular at the location of the maximum mechanical stress of the corresponding acoustic longitudinal wave expanding in the oscillator 7.

A sensor of this kind has a frequency response as shown in FIG. 58 pos. 255 and a phase response as indicated in pos. 256. The sensor supplies an electric voltage Us at its electrodes 253, 254 that is proportionate in relation to the mechanical stress in the oscillator 7 and to which, in turn, the vibration amplitude of the oscillator is proportionate. Thus, the sensor voltage Us is proportionate in relation to the rate of motion V or the number of revolutions N of the driven element 3.

The phase displacement angle ωp between the voltage at the connection 26 of the electrodes 19 and the voltage Us of the sensor signal is ±90°. This angle always corresponds to the mechanical resonance of the oscillator 7, i.e. the maximum rate of motion V or the number of revolutions N of the driven element 3. One realization of the sensor 252, which consists of two thin plates made of piezoelectric ceramic, allows for the sensor operation in the presence of a possible asymmetry of the oscillator 7. Preferably, the sensor 252 is to be used in the motors with the composite generators 70 71.

FIG. 59 represents a block diagram of the proposed motor in which the basic generator 202 is equipped with a frequency control input of the excitation frequency. This input makes it possible to change the frequency of the basic generator in the area of the resonance characteristic of the oscillator 7. This way, it is possible to control the frequency of the oscillator 7.

The block diagram shown in FIG. 59 also includes a phase detector 258 that varies the phase displacement angle ωp between the voltage at the connection 26 of the electrodes 19 and the voltage Us of the sensor signal; and the phase detector supplies a control voltage at its output 257 that is proportionate in relation to the measured angle ωp. The control voltage is conducted from the output 257 of the phase detector 258 to the control input 258 of the basic generator 202 and controls its frequency in such a way that this frequency is always equal to the mechanical frequency of resonance of the oscillator vibrations that are generated due to the expansion of an acoustic longitudinal wave along the resonant length L of the oscillator 7.

FIG. 60 depicts a block diagram of a construction variant of the proposed motor with the sensor 252; and the sensor 252 is realized as two thin plates. The block diagram reflects a motor variant whose oscillator 7 is comprised of two composite generators of acoustic waves 70, 71. In this instance, the proposed motor is equipped with the sensor signal commutator 252. The sensor signal commutator 252 effects synchronous switching of the sensor electrodes with the switch-over of the direction of the driven element 3. A realization of this kind of the sensor 252 makes it possible to correct any possible asymmetry of the sensor voltage Us when the direction of movement of the driven element 3 is changed.

FIG. 61 shows a block diagram of a construction variant of the proposed motor that is equipped with a coordinate parameter sensor or a movement parameter sensor 267 of the driven element 3 as well as a processor-controlled controlling means 271. This variant functions in the following way: the coordinate and parameter values of the movement of the driven element 3 at the input of the processor-controlled controlling means 271 are compared with a software-adjusted parameter. If an error occurs, the controlling means 271 provides an error signal in the form of the voltage Usg that is passed on to the input 241 of the transformer 240. This voltage acts upon the transformer 240, and the found error is corrected.

Testing of the proposed motor with an oscillator resonant length L=2λ and the dimensions 60×14, 5×5 mm with the separate generators of the acoustic waves and with two friction elements set up on the motor has revealed that the motor generates a maximum force of 45 N if the excitation voltage on the electrodes of the generators of acoustic waves is 55 V and 60 V. The rate of motion of the driven element without external load is 0.3 m/s. The minimum rate of motion of the driven element in the absence of a movement stabilization system is approximately 0.1 µm/s.

Testing of another example of the proposed motor with an oscillator resonant length L=λ and the dimensions 40×20×5 mm with the composite generators of the acoustic waves and with friction elements set up on the motor has revealed that the motor generates a maximum force of 27 N if the excitation voltage on the electrodes of the composite generator of acoustic waves is 90 V. The oscillator of this motor has a very simple electrode structure, thereby simplifying the manufacturing technology. In addition, an oscillator of this kind has only three connections. This increases the operating stability of an oscillator of this type in the presence of high excitation levels considerably.

Friction elements with a functional surface of 5×2=10 mm² were fastened on the piezoelectric oscillators of these motors. If the area of the functional surface is chosen in this manner, the friction elements show only minimal wear and tear. Testing of the second example of the motor led to the conclusion that the wear and tear on the friction element was not measurable after 100 operating hours. This circumstance guarantees a long and stable operation of the proposed motor.

LIST OF REFERENCE SYMBOLS

1 Housing
2 Bearing of the longitudinal movement
3 Driven element
4 Friction layer
5 Driving element
6 Friction element
7 Monolithic piezoelectric oscillator
8 Connecting group
9 Electric excitation source
10 Fastening elements
11 Support mountings
12 Rectangular piezo-element
13 First main surface
14 Second main surface
15 First side surface
16 Second side surface
17 First front surface
18 Second front surface
19 Electrodes of the first group of electrodes
20 -
21 Electrodes of the second group of electrodes
22 -
23 A position demonstrating the electrode configuration of the oscillator with a generator 25
24 Generator with an acoustic longitudinal wave that expands along the resonant length L of the oscillator
25 Generator of an acoustic longitudinal wave with constant preceding sign that expands along the resonant height H of the oscillator
26 Connections of the electrodes 19
27 Connections of the electrodes 20
28 Connections of the electrodes 21
29 Connections of the electrodes 22
30 Oscillator 7 with a generator 25
31 Oscillator 7 with a generator 24
32 First deformation phase of the oscillator 7 with a generator 24
33 Second deformation phase of the oscillator 7 with a generator 25
34 Movement paths of points of the surface 15 of the oscillator 7 with a generator 24
35 Movement paths of points of the surface 16 of the oscillator 7 with a generator 24
36 Expansion phase of the oscillator 7 with a generator 25
37 Compression phase of the oscillator 7 with a generator 25
38 Movement paths of points of the surface 15 of the oscillator 7 with a generator 25
39 Movement paths of points of the surface 15 of the oscillator 7 with a generator 24
40 A position explaining the way the oscillator 7 functions with two generators 24, 25
41 Movement paths of points of the surface 15 of the oscillator 7 with two generators 24, 25
42 Movement paths of points of the surface 16 of the oscillator 7 with two generators 24, 25
43 Press-on phase of the friction elements 6
44 Advance movement phase of the friction elements 6
45 Return pressure phase [of the] friction elements 6
46 Return movement phase of the friction elements 6
47 Variant of the oscillator 7 with the resonant length L=nλ, n=1, 2, 3,
48 -
49 -
50 -
51 Oscillator 7 as a cylinder
52 Oscillator 7 as a cylinder part
53 Arrangement variant of stamper on oscillator 7 in the form of a cylinder part
54 -
55 Oscillator 7 as a cylinder
56 Generator for an acoustic longitudinal wave with variable preceding sign that expands along the resonant height H of the oscillator 7
57 A position illustrating the electrode configuration of the oscillator 7 with a generator 56
58 Oscillator 7 with a generator 56
59 First deformation phase of the oscillator 7 with a generator 56
60 Second deformation phase of the oscillator 7 with a generator 56
61 Movement paths of points of the surface 15 of the oscillator 7 with a generator 56
62 Movement paths of points of the surface 16 of the oscillator 7 with a generator 56
63 A position illustrating the way the oscillator 7 functions with two generators 24, 25
64 Movement paths of points of the surface 15 of the oscillator 7 with two generators 24, 56

65 Movement paths of points of the surface 16 of the oscillator 7 with two generators 24, 56
66 First combined electrode
67 Second combined electrode
68 Third combined electrode
69 Forth combined electrode
70 First composite generator
71 Second composite generator
72 Electrode configuration of the oscillator 7 with the generators 70, 71
73 Connection of the electrode 66
74 Connection of the electrode 67
75 Connection of the electrode 68
76 Connection of the electrode 69
77 Group of the connections 66, 67, 68, 69
78 Joint electrode
79 Connection of the electrode 78
80 Electrode commutator
81 First deformation phase of the oscillator 7 with the expansion of a longitudinal wave, excited by the generator 70, along the length L
82 Second deformation phase of the oscillator 7 with the expansion of a longitudinal wave, excited by the generator 70, along the length L
83 Movement path of points located along the axis b1 of the surface 15
84 Movement path of points located along the axis b1 of the surface 16
85 First deformation phase of the oscillator 7 with the expansion of a longitudinal wave, excited by the generator 70, along the height H
86 Second deformation phase of the oscillator 7 with the expansion of a longitudinal wave, excited by the generator 70, along the height H
87 Movement path of points located along the axis e of the surface 15
88 Movement path of points located along the axis b1 of the surface 16
89 A position illustrating the way the oscillator functions with a generator 70
90 Movement path of points located along the axis b1e of the surface 15
91 Movement path of points located along the axis b1e of the surface 16
92 First deformation phase of the oscillator 7 with the expansion of a longitudinal wave, excited by the generator 71, along the length L
93 Second deformation phase of the oscillator 7 with the expansion of a longitudinal wave, excited by the generator 71, along the length L
94 Movement path of points located along the axis b2 of the surface 15
95 Movement path of points located along the axis b2 of the surface 16
96 A position illustrating the way the oscillator functions with a generator 71
97 Movement path of points located along the axis b2e of the surface 15
98 Movement path of points located along the axis b1e of the surface 16
99 Multiple-layered oscillator 7 in the form of an entire electro-mechanical resonator
100 Friction element 6 as a strip
101 Friction element 6 as a small rod or as a prism
102
103
104 Friction element 6 as a pyramid-shaped element
105
106 Friction element 6 as a half-cylinder-shaped element
107 Friction element 6 as a cylinder-shaped element
108
109
110 Friction element 6 as a conical element
111 Friction element 6 as a semi-spherical element
112 Functional surface of the friction element 6
113 Connecting surface of the friction element 6
114 Variant of the friction element 6 with transverse grooves
115
116
117 Transverse groove of friction elements
118 Variant of a two-layered friction element 6
119
120
121 Variant of a multiple-layered friction element 6
122
123
124 Wear resistant layer of the friction element 6
125 Connecting layer of the friction element 6
126 Variant of a multiple-layered friction element 6 with layers that are arranged in a perpendicular manner in relation to the side surfaces 15, 16
127
128
129 Wear resistant layer
130 Dampening layer of the friction element
131 Variant of a multiple-layered friction element with cylindrical layers
132
133
134 Wear resistant layer of a multiple-layered friction element 6 with cylindrical layers
135 Dampening layer of the multiple-layered friction element 6 with cylindrical layers
136 Inclined functional surface
137 Variants of the functional surface
138
139
140
141
142
143
144 Concave functional surface 112, triangular shape
145 Convex functional surface 112, triangular shape
146 Concave functional surface 112, round shape
147 Convex functional surface 112, round shape
148 Functional surface 112, rib-shaped, triangular shape
149 Functional surface 112, rib-shaped, round shape
150 The surface constituting the functional surface 112
151 Friction elements as glass strips
152 Limiting elements
153 Elastic elements
154 Driven elements 3 in the form of a frame
155 Limiting elements as mechanical resonators
156 Driven element 2 in the form of a plate
157 Shaft
158 Bearing of the rotational movement
159 Fastening elements 10 as rectangular prisms
160 Fastening elements 10 as triangular prisms
161 Fastening elements 10 as half-cylindrical prisms
162 Conical fastening elements 10
163 Pyramid-shaped fastening elements 10
164 Semi-spherical fastening elements 10
165 Fastening elements 10 with profile grooves
166

167 Fastening elements 10 with projecting parts
168 Fastening elements 10 as cylindrical step-shaped elements
169 Fastening elements 10 as round elements with profile bore holes
170
171 Fastening elements 10 as resonant bending plates or resonant bending bars
172 Rigid support mountings of the fastening elements 10
173 Elastic elements
174 Driven element as a rectangular platform
175 Longitudinal dampening bore holes
176 Dampening bore holes in round shape
177 Dampening bore holes in elliptical shape
178 Dampening layer
179 Functional surface of the friction layer 4
180 Convex triangular functional surface 179
181 Concave triangular functional surface 179
182 Convex round functional surface 179
183 Concave triangular functional surface 179
184 Rib-shaped triangular functional surface 179
185 Rib-shaped round functional surface 179
186 Magnets
187 Driven element 3 as a ring or as a hollow cylinder
188 Teeth of a toothed wheel
189 Driven element 3 as a frame
190 Elastic spacer
191 Flange
192 Shaft
193 Driven element 3 as round bar or as a tube
194 Rigid support mountings as flat spring
195 Driven element 3 as triangular bar
196 Two-channel power amplifier
197 First channel of the amplifier 196
198 Second channel of the amplifier 196
199 Formation element
200 Input of the formation element 199
201 Output of the basic generator
202 Basic generator
203 Output power amplifier
204 First output of the power amplifier 203
205 Second output of the power amplifier 203
206 First input of the adjusting element
207 Second input of the adjusting element
208 Adjusting element
209 First output of the adjusting element
210 Second output of the adjusting element
211 Single-channel power amplifier
212 Input of the electrode commutator 80
213 First output of the electrode commutator 80
214 Second output of the electrode commutator 80
215 Control input of the electrode commutator 80
216 Bridge power amplifier
217 Half-bridge power amplifier
218 Transistor switch of the half-bridge power amplifier 217
219 First excitation channel
220 Second excitation channel
221 Driver
222 Formation element
223 Signal phase control element
224 Phase control input
225 Reverse change-over
226 Control input of the reverse change-over
227 Ground or joint potential of the excitation source 9
228 Variant of the adjusting element 208
229
230
231
232
233
234 Summing transformer
235 Compensation inductivity
236 Resonance condenser
237 Diagrams of the voltage U1 that is effective between the connections 204 and 227
238 Diagrams of the voltage U1 that is effective between the connections 205 and 227
239 Diagrams of the voltage U3 that is effective at the connections 209 and 210 of the adjusting element 208
240 Control signal transformer
241 Signal input of the transformer 240
242 Control voltage output
243 Threshold detector of the zero position
244 Measuring input of the threshold detector 243
245 Output of the threshold detector 243
246 Variants of characteristic lines of the control signal transformer 240
247
248 Characteristic line of the threshold detector of the zero position 243
249 Control characteristic of the electric excitation source 9
250 Sensor for mechanical stress, with a piezoelectric plate
251 Sensor for mechanical stress, with two piezoelectric plates
252 Sensor
253 First electrode of the sensor 252
254 Second electrode of the sensor 252
255 Frequency characteristics of the sensor 252
256 Phase characteristics of the sensor 252
257 Frequency control input of the electric excitation source 202
258 Phase detector
259 First phase input of the phase detector 258
260 Second phase input of the phase detector 258
261 Output of the phase detector 258
262 Signal commutator of the sensor 252
263 First input of the signal commutator 262
264 Second input of the signal commutator 262
265 Output of the signal commutator 262
266 Control input of the signal commutator 262
267 Sensor of the coordinate parameters or movement parameters of the driven element 3
268 Scale of the sensor 267
269 Display device of the sensor 267
270 Information output of the sensor 267
271 Processor controlling means
272 Output of the processor controlling means 271

What is claimed is:

1. A piezoelectric adjusting element in the form of a monolithic plate-shaped or cylindrical piezoelectric oscillator, the piezoelectric oscillator having first and second main surfaces and groups of electrodes allocated to the first and second main surfaces, the piezoelectric adjusting element comprising:

a housing;
a driven element;
at least one friction layer arranged on at least the housing or on the driven element;
an electric excitation source connected to the groups of electrodes of the piezoelectric oscillator, the piezoelectric oscillator being in friction contact with the friction layer; and wherein
the piezoelectric oscillator is excited by the groups of electrodes to generate standing longitudinal acoustic waves in directions of oscillator resonant length and oscillator resonant height, respectively of the piezoelectric oscillator, the oscillator resonant length being an integral multiple of wave length of the standing longitudinal wave vibrating in the direction of oscillator resonant length, and the oscillator resonant height is equal to one half of wave length of the standing longitudinal wave vibrating in the direction of the oscillator resonant height, and the oscillator resonant length and the oscillator resonant height are chosen such that the frequencies of the standing longitudinal acoustic waves expanding by the piezoelectric oscillator are equal both in the direction of the oscillator resonant length as well as in the direction of the oscillator resonant height.

2. The piezoelectric adjusting element as in claim 1, wherein the direction of the standing acoustic longitudinal wave that vibrates in the direction of the oscillator resonant height has a constant preceding sign along the oscillator resonant length.

3. The piezoelectric adjusting element as in claim 1, wherein the direction of the standing acoustic longitudinal wave that vibrates in the direction of the oscillator resonant height has a variable preceding sign along the oscillator resonant length.

4. The piezoelectric adjusting element as claimed in claim 1, wherein a first group of the groups of electrodes, which constitutes a first generator of acoustic standing longitudinal waves, is arranged symmetrically in relation to a plane of symmetry extending through a center of the oscillator resonant height at margin areas of the oscillator main surfaces, and a second group of the groups of electrodes, which constitutes a second generator of acoustic standing longitudinal waves, is arranged symmetrically in relation to a plane of symmetry extending through the center of the oscillator resonant height at center areas of the oscillator main surfaces.

5. The piezoelectric adjusting element as in claim 1, wherein
the first and the second group of electrodes, which constitute the first and the second generator of standing longitudinal acoustic waves, are connected to each other, thereby forming a composite wave generator that produces, simultaneously, one standing longitudinal acoustic wave that vibrates in the direction of the oscillator resonant length and one standing longitudinal acoustic wave that vibrates in the direction of the oscillator height.

6. The piezoelectric adjusting element as in claim 1, wherein
the adjusting element is comprised of at least two plate-shaped piezoelectric oscillators, that are connected acoustically to each other, forming a uniform electro-mechanical resonator.

7. The piezoelectric adjusting element as in claim 6, wherein
the piezoelectric oscillators are connected to each other by a rigid organic bonding agent.

8. The piezoelectric adjusting element as in claim 6, wherein
the piezoelectric oscillators are connected to each other by a sintering method.

9. The piezoelectric adjusting element as in claim 2, wherein
at least one friction element is arranged on one or two side surfaces of the piezoelectric oscillator, in areas that have maximum vibration with identical preceding signs as the standing acoustic longitudinal wave that vibrates in the direction of the oscillator length.

10. The piezoelectric adjusting element as in claim 3, wherein
at least one friction element is arranged on one or two side surfaces of the piezoelectric oscillator, in the areas that have maximum vibration with different preceding signs as the standing acoustic longitudinal wave that vibrates in the direction of the oscillator length.

11. The piezoelectric adjusting element as in claim 9, wherein
the friction elements have a form that is strip-shaped, rod-shaped, pyramid-shaped, conical, cylindrical or semi-spherical and are comprised of a hard wear resistant material, said hard wear resistant material comprising oxide-ceramic, metal-ceramic or composites thereof.

12. The piezoelectric adjusting element as in claim 11, wherein the friction elements are equipped with transverse grooves.

13. The piezoelectric adjusting element as in claim 11, wherein
the friction elements have a one-layered or a multiple-layered structure.

14. The piezoelectric adjusting element as in claim 13, wherein
the layers of the one-layered or multiple-layered structure of the friction elements are arranged parallel in relation to side surfaces of the piezoelectric oscillator.

15. The piezoelectric adjusting element as in claim 13, wherein
the layers of the one-layered or multiple-layered structure of the friction elements are arranged in a perpendicular manner in relation to side surfaces of the piezoelectric oscillator.

16. The piezoelectric adjusting element as in claim 9, wherein
the layers of the friction elements have a cylindrical shape and are arranged concentrically.

17. The piezoelectric adjusting element as in claim 13, wherein
the layers of the one-layered or multiple-layered structure of the friction elements have different moduli of elasticity.

18. The piezoelectric adjusting element as in claim 14, wherein
a layer of the friction element that is wear resistant has a modulus of elasticity that is determined on a basis of a capacity of resistance to wear and solidity of a functional surface and a connecting layer of the friction element has a modulus of elasticity corresponding to a modulus of elasticity of a piezoelectric ceramic of the piezoelectric oscillator.

19. The piezoelectric adjusting element as in claim 18, wherein
the wear resistant layer of a multiple-layered structure of the friction elements has a modulus of elasticity that is determined on the basis of the capacity of resistance to wear and solidity of the functional surface and, furthermore, a dampening layer has a modulus of elasticity that is determined on a basis of a dynamic stability of the wear resistant layer.

20. The piezoelectric adjusting element as in claim 13, wherein
the layers of a two-layered or multiple-layered structure of the friction elements are comprised of monolithic materials and are connected to each other by sintering.

21. The piezoelectric adjusting element as in claim 9, wherein
a connecting layer of the friction element is comprised of a porous material.

22. The piezoelectric adjusting element as in claim 21, wherein
all layers, except for a layer of a wear resistant outer layer, are realized, at least in part, of a porous material of variable porosity, and the connecting layer has a maximum porosity.

23. The piezoelectric adjusting element as in claim 19, wherein
the dampening layer is comprised of a porous material.

24. The piezoelectric adjusting element as in claim 9, wherein
the friction elements comprise a flat functional surface arranged at an incline to the side surface on which the friction elements are arranged.

25. The piezoelectric adjusting element as in claim 18, wherein
the functional surface of the friction elements has a triangular-concave, or triangular-convex, round-concave or round-convex or rib-shaped form, said functional surface is arranged along the resonant length of the piezoelectric oscillator.

26. The piezoelectric adjusting element as in claim 9, wherein
the friction elements are connected to a surface of the piezoelectric oscillator by an organic bonding agent.

27. The piezoelectric adjusting element as in claim 9, wherein
the friction elements are connected to a surface of the piezoelectric oscillator by a material that forms a chemical bond with a piezoelectric ceramic.

28. The piezoelectric adjusting element as in claim 21, wherein
the pores of the friction element are filled, completely or in part, with the porous material that connects the friction element to a surface of the piezoelectric oscillator.

29. The piezoelectric adjusting element as in claim 12, wherein
the transverse grooves are filled with a sound absorbing material.

30. The piezoelectric adjusting element as in claim 9, wherein
the friction element or the friction elements are realized as glass strips that are melted onto a surface of the piezoelectric oscillator.

31. The piezoelectric adjusting element as in claim 30, wherein
the friction elements are filled with a powder of a wear resistant material, said wear resistant material comprising a material selected from the group consisting of: aluminum oxide, zirconium oxide, tungsten carbide, titanium carbide or titanium nitride.

32. The piezoelectric adjusting element as in claim 1, wherein
the adjusting element is equipped with limiting elements in order to prevent any shifting of the piezoelectric oscillator in the direction of its oscillator resonant length from occurring.

33. The piezoelectric adjusting element as in claim 32, wherein
the limiting elements preventing any shifting of the oscillator are used as mechanical resonators whose frequency of resonance corresponds to the oscillation frequency of the piezoelectric oscillator during operation of the adjusting element.

34. The piezoelectric adjusting element as in claim 1, wherein
the piezoelectric oscillator is equipped with at least one fastening element that is rigidly connected to the oscillator.

35. The piezoelectric adjusting element as in claim 34, wherein
the fastening elements are arranged on at least on one side surface of the piezoelectric oscillator in places with minimum vibration of the standing acoustic longitudinal wave that vibrates in the direction of the oscillator resonant length.

36. The piezoelectric adjusting element as in claim 34, wherein
fastening elements are arranged on at least one of the main surfaces of the piezoelectric oscillator in places with minimum vibration of the standing acoustic longitudinal wave that vibrates in the direction of the oscillator resonant length.

37. The piezoelectric adjusting element as in claim 34, wherein
the fastening elements have a form of one of a rectangular prism, a triangular prism, a half-cylindrical prism, of conical elements, pyramid-shaped elements, semi-spherical elements or rectangular elements with profile channels and are realized as projecting parts, as cylindrical step elements or as round elements with profile bore holes.

38. The piezoelectric adjusting element as in claim 34, wherein
the fastening elements are comprised of a material whose modulus of elasticity is equal or greater than a modulus of elasticity of a piezoelectric ceramic of the piezoelectric oscillator.

39. The piezoelectric adjusting element as in claim 34, wherein
the fastening elements are comprised of a material whose modulus of elasticity is smaller than a modulus of elasticity of a piezoelectric ceramic of the piezoelectric oscillator.

40. The piezoelectric adjusting element as in claim 34, wherein
the fastening elements are comprised of the same type of piezoelectric ceramic as the piezoelectric oscillator.

41. The piezoelectric adjusting element as in claim 34, wherein
each fastening element comprises a porous material.

42. The piezoelectric adjusting element as in claim 34, wherein
the fastening elements are realized as resonance bending plates or resonance bending bars.

43. The piezoelectric adjusting element as in claim 34, wherein
the fastening elements are connected to a surface of the piezoelectric oscillator by an organic bonding agent.

44. The piezoelectric adjusting element as in claim 34, wherein
the friction elements are connected to the surfaces of the piezoelectric oscillator by a material that is applied to said surfaces, and this material forms a chemical bond with at least one of a piezoelectric ceramic or with the an intermediate layer or a fastening material.

45. The piezoelectric adjusting element as in claim 34, wherein
the fastening elements are set up in rigid support mountings.

46. The piezoelectric adjusting element as in claim 45, wherein
the rigid support mountings are realized as flat springs.

47. The piezoelectric adjusting element as in claim 1, wherein
the driven element is arranged with an ability to shift.

48. The piezoelectric adjusting element as in claim 1, wherein
the driven element is realized in a form of one of a rectangular platform, in a form of a frame with a rectangular, multiple-corner or round cross-section, as a bar or as a tube.

49. The piezoelectric adjusting element as in claim 1, wherein
the driven element is configured to rotate.

50. The piezoelectric adjusting element as in claim 49, wherein
the driven element is realized in a form of one of a cylinder, a disk, a hollow cylinder or a ring, or is realized in part of one of these forms.

51. The piezoelectric adjusting element as in claim 9, wherein the body of the friction element comprises:
one of rectangular, round, or elliptical shaped dampening bore holes for preventing expansion of acoustic waves in the friction element whose frequency is equal to the frequency of the piezoelectric oscillator onto its harmonic oscillations during operation of the adjusting element.

52. The piezoelectric adjusting element as in claim 1, wherein
the driven element comprises a hard porous material.

53. The piezoelectric adjusting element as in claim 52, wherein
pores of the driven element are filled with a sound absorbing material.

54. The piezoelectric adjusting element as claimed in claim 1, wherein
the driven element comprises a friction layer, said friction layer realized of oxide-ceramic or of another hard wear resistant material, and a thickness of the friction layer is at least five times smaller than the resonant height of the piezoelectric oscillator.

55. The piezoelectric adjusting element as in claim 29, wherein
a functional surface of the friction layer has a triangular-concave or triangular-convex form, a round-concave or round-convex form or a rib-type shape, and the functional surface is arranged along the resonant length of the piezoelectric oscillator.

56. The piezoelectric adjusting element as claimed in claim 1, wherein
a thickness of a body of a friction element that is arranged below the friction layer is greater than the resonant height of the piezoelectric oscillator.

57. The piezoelectric adjusting element as in claim 1, wherein
a dampening layer is arranged between a body of the driven element and the friction layer, and the friction layer is comprised of a viscous organic or of a porous inorganic material or of a composite of these materials.

58. The piezoelectric adjusting element as in claim 1, wherein
the adjusting element is comprised of at least two piezoelectric oscillators arranged opposite to each other and of at least two friction layers arranged on the opposite sides of the driven element.

59. The piezoelectric adjusting element as in claim 1, wherein
the adjusting element is comprised of at least three piezoelectric oscillators and of at least three friction layers that are arranged parallel in relation to each other and that are arranged in three planes.

60. The piezoelectric adjusting element as in claim 1, wherein
the electric excitation source is realized as a two-channel power amplifier, comprised of a first channel and of a second channel including formation levels connected to a basic generator and connected to an output power amplifier, the output power amplifier is electrically connected via adjusting levels to electrodes of a generator of the standing acoustic longitudinal waves that vibrate along the resonant length of the piezoelectric oscillator, and/or to electrodes of a generator of the standing acoustic longitudinal waves that vibrate along the resonant height.

61. The piezoelectric adjusting element as in claim 5, wherein
the electric excitation source is realized as a single-channel power amplifier that is connected to a formation level, the formation level is connected to a basic generator and to an output power amplifier, the output power amplifier is connected via an adjusting level and an electrode commutator to the electrodes of the corresponding composite generator.

62. The piezoelectric adjusting element as in claim 60, wherein
the output power amplifier is realized as a bridge power amplifier, and each of these includes two half-bridge power amplifiers, and the formation levels contain two excitation channels of the half-bridge power amplifiers, and one of the excitation channels is equipped with a phase control element and has a phase control input.

63. The piezoelectric adjusting element as in claim 62, further comprising:
a signal level transformer whose output is connected to the phase control input of the phase control element.

64. The piezoelectric adjusting element as in claim 62, further comprising:
a demodulator of a pulse width modulated signal whose output is connected to the phase control input of the phase control element.

65. The piezoelectric adjusting element as in claim 62, further comprising:
a level detector for a zero position whose measuring input is connected to an input of a signal level transformer or to an output of a demodulator of a pulse width modulated signal and whose output is connected to an input of a reverse change-over or to a control input of an electrode commutator.

66. The piezoelectric adjusting element as in claim 1, wherein a basic generator is equipped with a frequency control input.

67. The piezoelectric adjusting element as in claim 66, further comprising:
a phase detector with first and second phase inputs with an output, and the output of the phase detector is connected to the frequency control input of the basic generator, and the first phase input is electrically connected to an electrode of the piezoelectric oscillator, and the second phase input is electrically connected to a mechanical stress sensor.

68. The piezoelectric adjusting element as in claim 67, wherein the mechanical stress sensor is realized as a thin piezoelectric ceramic plate that has electrodes on larger surfaces of the sensor, and the sensor is acoustically arranged on a surface of the piezoelectric oscillator at a location of a greatest mechanical stress of the corresponding standing acoustic longitudinal waves that expand in the piezoelectric oscillator.

69. The piezoelectric adjusting element as in claim 67, wherein the mechanical stress sensor is comprised of two thin piezoelectric ceramic plates that contain electrodes on wide surfaces of the sensor, said sensor is acoustically fastened on a surface of the piezoelectric oscillator at locations where greatest mechanical forces occur, said mechanical forces occurring due to standing acoustic longitudinal wave vibrating in the direction of the resonant length of the oscillator and at points having common movement paths, said common movement paths occurring if a signal phase displacement by 180° occurs in channels of a power amplifier with regard to a signal of another channel; and wherein sensor plates are connected to a second input of a phase detector by a sensor signal commutator, and control input of the signal commutator is electrically connected to a control input of a reverse change-over.

70. The piezoelectric adjusting element as in claim 62, further comprising:

a coordinate parameter sensor or movement parameter sensor for the driven element that is electrically connected to a processor-controlled controlling means and whose output is connected to a signal level transformer or a demodulator of a pulse width modulated signal.

* * * * *